US007985677B2

(12) United States Patent
Fujii et al.

(10) Patent No.: US 7,985,677 B2
(45) Date of Patent: Jul. 26, 2011

(54) METHOD OF MANUFACTURING SEMICONDUCTOR DEVICE

(75) Inventors: Gen Fujii, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 633 days.

(21) Appl. No.: 11/283,964

(22) Filed: Nov. 22, 2005

(65) Prior Publication Data

US 2006/0115983 A1 Jun. 1, 2006

(30) Foreign Application Priority Data

Nov. 30, 2004 (JP) ................................. 2004-347839

(51) Int. Cl.
*H01L 21/4763* (2006.01)
(52) U.S. Cl. ........ 438/638; 438/624; 438/637; 438/700; 438/761; 438/778
(58) Field of Classification Search .................. 438/622, 438/624, 637, 638, 700, 761, 763, 778, FOR. 355, 438/FOR. 388
See application file for complete search history.

(56) References Cited

U.S. PATENT DOCUMENTS

| | | | | |
|---|---|---|---|---|
| 5,126,231 A | * | 6/1992 | Levy | 430/313 |
| 5,384,276 A | * | 1/1995 | Ogawa et al. | 438/254 |
| 5,656,834 A | * | 8/1997 | Grzyb et al. | 257/207 |
| 5,946,559 A | * | 8/1999 | Leedy | 438/157 |
| 6,043,145 A | | 3/2000 | Suzuki et al. | |
| 6,051,508 A | | 4/2000 | Takase et al. | |
| 6,309,957 B1 | | 10/2001 | Tu et al. | |
| 6,376,353 B1 | | 4/2002 | Zhou et al. | |
| 6,383,920 B1 | | 5/2002 | Wang et al. | |
| 6,399,486 B1 | | 6/2002 | Chen et al. | |
| 6,429,118 B1 | | 8/2002 | Chen et al. | |
| 6,492,708 B2 | | 12/2002 | Acosta et al. | |
| 6,514,855 B1 | | 2/2003 | Suzuki et al. | |
| 6,693,038 B1 | * | 2/2004 | Shen | 438/700 |
| 6,720,230 B2 | | 4/2004 | Acosta et al. | |
| 6,726,535 B2 | | 4/2004 | Shih et al. | |

(Continued)

FOREIGN PATENT DOCUMENTS

CN          1138217          12/1996

(Continued)

OTHER PUBLICATIONS

Nikkei Microdevices, No. 233, pp. 58-65, Nov. 2004.

*Primary Examiner* — N Drew Richards
*Assistant Examiner* — Joannie A Garcia
(74) *Attorney, Agent, or Firm* — Nixon Peabody LLP; Jeffrey L. Costellia

(57) ABSTRACT

One of methods of manufacturing a semiconductor device of the present invention is as follows: a first conductive layer is formed, a first insulating layer is formed over the first conductive layer, and a second insulating layer is formed over the first insulating layer; then, a first opening portion is formed in the first insulating layer and the second insulating layer to reach the first conductive layer; a mask layer having low wettability to a composition containing a conductive material is formed over the second insulating layer, and a second opening portion larger than the first opening portion is formed in the second insulating layer; subsequently, the first and second opening portions are filled with the composition containing a conductive material to form a second conductive layer.

39 Claims, 29 Drawing Sheets

U.S. PATENT DOCUMENTS

| | | |
|---|---|---|
| 6,727,515 B2 | 4/2004 | Nakata et al. |
| 6,734,029 B2 | 5/2004 | Furusawa |
| 6,753,249 B1 | 6/2004 | Chen et al. |
| 6,897,433 B2 | 5/2005 | Itoh et al. |
| 6,946,381 B2 | 9/2005 | Hwang |
| 7,045,861 B2 | 5/2006 | Takayama et al. |
| 7,098,121 B2 | 8/2006 | Mori et al. |
| 7,141,492 B2 | 11/2006 | Yudasaka |
| 7,164,191 B2 | 1/2007 | Morisaki et al. |
| 7,199,044 B2 | 4/2007 | Ohtsuka et al. |
| 7,217,654 B2 | 5/2007 | Nagahara et al. |
| 7,356,921 B2 | 4/2008 | Furusawa et al. |
| 7,404,990 B2 | 7/2008 | Lukas et al. |
| 2002/0130386 A1 | 9/2002 | Acosta et al. |
| 2003/0170993 A1 | 9/2003 | Nagahara et al. |
| 2003/0174552 A1 | 9/2003 | Itoh et al. |
| 2004/0002208 A1 | 1/2004 | Takigawa et al. |
| 2004/0096593 A1 | 5/2004 | Lukas et al. |
| 2004/0135269 A1 | 7/2004 | Otsuki |
| 2004/0137241 A1 | 7/2004 | Lin et al. |
| 2005/0082626 A1* | 4/2005 | Leedy .......................... 257/432 |
| 2005/0127035 A1 | 6/2005 | Ling |
| 2005/0191847 A1 | 9/2005 | Misawa et al. |
| 2006/0102937 A1 | 5/2006 | Maruyama et al. |
| 2006/0113671 A1 | 6/2006 | Isa et al. |
| 2006/0115982 A1 | 6/2006 | Morisue et al. |
| 2006/0116000 A1 | 6/2006 | Yamamoto et al. |
| 2006/0165875 A1 | 7/2006 | Otsuki |
| 2007/0090358 A1* | 4/2007 | Kanno et al. .................... 257/59 |
| 2007/0096331 A1 | 5/2007 | Nagahara et al. |

FOREIGN PATENT DOCUMENTS

| | | |
|---|---|---|
| EP | 1 420 439 A2 | 5/2004 |
| JP | 04-123432 A | 4/1992 |
| JP | 09-306988 A | 11/1997 |
| JP | 2001-179167 A | 7/2001 |
| JP | 2001-332092 A | 11/2001 |
| JP | 2002-164635 A | 6/2002 |
| JP | 2003-229481 A | 8/2003 |
| JP | 2003-273111 A | 9/2003 |
| JP | 2004-241751 A | 8/2004 |

* cited by examiner

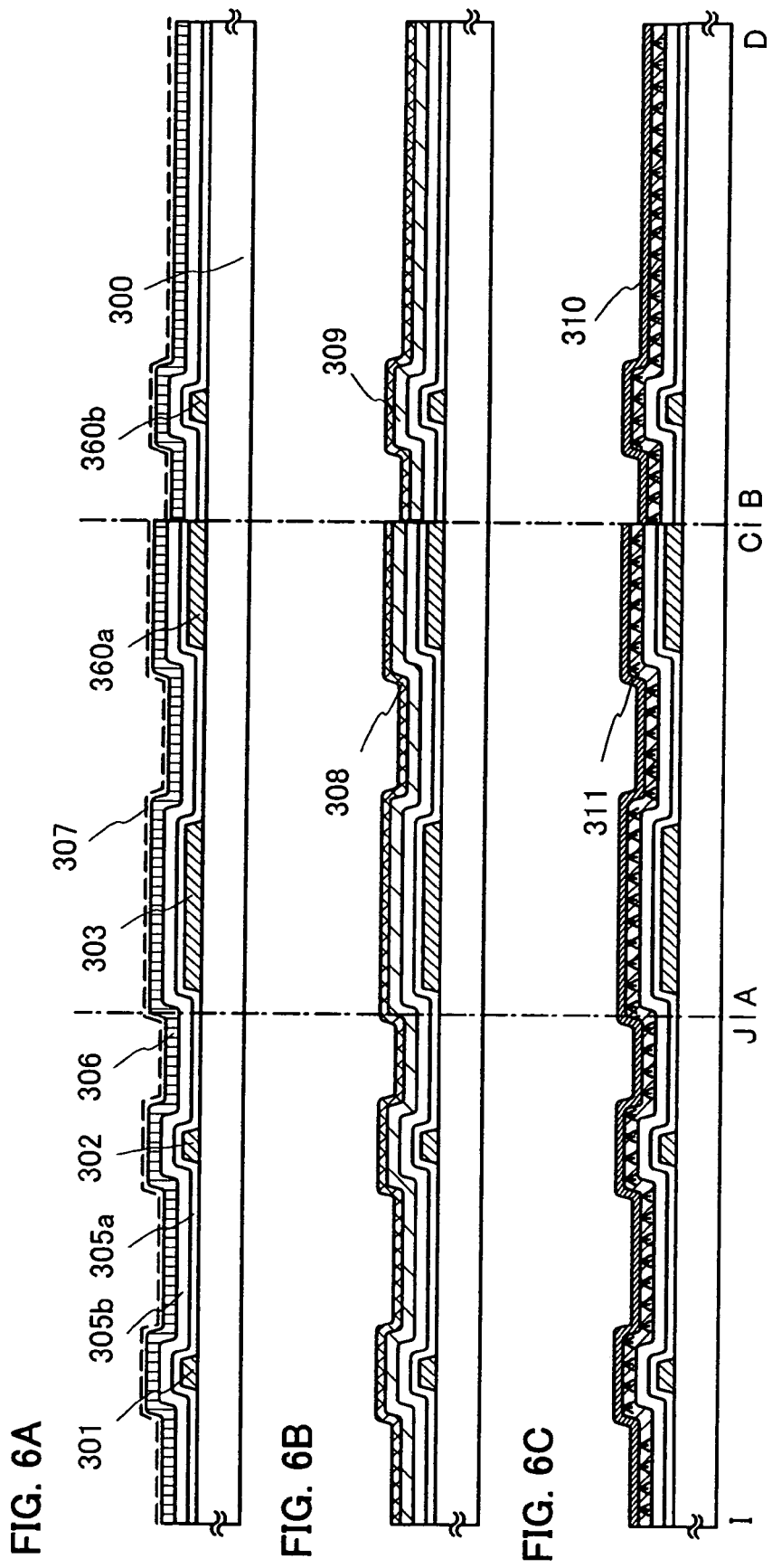

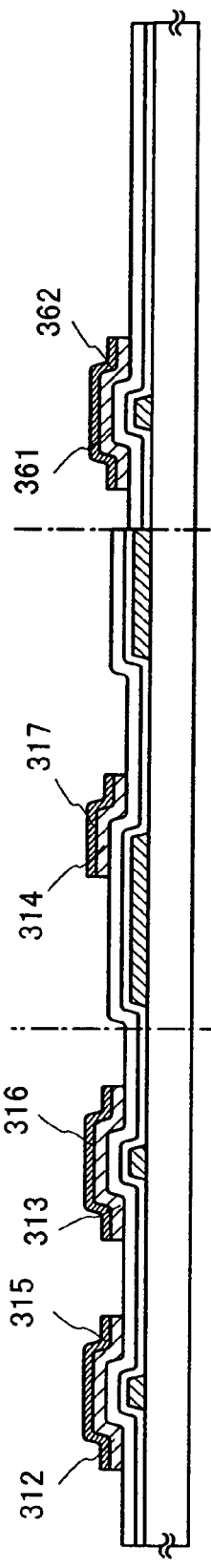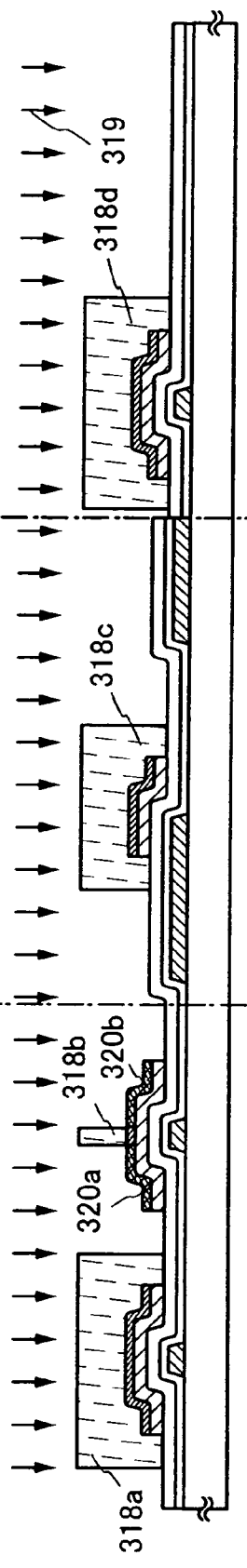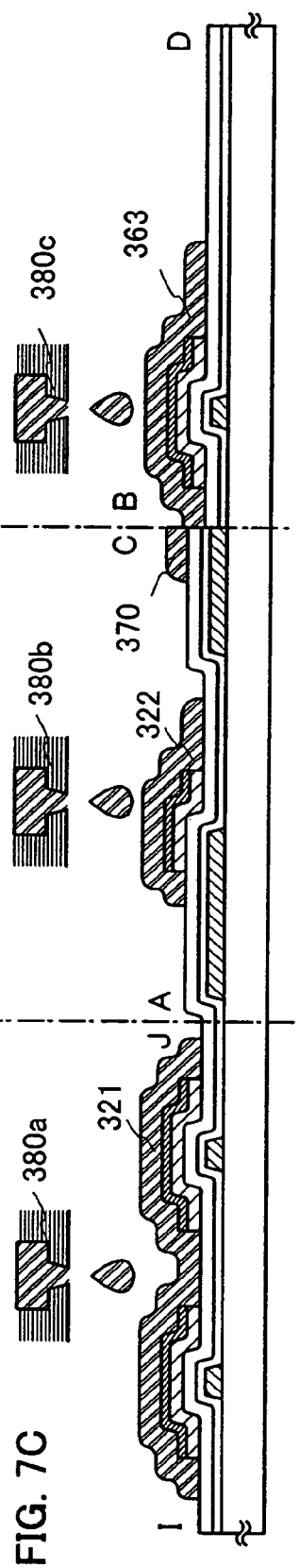
FIG. 7A
FIG. 7B
FIG. 7C

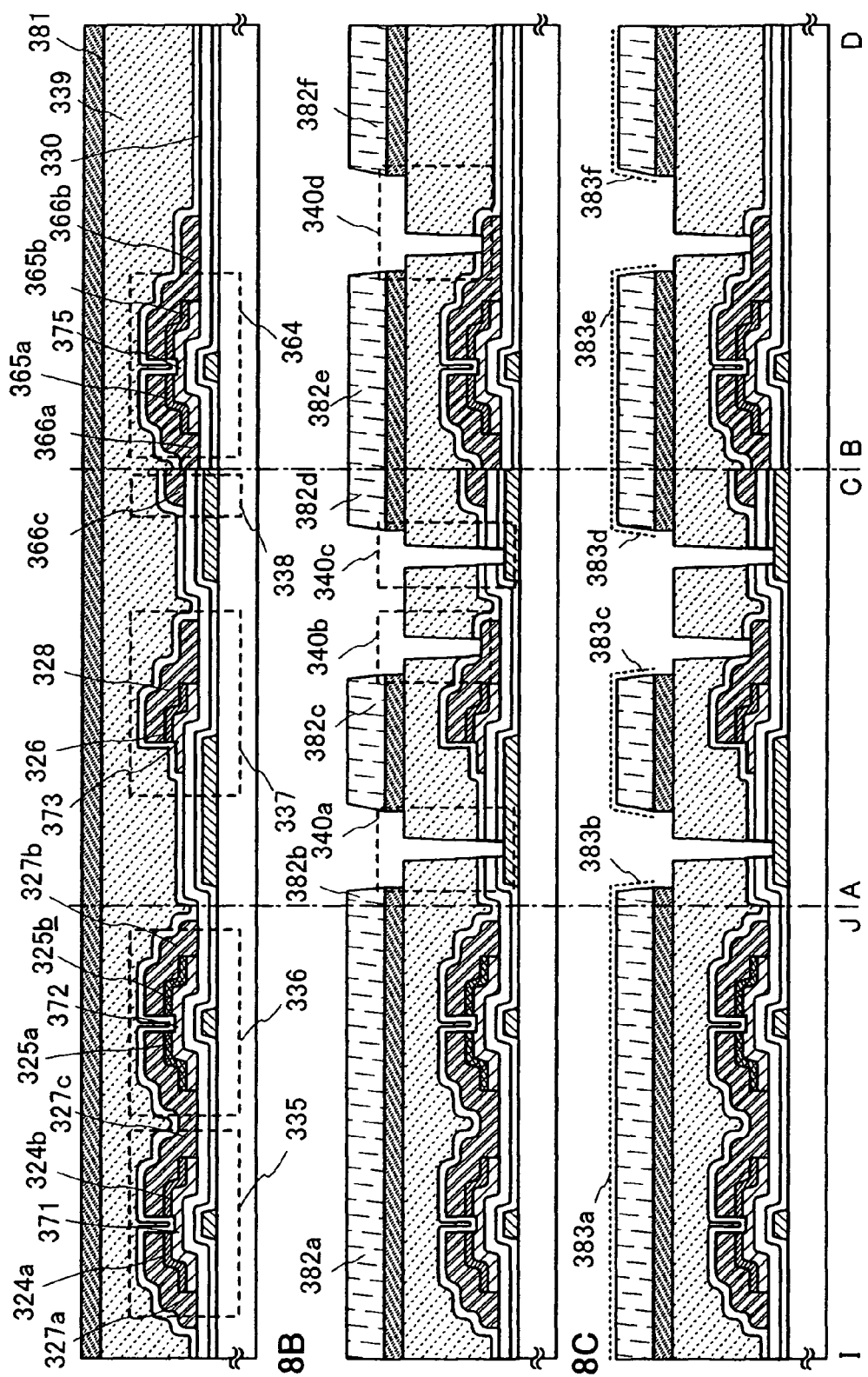

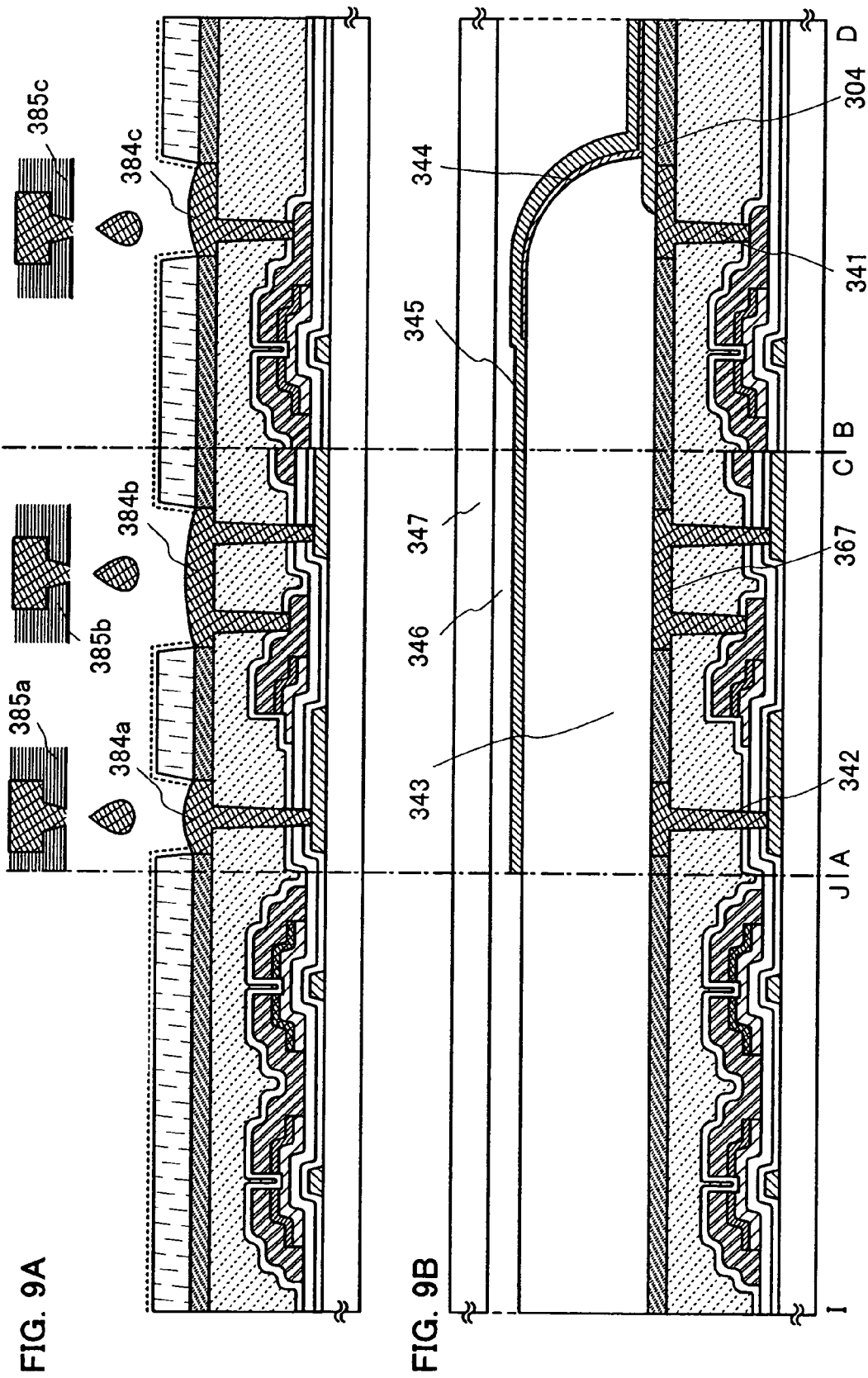

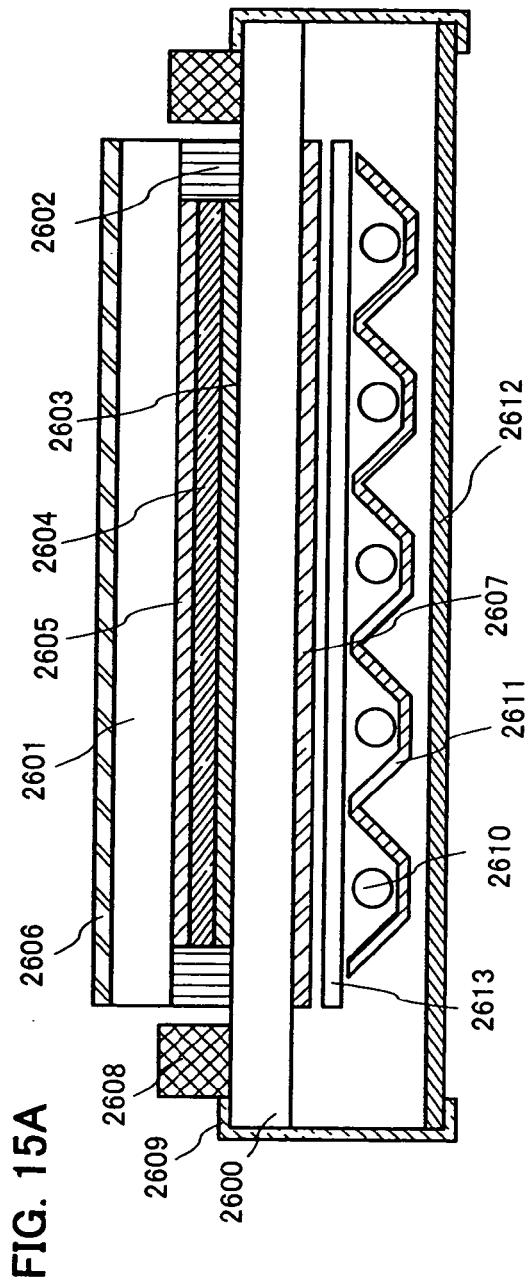
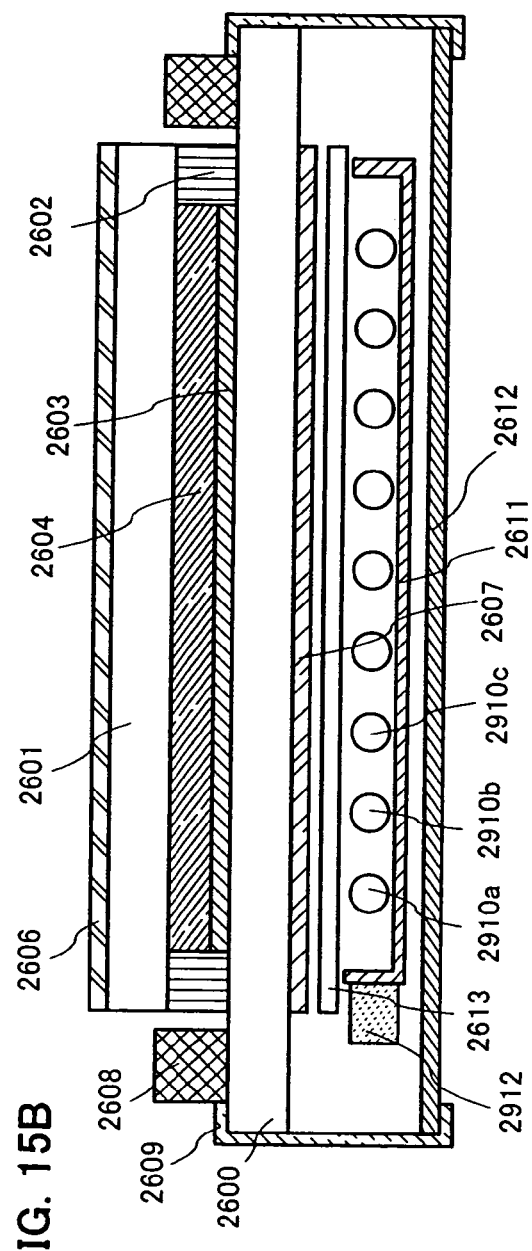
FIG. 15A
FIG. 15B

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Related Art

For a connection in a multi-layered wiring or between wiring layers, using copper (Cu) which is a low-resistance material, in a conventional semiconductor device, a method of manufacturing an embedded wiring structure by removing an unnecessary wiring material by a CMP technique is used (for example, Reference 1: Japanese Patent Laid-Open No. H9-306988). The embedded wiring is formed after forming a connecting plug from a lower wiring by a damascene method in which copper is embedded only in a wiring portion or a dual-damascene method in which wiring layers are connected to each other using copper in addition to embedding copper in the wiring portion. The dual-damascene method is described with reference to FIGS. 28A to 28E.

An insulating film 1002, a first wiring 1003, an interlayer insulating film 1004, an etching stopper insulating film 1005, and an interwiring insulating film 1006 are formed over a semiconductor substrate 1001 (FIG. 28A). A resist film 1007 provided with an opening portion is formed over the interwiring insulating film 1006, and a trench 1009 is formed in the interwiring insulating film 1006 using the resist film 1007 (FIG. 28B). After removing the resist film 1007, a resist film 1010 also having an opening portion is formed, and the etching stopper insulating film 1005 and the interlayer insulating film 1004 are etched to expose the first wiring using the resist film 1010 to form a connecting hole 1012 (FIG. 28C).

Copper 1023 is applied over the interwiring insulating film 1006, the connecting hole 1012, and the trench 1009 (FIG. 28D). The copper 1023 is removed in the part except the inside of the trench 1009 and connecting hole 1012 by polishing to form a connecting plug portion 1024 and a second wiring 1025 (FIG. 28E).

SUMMARY OF THE INVENTION

It is an object of the present invention to provide a technique capable of manufacturing a semiconductor device and a display device having a multi-layered wiring designed complexly over such a large-sized substrate as having a side of one meter or more with low cost and a high yield by simplifying the manufacturing process.

It is another object of the invention to provide a technique capable of forming a component such as a wiring included in the semiconductor device or display device into a desired shape with good adhesiveness.

In the specification, a semiconductor device refers to a device which is capable of functioning by using semiconductor characteristics. By the usage of the invention, a multi-layered wiring or a semiconductor device such as a processor chip can be manufactured.

The invention can be applied to a display device which is a device having a display function. The display device using the present invention includes a light emitting display device in which a TFT is connected to a light emitting element in which a medium including an organic material or a mixture of organic and inorganic materials which emit light, called electroluminescence (also referred to an EL) is interposed between electrodes, a liquid crystal display device using a liquid crystal element having a liquid crystal material as a display element, or the like.

One feature of a method of manufacturing a semiconductor device of the present invention is to comprise the steps of: forming a first conductive layer, forming a first insulating layer over the first conductive layer, forming a second insulating layer over the first insulating layer, forming a first opening portion reaching the first conductive layer in the first insulating layer and the second insulating layer, forming a mask layer having lower wettability than the second insulating layer to a composition containing a conductive material over the second insulating layer, forming a second opening portion wider than the first opening portion in the second insulating layer, and filling or putting the composition containing a conductive material into the first and second opening portions to form a second conductive layer.

One feature of a method of manufacturing a semiconductor device of the present invention is to comprise the steps of: forming a first conductive layer, forming a first insulating layer over the first conductive layer, forming a second insulating layer having pores over the first insulating layer, forming a first opening portion reaching the first conductive layer in the first insulating layer and the second insulating layer, forming a mask layer having lower wettability than the second insulating layer to a composition containing a conductive material over the second insulating layer, forming a second opening portion wider than the first opening portion in the second insulating layer, and filling or putting the composition containing a conductive material into the first and second opening portions and the pores in the second insulating layer to form a second conductive layer.

In addition, one feature of a method of manufacturing a semiconductor device of the present invention is to comprise the steps of: forming a first conductive layer, forming a first insulating layer over the first conductive layer, forming a second insulating layer over the first insulating layer, forming a first opening portion reaching the first conductive layer in the first insulating layer and the second insulating layer, forming a mask layer over the second insulating layer, forming a second opening portion wider than the first opening portion in the second insulating layer using the mask layer, performing a plasma treatment, which decreases wettability of a surface of the mask layer with respect to a composition containing a conductive material, on the surface of the mask layer, and filling or putting the composition containing a conductive material into the first and second opening portions to form a second conductive layer.

Further, one feature of a method of manufacturing a semiconductor device of the present invention is to comprise the steps of: forming a first conductive layer, forming a first insulating layer over the first conductive layer, forming a second insulating layer having pores over the first insulating layer, forming a first opening portion reaching the first conductive layer in the first insulating layer and the second insulating layer, forming a mask layer over the second insulating layer, forming a second opening portion wider than the first opening portion in the second insulating layer using the mask layer, performing a plasma treatment, which decreases wettability of a surface of the mask layer with respect to a composition containing a conductive material, on the surface of the mask layer, and filling or putting the composition containing a conductive material into the first and second opening portions and the pore in the second insulating layer to form a second conductive layer.

In accordance with the present invention, conductive layers having good adhesiveness each other can be formed. Further, material loss and cost can be reduced. Hence, a semiconductor device and a display device with high performance and high reliability can be manufactured with a high yield.

BRIEF DESCRIPTION OF THE DRAWINGS

In the accompanying drawings:
FIGS. 6A to 6C show a method of manufacturing a display device using the present invention;
FIGS. 7A to 7C show a method of manufacturing a display device using the present invention;
FIGS. 8A to 8C show a method of manufacturing a display device using the present invention;
FIGS. 9A and 9B show a display device using the present invention;
FIGS. 15A and 15B are sectional views showing structural examples of a liquid crystal display module using the present invention.

DETAILED DESCRIPTION OF THE INVENTION

Figure 1A:
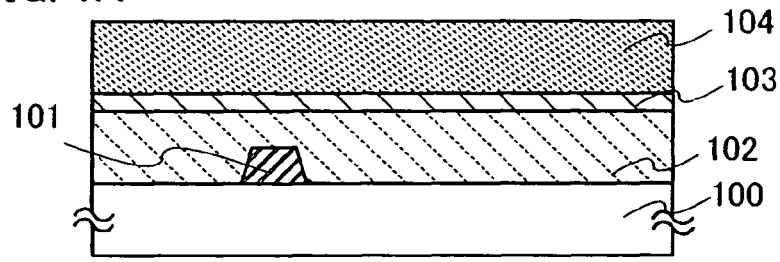
FIGS. 1A to 1D are schematic views showing the present invention.

Embodiment mode of the invention will be described in detail with reference to the drawings. However, it is easily understood by those skilled in the art that the invention is not limited by the following descriptions and various changes may be made in forms and details without departing from the spirit and the scope of the invention. Therefore, the invention should not be limited to descriptions of Embodiment modes below. The same reference numerals are commonly given to the same components or components having the same function in the structure of the invention, and a repetitive explanation will be omitted.

Embodiment Mode 1

Embodiment mode 1 of the present invention will be described with reference to FIGS. 1A to 1D and FIGS. 2A and 2B.

One feature of the present invention is that at least one or more of components required to manufacture a semiconductor device or a display device, such as a conductive layer for forming a wiring layer or an electrode, or a mask layer for forming a predetermined pattern, is/are formed by a method capable of selectively forming a pattern into a desired shape to manufacture a semiconductor device or a display device. In the present invention, a component (also referred to as pattern) refers to a conductive layer such as a wiring layer, a gate electrode layer, a source electrode layer, or a drain electrode layer; a semiconductor layer; a mask layer; an insulating layer; or the like, which is included in a thin film transistor or a display device, and includes all components that are formed to have a predetermined shape. A droplet discharge (ejection) method (also referred to as an ink-jet method, depending on its mode), that can form a conductive layer, an insulating layer, or the like into a predetermined pattern by selectively discharging (ejecting) a droplet of a composition mixed for a particular purpose, is employed as the method capable of selectively forming a substance to be formed into a desired pattern. In addition, a method capable of transferring or drawing a component into a desired pattern, for example, various printing methods (a method of forming a substance to be formed into the desired pattern, such as screen (mimeograph) printing, offset (planograph) printing, relief printing, gravure (intaglio) printing, or the like), a selective-coating method, or the like can also be employed.

This embodiment mode uses a method of discharging (ejecting) a composition containing a component forming material, which is fluid, as a droplet to form the composition containing a component forming material into a desired pattern. A droplet containing the component forming material is discharged to a component formation region, and the composition is fixed by baking, drying, and the like to form a component having a desired pattern.

Figure 29:
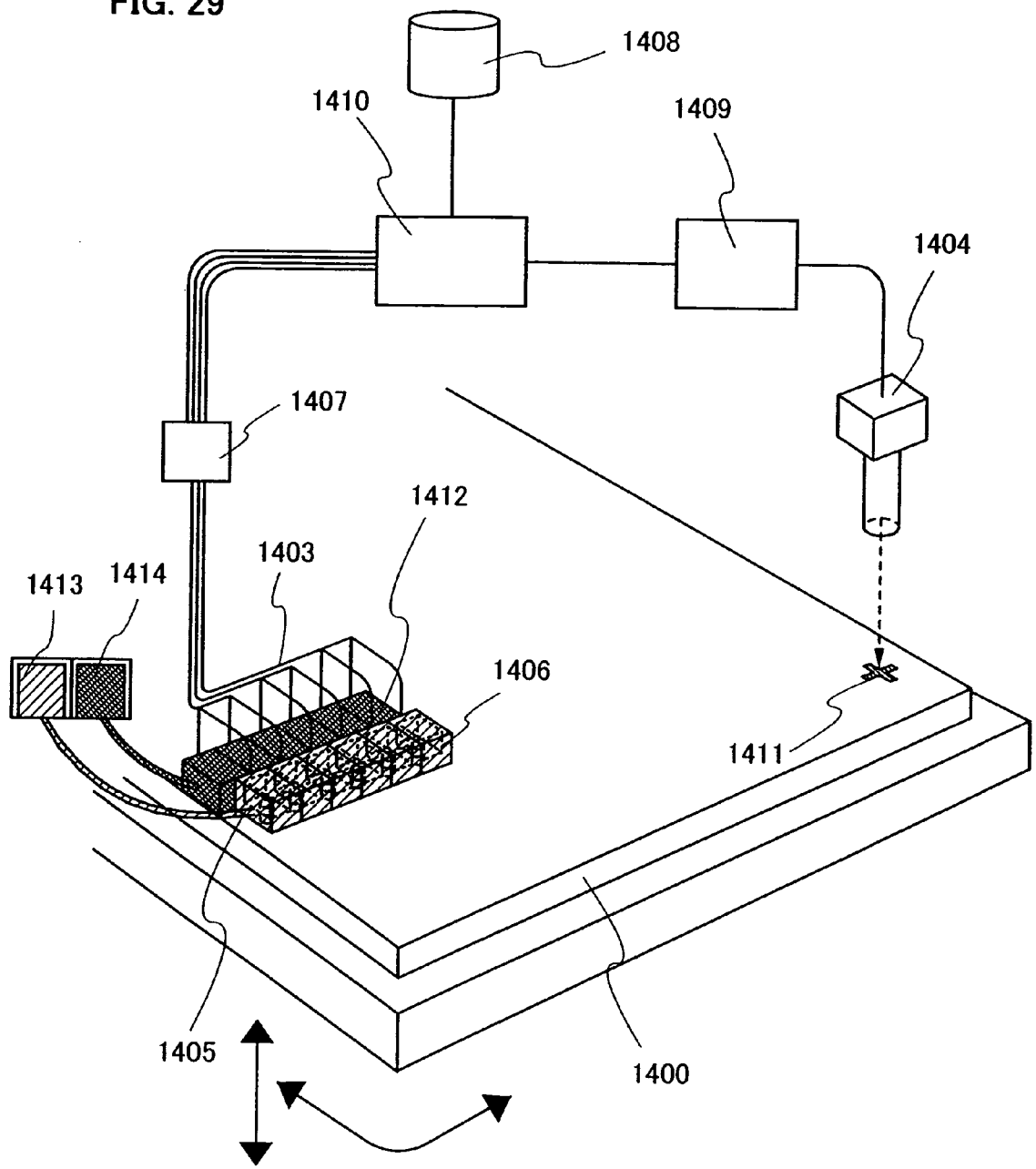
FIG. 29 shows a structure of a droplet discharge apparatus applicable to the present invention.

One mode of a droplet discharge apparatus used for a droplet discharge method is shown in FIG. 29. Each of heads 1405 and 1412 of a droplet discharge device 1403 is connected to a control means 1407, and this control device 1407 is controlled by a computer 1410, so that a preprogrammed pattern can be formed; The formation position may be determined, for example, based on a marker 1411 that is formed over a substrate 1400. Alternatively, a reference point may be fixed based on an edge of the substrate 1400. The reference point is detected by an imaging device 1404, and changed into a digital signal by an image processing circuit 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging device 1404. Naturally, information about a pattern to be formed over the substrate 1400 is stored in a storage medium 1408, and the control signal is transmitted to the control means 1407 based on the information, so that each head 1405 and 1412 of the droplet discharge device 1403 can be individually controlled. The heads 1405 and 1412 are supplied with a material to be discharged from material supply sources 1413 and 1414 through pipes, respectively.

The head 1405 has an inside structure which has a space filled with a liquid material as shown by dotted lines 1406 and a nozzle which is a discharge opening. Although it is not shown, the inside structure of the head 1412 is similar to the head 1405. When the nozzle sizes of the heads 1405 and 1412 are different from each other, different materials with different widths can be discharged simultaneously. Also, a conductive material, an organic material, an inorganic material, or the like can be each discharged from one head. In a case of drawing over a wide area such as an interlayer film, one material can be simultaneously discharged from a plurality of nozzles to improve throughput, and thus, drawing can be performed. When a large-sized substrate is used, the heads 1405 and 1412 can freely scan over the substrate in a direction indicated by arrows in FIG. 29, and a region to be drawn can be freely set. Thus, a plurality of the same patterns can be drawn over one substrate.

The general idea of the embodiment mode of the present invention will be described using a method of forming a wiring layer with reference to FIGS. 1A to 1D and FIGS. 2A and 2B.

A wiring layer 101 is formed together with an active element such as a field effect transistor or a thin film transistor (not shown) over a substrate 100, which may be a silicon substrate, a glass substrate, a quartz substrate, a plastic substrate, or the like. A film of a conductive material such as Al, Cu, W is formed by sputtering, a vacuum evaporation method, CVD, or the like and is processed into a desired shape by photolithography or etching to form the wiring layer 101. Alternatively, a film may be selectively formed by a droplet discharge method to discharge a material, in which the conductive material is dissoluted or dispersed in a solvent, and a heat treatment may be performed to form a wiring layer.

Insulating layers 102, 103, and 104 are formed. An insulating layer having pores can be used for an interlayer insulating layer such as the insulating layers 102, 103, or 104. In this embodiment mode, an organic siloxane film having minute pores is formed by a coating method to form the insulating layers 102 and 104. An organic siloxane composition containing a pore forming material is formed by a coating method such as spin coating or slit coating, and through a heat treatment, along with a hardening reaction of the organic siloxane, the pore forming material is decomposed and vaporized. Due to this, a large number of minute pores are formed in the organic siloxane film. By the generation of the minute pores, dielectric constant of the interlayer insulating film and parasitic capacitance between wirings are reduced, and signal lag can be suppressed. The insulating layer 103 functions as an etching stopper film when the insulating layer 104 is processed into a desired shape. The insulating layer 103 is not necessary when an etching selection ratio of the insulating layers 102 to 104 is high. In the present embodiment mode, a silicon nitride film formed by CVD is used for the insulating layer 103. The insulating layer 103 is only required to function as the etching stopper film for etching an opening for a wiring, and another material may be used as long as the same effect can be obtained.

Figure 1B:
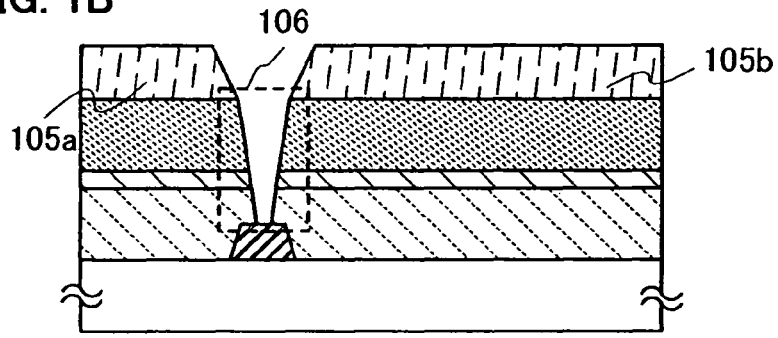
Figure 1C:
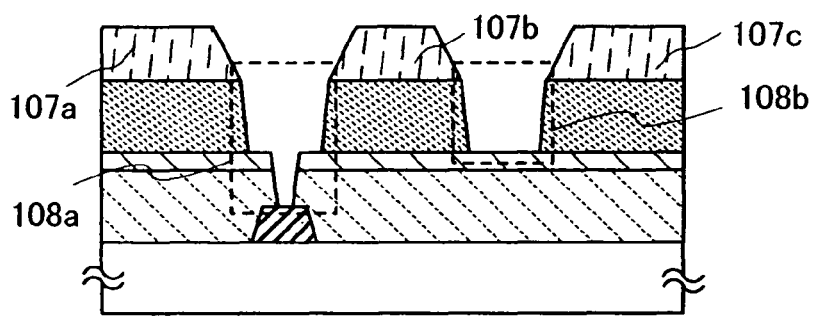
Figure 1D:
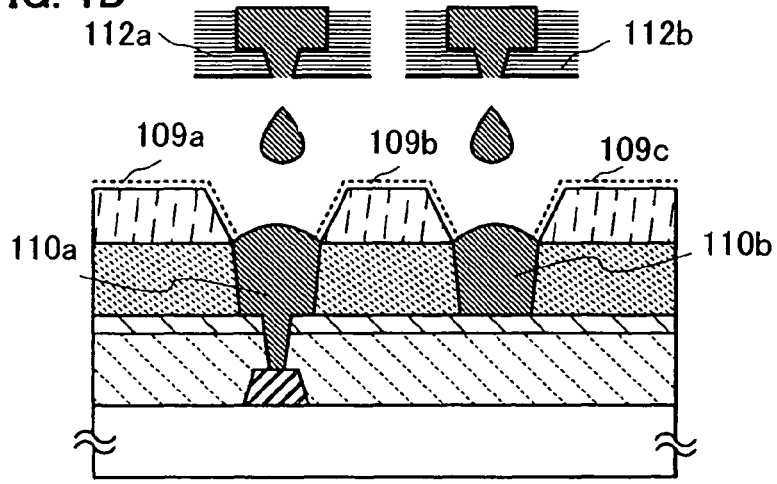

Mask layers 105a and 105b, which is made of a resist having an opening portion in a portion to be connected to the wiring layer 101, are formed in a photolithography step. These mask layers 105a and 105b are used as etching masks, and the insulating layers 102, 103, and 104 are etched until the wiring layer 101 is exposed to form an opening portion 106 (FIG. 1B). Subsequently, the mask layers 105a and 105b are removed.

Mask layer 107a, 107b, and 107c that have opening portions in a region where a wiring layer is to be formed, are formed in a photolithography step. A resist material or an organic material is preferable as a material for the mask layers. In the present embodiment mode, a dissolution-inhibition resist is used, which uses a novolac resin as a polymer and diazonaphthoquinone as a photosensitive agent. The mask layers 107a, 107b, and 107c are used as etching masks, and the insulating layer 104 is etched until the insulating layer 103 is exposed to form opening portions 108a and 108b.

Subsequently, by performing a plasma treatment in a gas atmosphere containing fluorine, C—F bonds over surfaces of the mask layers 107a, 107b, and 107c is substituted for C—H bonds, and surface energy of the surfaces of the mask layers is reduced. In this embodiment mode, a plasma treatment is performed in a mixed gas atmosphere of $CF_4$ and $O_2$. Subsequently, a solution in which a conductive material is dissolved or dispersed in a solvent (hereinafter, also referred to as a composition containing a conductive material) is selectively discharged to the opening portions 108a and 108b by droplet discharge means 112a and 112b. In the present embodiment mode, a solution in which an Ag nanoparticles are dispersed in a solvent of tetradecane is used. Generally, a droplet discharge method is inferior to a photolithography step in terms of positioning accuracy. However, surfaces of the resist films, which are the mask layers, function as low wettability regions 109a, 109b and 109c with respect to the composition containing the conductive material, and energy of the surfaces is reduced. Therefore, even when the discharged solution is attached to the resist films, it is repelled by the resist films, and is moved to the opening portions 108a and 108b.

In the embodiment mode, although surface energy of the surfaces of the mask layers is reduced by the plasma treatment in a gas atmosphere containing fluorine, another method may be used as long as the same effect can be obtained. For example, a resist film with low surface energy can be formed by coating, exposing to light, and developing a resist solution in which a surface modifier such as a monomer or an oligomer having a fluorocarbon group is added. Since fluorocarbon has low surface energy and tends to exist on a surface, the fluorocarbon group exists on the surface of the mask layer even by adding a small amount of 1%, and lowers the surface energy.

In a case in which diffusion of a wiring material to the insulating layers is a problem, a conductive film functioning as a barrier may be formed before forming a wiring. It is acceptable if the conductive film covers a side wall portion of the opening portions in contact with the wiring material. For example, a catalytic material such as palladium (Pd) may be adsorbed to the side wall portion of the opening portions, and NiB may be formed by chemical plating.

Next, a solution formed as conductive layers 110a and 110b is dried by a heat treatment. In this embodiment mode, tetradecane is evaporated by a heat treatment at a temperature of 150° C. for 10 minutes. After removing the mask layers, a heat treatment is performed at a temperature of 230° C. for 1 hour to advance adhesion of the Ag nanoparticles, and wiring-layers 111a and 111b are formed. The wiring layer 111a is electrically connected to the wiring layer 101. In a case in which the diffusion of the wiring material to an interlayer insulating film is a problem, a silicon nitride film may be formed by CVD. By repeating the above steps, multi-layered wirings can be formed.

In the case of forming a conductive layer by a droplet discharge method, a conductive layer is formed as follows: a composition containing particles of a conductive material is discharged, and fused or welded by baking to solidify the composition. Since the composition containing a conductive material is attached to the formation region by discharging, it is formed including a solvent and conductive particles to have fluidity. As for the conductive layer formed by discharging and baking the composition containing a conductive material, there are cases in which the conductive layer is not densely formed, has a defect, or has poor adhesiveness to the insulating surface that is a formation subject (an object onto which the composition is formed). Such a defect in adhesiveness reduces the reliability of a semiconductor device, a display device, or the like to be manufactured.

An insulating layer having pores (cavity, hole) in the layer or on its surface can be used for an insulating layer used as an interlayer insulating layer. The pores existing in the layer or on the surface of the layer can hold a conductive material, which is formed as follows: a particulate conductive material attached to the surface enters, fills, and is baked in the pore to be solidified. In this specification, a pore refers to a space which an insulating layer has inside or on the surface, where a conductive material can enter and the solidified conductive layer can be kept and held. The acceptable size of the pore is a size which a particle of the conductive material discharged into the insulating layer can enter, and an effect of fixing the conductive material to the surface of the insulating layer (also referred to as adhesiveness or fixing strength) can be obtained by the existence of the pores. Therefore, the size of the pore is determined by a relative relationship between an opening portion of the pore and the particle of the discharged conductive material, and it is acceptable as long as the size of the opening portion of the pore is bigger than that of the particle included in the conductive material. In addition, the shapes of the pores may be inconsistent, and may be shapes having a curvature or a shape having a needle-like corner, as long as they have at least one opening portion or more for passing the conductive material. The pore of the insulating layer may be plural or singular, and may be united by a partial or complete connection of the pores. The solidification shape of the particles of the conductive material, with which the inside of the pores are filled, depends on the shape of the pores. Therefore, it is preferable that at least one part or more of the pore becomes bigger from the opening portion of the pore toward the inside (inner part of the pore) so that the solidified conductive layer works as a wedge or an anchor in the insulating layer and an effect of improving adhesiveness can be obtained. In addition, a pore having a complicated shape such as a constricted shape or a polygon having many sides can fix the conductive layer with more adhesiveness and prevent the conductive layer from being peeled or removed.

It is preferable that an insulating layer has many pores since a capability of holding the conductive material and adhesiveness is increased. Such a characteristic of having many minute pores (cavity) is called "porous", and a substance having many minute pores is called a porous substance. The porous substance is characterized by the percentage of the minute pores in the substance (pore density), the size distribution of the minute pores, and the shapes of the minute pores. The size of the minute pores depends on the substance, and a pore of less than 2 nm is referred to as a micropore, a pore of 2 nm to 50 nm is referred to as a mesopore, and a pore of more than 50 nm is referred to as a macropore. The size of the pore may be selected to be larger than the particle of the conductive material, so that the particle of the conductive material can enter the pore. The porous substance varies from a microporous substance to a porous substance, depending on the pore density. In the present invention, a layer (film) having pores, which are capable of keeping a solidified conductive layer, can be used as an insulating layer, regardless of the pore density.

As a method by which a conductive material can enter the pore in an insulating layer, there is a method of entering a pore in an insulating layer by the capillary phenomenon, or a method of adsorbing a discharged material by an electric state of a surface of the layer. The present invention is not limited thereto.

Figure 2A:
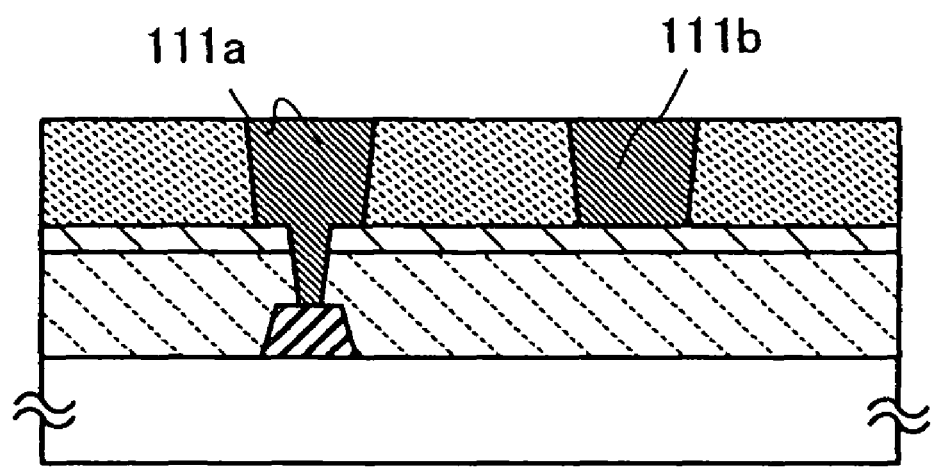
FIGS. 2A and 2B are general views showing the present invention.
Figure 2B:
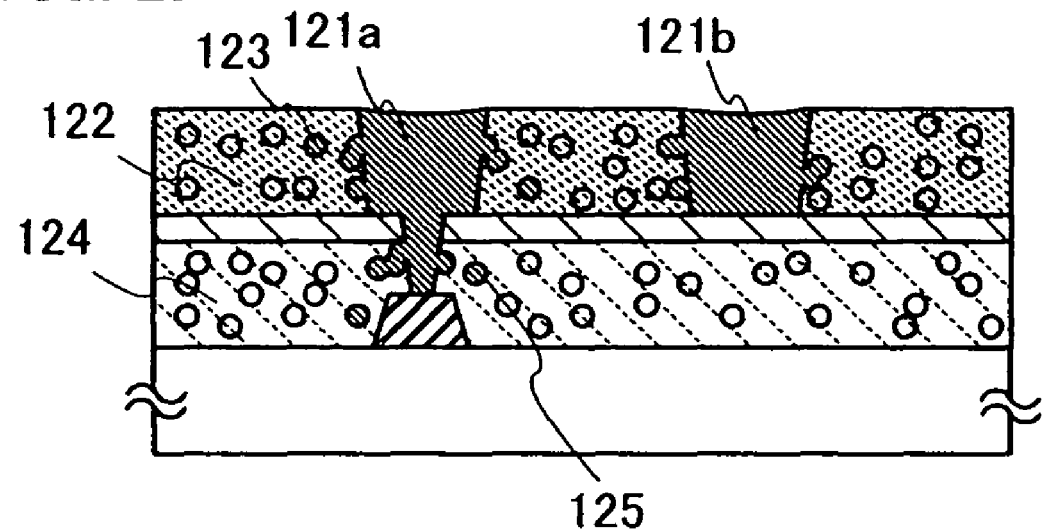

FIG. 2B shows a case in which an insulating layer having pores is used for insulating layers 124 and 122, which serve as interlayer insulating layers. Since an opening portion is formed by etching the interlayer insulating layer having minute pores, there are many cross-sections of the pores at the side of the opening portion. Because a wiring layer formed in a later step is solidified after entering the pores, an anchor effect is obtained for the wiring layer to have strong attachment to the interlayer insulating layer.

As shown by pores 123 and 125, the insides of a plurality of the pores in the insulating layers are filled with particles of a conductive material in a liquid composition. Fusing and cohesion of the conductive material after filling are performed by subsequent steps of drying and baking to solidify the conductive material with the shapes of the pores. The solidified and united conductive layer that works to keep the conductive layer inside the pores acts like a wedge or an anchor for the entire conductive layers 121a and 121b. Therefore, the conductive layers tightly attach to the insulating layers 124 and 122.

The insulating layer having pores, as described above, can keep the dielectric constant low. Porosity of such an insulating layer having pores is preferably 20% to 90%. When the dielectric constant is low, parasitic capacitance can be reduced, which enables high-speed driving of a semiconductor device.

In this embodiment mode, the wiring layers 111a and 111b are formed by using a droplet discharge device. The droplet discharge device is a general term for an device with a device that discharges a droplet, such as a nozzle having a discharge opening of a composition, or a head equipped with a single or plurality of nozzles. The diameter of the nozzle included in the droplet discharge device is set in the range of 0.02 μm to 100 μm (preferably, 0.02 μm to 30 μm or less), and the amount of the composition to be discharged from the nozzle is set in the range of 0.001 pl to 100 pl (preferably, 0.1 pl to 40 pl, more preferably, 0.1 pl to 10 pl). The amount of the composition to be discharged increases in proportion to the size of the diameter of the nozzle. Further, it is preferable that the distance between an object to be processed and the discharge opening of the nozzle is as short as possible in order to drop a droplet on a desired position. Preferably, the distance is set within the approximate range of 0.1 mm to 3 mm (more preferably, 0.1 mm to 1 mm or less).

For the composition to be discharged from the discharge opening, a conductive material dissolved or dispersed in a solvent is used. The conductive material corresponds to fine particles of one or plural kinds of metal selected from Ag, Au, Cu, Ni, Pt, Pd, Ir, Rh, W, and Al, and may be mixed with a fine particle of one or plural kinds of sulfide of a metal such as Cd or Zn, an oxide of Fe, Ti, Si, Ge, Zr, Ba, or the like, silver halide, or the like. Also, the conductive material may correspond to indium tin oxide (ITO), ITSO formed of indium tin oxide and silicon oxide, organoindium, or organotin, zinc oxide, titanium nitride, or the like, which is used for a transparent conductive film. However, as for the composition to be discharged from the discharge opening, it is preferable to use one of the materials of gold, silver, or copper dissolved or dispersed in a solvent, taking into consideration a specific resistance value. It is more preferable to use silver or copper having low resistance values. However, when silver or copper is used, a barrier film may be additionally provided as a countermeasure against impurities. A silicon nitride film or nickel boron (NiB) can be used for the barrier film.

In addition, a barrier film with a plurality of layers, in which a conductive material is coated with another conductive material, may be used. For example, a three-layer structure barrier film in which copper is coated with nickel boron (NiB), which is further coated with silver, may be used. As for the solvent, ester such as butyl acetate or ethyl acetate; alcohol such as isopropyl alcohol or ethyl alcohol; organic solvent such as methyl ethyl ketone or acetone; or the like is used. The viscosity of the composition is preferably 20 mPa·s or less. This prevents the composition from being stuck at the discharge opening by drying, and enables the composition to be discharged smoothly from the discharge opening. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organotin is dissolved or dispersed in a solvent may be set from 5 mPa·s to 20 mPa·s, the viscosity of a composition in which silver is dissolved or dispersed in a solvent may be set from 5 mPa·s to 20 mPa·s, and the viscosity of a composition in which gold is dissolved or dispersed in a solvent may be set from 5 mPa·s to 20 mPa·s.

The conductive layer may be formed by laminating a plurality of conductive materials. In addition, the conductive layer may be formed first by a droplet discharge method using silver as a conductive material, and a plating with copper or the like may be performed thereafter. Plating may be performed by an electroplating or chemical (electroless) plating method. Plating may be performed by soaking a substrate surface into a container filled with a solution containing a plating material; alternatively, the solution containing a plating material may be applied by placing the substrate in an oblique (or perpendicular) position, and pouring the solution over the substrate surface. When the plating is performed by applying a solution with the substrate placed obliquely or perpendicularly, there is an advantage that an apparatus used for the process can be downsized even with a large-sized substrate.

Although it depends on the diameter of each nozzle, a desired shape of a pattern, and the like, the diameter of a particle of the conductive material is preferably as small as possible, for the purpose of preventing nozzles from being clogged and for manufacturing a fine pattern. Preferably, the diameter of the particle of the conductive material is 0.1 μm or less. The composition is formed by a known method such as an electrolyzing method, an atomizing method, a wet reduction method, and the particle size to be obtained is typically about 0.01 μm to 10 μm. However, when a gas evaporation method is employed, nanoparticles protected by a dispersant are minute, about 7 nm, and when the surface of each particle is covered with a coating, the nanoparticles do not aggregate in the solvent and are uniformly dispersed in the solvent at room temperature, and behaves similarly to a liquid. Accordingly, it is preferable to use a coating.

When using a difference of wettability between a composition having fluidity and the vicinity of a formation region to process into a desired pattern, the composition needs to have fluidity even when the composition is attached to the object to be processed. However, as long as the fluidity is not lost, the process of discharging the composition may be performed under reduced pressure. In addition, when the process is performed under reduced pressure, an oxide film or the like is not formed over the surface of the conductive material, which is preferable. After discharging the composition, either or both steps of drying and baking is/are performed. Both the drying and baking steps are heat treatments. For example, drying may be performed for three minutes at 100° C. and baking may be performed for 15 minutes to 60 minutes at a temperature of 200° C. to 550° C., treatment temperatures and treatment period may be changed corresponding to purposes. The steps of drying and baking are performed under normal pressure or under reduced pressure, by laser light irradiation, rapid thermal annealing, heating using a heating furnace, or the like. Note that the timing of the heat treatment and the number of times of the heat treatment is not particularly limited. The substrate may be heated in advance to perform the steps of drying and baking well, and although the temperature of the substrate at the time depends on the material of the substrate or the like, it is typically 100° C. to 800° C. (preferably, 200° C. to 550° C.). Through these steps, nanoparticles are made in contact with each other and fusion and welding are accelerated by a hardening and shrinking of a peripheral resin, while the solvent in the composition is volatilized or the dispersant is chemically removed.

A gas laser or a solid-state laser of a continuous oscillation or pulsed oscillation may be used for laser light irradiation. An excimer laser, an ion laser, or the like can be used as the former gas laser. A laser or the like using a crystal of YAG, $YVO_4$, $GdVO_4$, or the like which is doped with Cr, Nd, or the like can be used as the latter solid-state laser. Note that it is preferable to use a continuous wave laser in consideration of the absorption rate of laser light. Moreover, a so-called hybrid laser irradiation method in which pulsed and continuous wave lasers are combined may be used. However, it is preferable that the heat treatment by laser light irradiation is instantaneously performed within several microseconds to several tens of seconds so as not to deform or damage the substrate, depending on heat resistance of the substrate. Rapid thermal annealing (RTA) is carried out by raising the temperature rapidly and heating instantaneously for several microseconds to several minutes using an infrared lamp or a halogen lamp which emits light of ultraviolet to infrared light in an inert gas atmosphere. Since the treatment is performed instantaneously, only a thin film on a top surface can be actually heated and the lower layer of the film is not affected. In other words, even a substrate having low heat resistance such as a plastic substrate is not affected.

After forming a gate electrode layer and the like by discharging a composition by a droplet discharge method, the surface thereof may be planarized by pressing with pressure to enhance the flatness. As a pressing method, an asperity of the surface may be smoothed and reduced by moving a roller-shaped object over the surface, or the surface may be perpendicularly pressed with a flat plate-shaped object. A heating step may be performed at the time of pressing. Alternatively, the asperity of the surface may be eliminated with an air knife after softening or melting the surface with a solvent or the like. CMP may be also used for polishing the surface. This step may be applied for planarizing a surface when the asperity is caused by a droplet discharge method.

As a substance having low wettability, a substance containing a fluorocarbon group or a silane coupling agent can be used. The silane coupling agent is denoted by the chemical formula: $R_n-Si-X_{(4-n)}$ (n=1, 2, 3). In this chemical formula, R represents a substance containing a relatively inactive group such as an alkyl group. X represents a hydrolytic group such as halogen, a methoxy group, an ethoxy group, or an acetoxy group that is bondable by a condensation of a hydroxyl group or an adsorbed water on a substrate surface.

As a representative example of the silane coupling agent, by using a silane coupling agent containing fluorine (such as fluoroalkylsilane (FAS)) that has a fluoroalkyl group for R, the wettability can be further reduced. R in the FAS has a structure expressed by $(CF_3)(CF_2)_x(CH_2)_y$ (x is an integer in the range of 0 to 10, and y is an integer in the range of 0 to 4). When a plurality of Rs or Xs are bonded with Si, the Rs or Xs may be the same or different from one another. Typically, the following can be cited as the FAS: fluoroalkylsilane such as, heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane.

As a solvent of a solution forming a low wettability region, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene, or squalane, tetrahydrofuran; or the like is used.

As an example of a composition of a solution for forming a low wettability region, a substance having fluorocarbon chain (e.g., fluorine-based resin) can be used. As the fluorine-based resin, the following can be used: a polytetrafluoroethylene (PTFE) resin; a perfluoroalkoxyalkane (PFA) or tetrafluoroethylene perfluoroalkylvinylether copolymer resin; a perfluoroethylene propene copolymer (PFEP) or tetrafluoroethylene-hexafluoropropylene copolymer resin; an ethylene-tetrafluoroethylene copolymer (ETFE) or tetrafluoroethylene-ethylene copolymer resin; a polyvinylidene fluoride (PVDF) resin; a polychlorotrifluoro ethylene (PCTFE) or polytrifluorochloroethylene resin; an ethylene-chlorotrifluoroethylene copolymer (ECTFE) or polytrifluorochloroethylene-ethylene copolymer resin; a polytetrafluoroethylene-perfluorodioxole copolymer (TFE/PDD); a polyvinyl fluoride (PVF) or vinyl fluoride resin; or the like.

Further, a treatment by $CF_4$ plasma or the like may be performed later using an organic material to form a low wettability region. As the organic material, for instance, a material of a solvent such as $H_2O$ mixed with a water-soluble resin such as polyvinyl alcohol (PVA) can be used. In addition, a combination of PVA and another water-soluble resin can be used. A material having a skeletal structure combining an organic material (organic resin material) (e.g., polyimide and acrylic) or silicon (Si) with oxygen(O), in which a material containing at least hydrogen, or a material containing at least one of fluorine, an alkyl group, or an aromatic hydrocarbon may be used as a substituent. Even when a material having a low-wettability surface is used, wettability can be further reduced by performing a plasma treatment or the like.

In accordance with the present invention, a component can be formed into a desired pattern with good adhesiveness, and material loss and cost can be reduced as well. Hence, a semiconductor device and a display device with high performance and high reliability can be manufactured with a high yield.

Embodiment Mode 2

In the present embodiment mode, steps of forming a MOS transistor using a single crystal semiconductor substrate and a multi-layered wiring structure having the MOS transistor are described with reference to FIGS. 3A to 3D and FIGS. 4A and 4B.

Element isolation regions 151a, 151b, and 151c are formed on a substrate 150. The substrate 150 is a single crystal semiconductor substrate or a compound semiconductor substrate, typically, an n-type or a p-type single crystal silicon substrate, a GaAs substrate, an InP substrate, a GaN substrate, an SiC substrate, a sapphire substrate, a ZnSe substrate, or the like. Alternatively, an SOI substrate (Silicon On Insulator) can be used as the substrate 150. In this embodiment mode, a single crystal silicon substrate is used as the substrate 150. A known-selective oxidation method (LOCOS (Local Oxidation of Silicon) method), a trench isolation method, or the like can be appropriately used to form the element isolation regions 151a, 151b, and 151c. As the element isolation regions 151a, 151b, and 151c, a silicon oxide film is formed by oxidizing a portion of a silicon substrate by the LOCOS method. Thereafter, well ion implantation, channel stop ion injection, or threshold adjustment ion implantation are appropriately carried out.

A surface of the substrate 150 is washed and exposed. Next, an insulating film functioning as a gate insulating layer is formed over the substrate 150 and the element isolation regions 151a, 151b, and 151c. A conductive film functioning as a gate electrode layer is formed over the insulating film. A silicon oxide film or a silicon nitride film can be used as the insulating film. Alternatively, over the substrate 150, a silicon oxide film and a silicon nitride film may be sequentially laminated, or a silicon oxide film, a silicon nitride film, and a silicon oxide film may be sequentially laminated over the substrate 150. In this embodiment mode, the insulating film is formed by sequentially laminating a silicon oxide film and a silicon nitride film. The conductive film can be formed by a known method such as sputtering, vapor deposition, CVD, or the like. The conductive film can be formed by using an element selected from tantalum (Ta), tungsten (W), titanium (Ti), molybdenum (Mo), aluminum (Al), copper (Cu), chromium (Cr), and neodymium (Nd), or an alloy material or a compound material containing the element as its main component. A semiconductor film doped with an impurity element can be used as the conductive film. The conductive film and the insulating film are processed into desired shapes to form gate electrode layers 153a and 153b, and gate insulating layers 152a and 152b.

Next, an insulating layer covering the gate electrode layers 153a and 153b, the gate insulating layers 152a and 152b, and the like is formed, and the insulating layer is processed by anisotropic etching of an RIE (reactive ion etching) method to form sidewalls (sidewall spacers) 154a, 154b, 154c, and 154d on a side wall of the gate electrode layers 153a and 153b and the gate insulating layers 152a and 152b in a self-aligned manner. Here, the insulating layer is not particularly limited. However, it is preferable that the insulating layer includes silicon oxide formed to have good step coverage by reacting TEOS (Tetra-Ethyl-Ortho-Silicate), silane, or the like with oxygen, nitrous oxide, or the like. The insulating layer can be formed by thermal CVD, plasma CVD, atmospheric pressure CVD, bias ECR CVD, sputtering, or the like.

The substrate 150 is doped with an impurity element in a self-aligned manner using the gate electrode layers 153a and 153b, the gate insulating layers 152a and 152b, and the sidewalls 154a, 154b, 154c, and 154d as masks. Then, the impurity element is activated by a heat treatment, a GRTA method, an LRTA method, or the like to form source or drain regions 155a, 155b, 155c, 155d, 156a, 156b, 156c, and 156d. The source or drain regions 155a to 155d are high concentration impurity regions, and the source or drain regions 156a to 156d are low concentration impurity regions. In the case of doping with boron (B) or the like imparting p-type conductivity as the impurity element, the source or drain regions become p-type impurity regions. In the case of doping with phosphorus (P) or the like imparting n-type conductivity as an impurity element, the source and drain regions become n-type impurity regions. In this embodiment mode, since an n-type MOS transistor is manufactured, doping is performed with phosphorus imparting n-type conductivity as an impurity element to form n-type impurity regions.

Figure 3A:
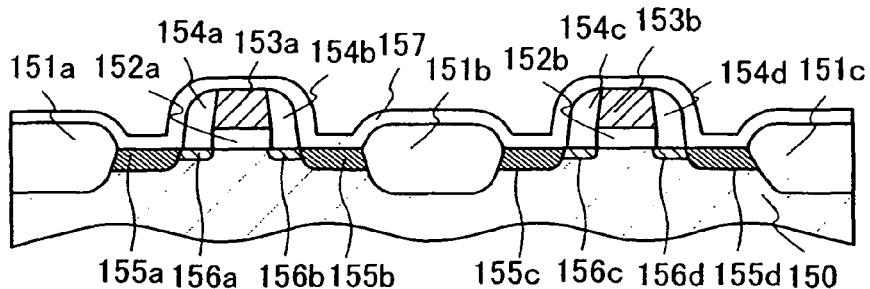
FIGS. 3A to 3D show a method of manufacturing a semiconductor device using the present invention.
Figure 3B:
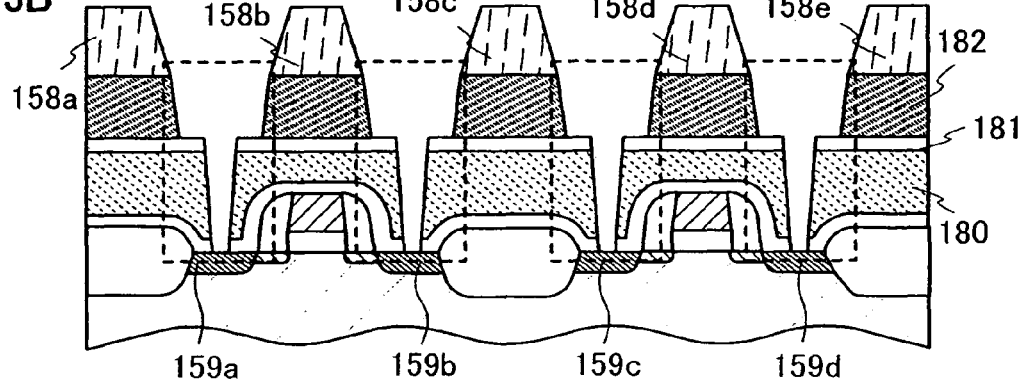
Figure 3C:
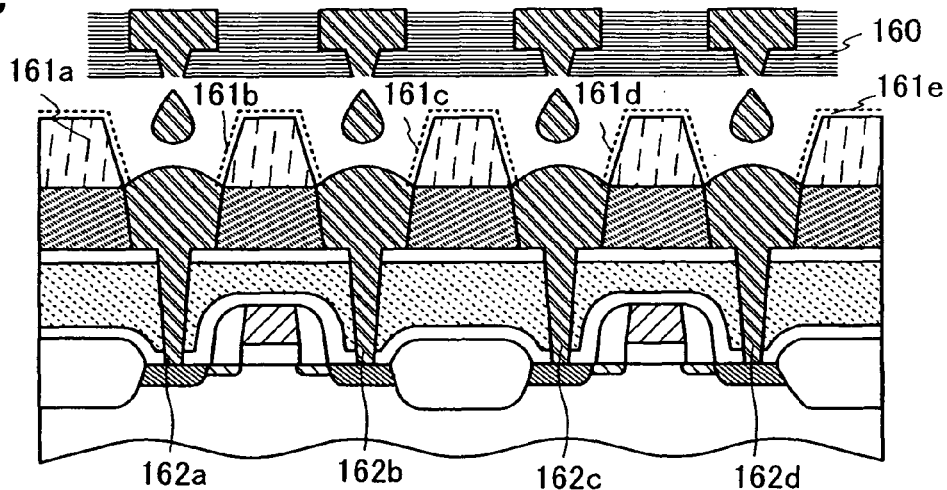

An insulating layer 157 is formed to cover the element isolation regions, the gate electrode layers, the sidewalls, and the like (FIG. 3A). In the present embodiment mode, the insulating layer 157 is formed of an insulating film containing silicon by plasma CVD or sputtering. The insulating layer 157 is not limited to a silicon nitride film, and it may be a silicon nitride oxide (SiNO) film formed using plasma CVD. Alternatively, it may have a single-layer or lamination structure of another insulating film containing silicon.

The insulating film 157 can be formed of a material selected from silicon nitride, silicon oxide, silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond like carbon (DLC), and a nitrogen-containing carbon film (CN). Alternatively, a siloxane resin may be used. Note that the siloxane resin corresponds to a resin containing a Si—O—Si bond. Siloxane has a skeletal structure formed from a bond of silicon (Si) and oxygen (O). As a substituent, an organic group containing at least hydrogen (e.g. an alkyl group or aromatic hydrocarbon) is used. Alternatively, a fluoro group may be used as the substituent. An organic group containing at least hydrogen and a fluoro group may also be used as the substituent.

Then, an insulating layer 180 functioning as an interlayer insulating film is formed. In the present invention, an interlayer insulating film for planarization is required to be highly heat resistant and insulative and to be highly planarized. Such an interlayer insulating film is preferably formed by a coating method typified by spin coating.

In the present embodiment mode, a material for the insulating layer 180 is a coating film having a skeletal structure formed from a bond of silicon (Si) and oxygen (O), in which a compound containing at least hydrogen (e.g. an alkyl group or aromatic hydrocarbon) as a substituent is used. Alternatively, a fluoro group may be used as the substituent. Further alternatively, a compound containing at least hydrogen, and fluorine may be used as the substituent. The film after baking can be referred to as a silicon oxide film containing an alkyl group ($SiO_x$). This silicon oxide film containing an alkyl group ($SiO_x$) can withstand a heat treatment of 300° C. or more.

Dip coating, spray coating, spin coating, a doctor knife, a roll coater, a curtain coater, a knife coater, CVD, vapor deposition, or the like can be used for forming the insulating layer 180. In addition, the insulating layer 180 may be formed by a droplet discharge method. A material solution can be saved when a droplet discharge method is used. A method capable of transferring or drawing a pattern like a droplet discharge method, for example, a printing method (a method in which a pattern is formed, such as screen printing or offset printing), or the like can also be used. In addition, an inorganic material may be used, and in the case, silicon oxide, silicon nitride, or silicon oxynitride may be used.

In addition to the insulating film in which a skeletal structure is formed from a bond of silicon (Si) and oxygen (O), the insulating layer 180 can also be formed using a film formed of one kind or plural kinds of an inorganic material (silicon oxide, silicon nitride, silicon oxynitride, silicon nitride oxide, PSG (phosphosilicate glass), BPSG (borophosphosilicate glass), an alumina film, or the like); a photosensitive or non-photosensitive organic material (organic resin material) (such as polyimide, acryl, polyamide, polyimide amide, resist, or benzocyclobutene); a low dielectric constant material; or the like, as long as it is highly heat resistant and is highly planarized. A lamination of these films can also be used.

Insulating layers 181 and 182 are laminated over the insulating layer 180. In the present embodiment mode, since the insulating layer 181 is used as an etching stopper in processing the insulating layer 182 into a desired shape, it is preferable that an etching selection ratio of the insulating layers 181 to 182 is high. The insulating layer 181 may be formed of the same material by the same steps as those of the insulating layer 157. The insulating layer 182 may be formed of a similar material by similar steps as those of the insulating layer 181. As described in Embodiment Mode 1, when an insulating layer having pores is used for the insulating layers 180, 181, and 182, the insides of the pores are filled with a portion of a conductive layer formed to attach to the insulating layers. Accordingly, a wedge-like effect (anchor effect) is obtained with respect to the insulating layers, which improves adhesiveness.

The insulating layers 157, 180, 181, and 182 are etched to form an opening portion reaching the source or drain regions. First, in this embodiment mode, a first opening portion is formed in the insulating layers 157, 180, 181, and 182; mask layers 158a, 158b, 158c, 158d, and 158e are formed; then, a second opening portion is formed to expand the first opening portion in the insulating layer 182 using the insulating layer 181 as an etching stopper. Cross-sections of the first and second opening portions in a film thickness direction are shown by opening portions 159a, 159b, 159c, and 159d in FIG. 3B. Side surfaces of the insulating layers 181 and 182, which faces the opening portions are discontinuous in a sectional direction and has a shape with a level difference.

Figure 3D:
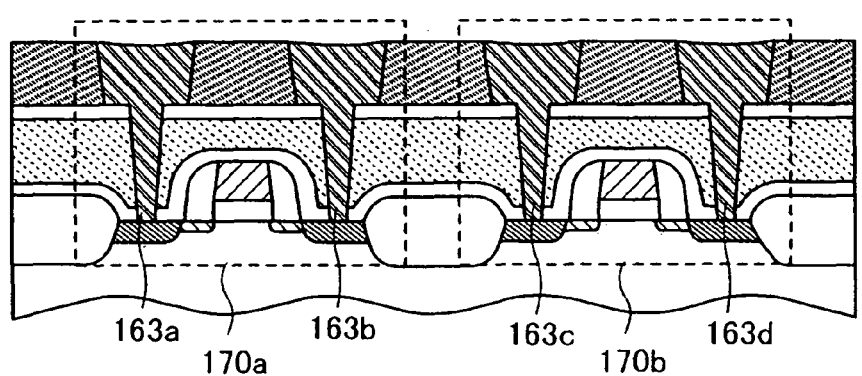

Next, a processing treatment is performed so that surfaces of the mask layers 158a, 158b, 158c, 158d, and 158e become low wettability regions with respect to a liquid composition containing a conductive material formed in the opening portions. In this embodiment mode, a C—F bond is substituted for a C—H bond over the surfaces of the mask layers by performing a plasma treatment in a gas atmosphere containing fluorine. Accordingly, surface energy of the surfaces of the mask layers is reduced. In this embodiment mode, a plasma treatment is performed in a mixed gas atmosphere of $CF_4$ and $O_2$. Since a low wettability region becomes a liquid-repellent region depending on the liquid and repels the liquid, a droplet cannot attach to the low wettability region. The liquid composition containing a conductive material does not attach to the surface of the masks having low wettability with respect to the composition. Even when it attaches, it is not stable, and the opening portion having relatively high wettability is filled with the composition containing a conductive material. Thus, since the opening portion is filled with the composition containing a conductive material, a wiring layer can be formed with good stability and controllability and material loss can be prevented. Therefore, the composition containing a conductive material discharged by a droplet discharge apparatus 160 is repelled by low wettability regions 161a, 161b, 161c, 161d, and 161e on the surfaces of the mask layers without attachment, the opening portions 159a, 159b, 159c, and 159d are filled with the composition containing a conductive material to form conductive layers 162a, 162b, 162c, and 162d. The conductive layers 162a, 162b, 162c, and 162d are solidified by drying and baking to form source or drain electrode layers 163a, 163b, 163c, and 163d. Accordingly, MOS transistors 170a and 170b are manufactured (FIG. 3D).

A low wettability substance with respect to a composition is provided only to the region where the source or drain electrode layers are not formed, and the region is made to have low wettability (hereinafter also referred to as a low wettability region). Then, the region where the source or drain electrode layers are formed becomes a region having relatively high wettability (hereinafter also referred to as a high wettability region). Since the discharged liquid composition containing a conductive material is repelled by a low wettability region, it is provided only in the region where the source or drain electrode layers are formed with good controllability in a self-aligned manner.

Regions having different wettability are those having different contact angles of a composition containing a conductive material. A region having a large contact angle of a composition containing a conductive material is a low wettability region, whereas a region having a small contact angle is a high wettability region. In the case that the contact angle is large, a liquid composition having fluidity does not spread on a surface of a region, is repelled by the surface, and does not wet the surface. In the case that the contact angle is small, the liquid composition having fluidity spreads over the surface and wets the surface more. Therefore, regions having different wettability have different surface energy. A surface of a low wettability region has low surface energy, and a surface of a high wettability region has high surface energy. Further, a low wettability region for a liquid means a region where the liquid is difficult to stay with stability, and behavior of a droplet on the surface of the region is changed depending on degree of wettability. When the wettability is low and liquid repellency is high in the region (also referred to as a region having lower wettability with respect to a droplet or a liquid-repellent region), the region completely repels liquid. In this specification, it is only required that an effect of forming a stable conductive layer to the region where the conductive layer is formed is obtained when selectively controlling wettability between the region where a conductive layer is formed and the region where a conductive layer is not formed. Naturally, it is preferable that the region where a conductive layer is not formed is completely a liquid-repellent region in order to form a conductive layer with good controllability. In addition, since only a surface which is in contact with and stabilizes a droplet is required to have the wettability, it is not necessary that the region where a conductive layer is formed has the same property in the entire thickness direction.

Figure 4A:
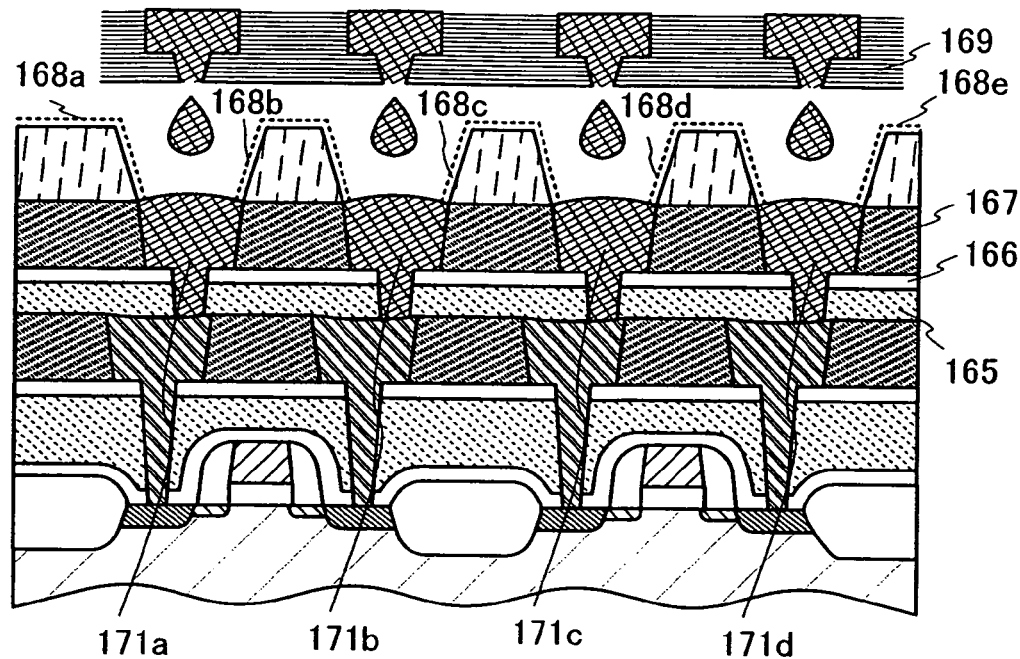
FIGS. 4A and 4B show a method of manufacturing a semiconductor device using the present invention.
Figure 4B:
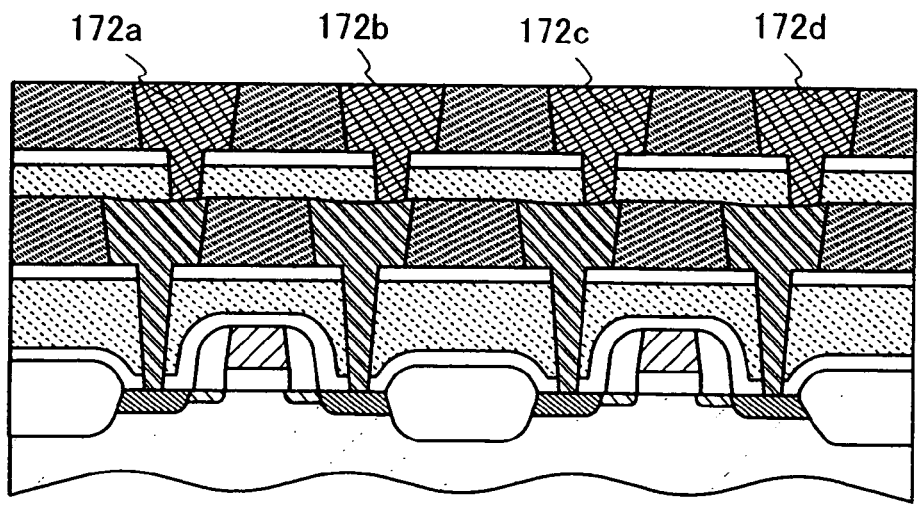

FIGS. 4A and 4B show an example of manufacturing a multi-layered wiring over the MOS transistor shown in FIGS. 3A to 3D. Insulating layers 165, 166, and 167 are laminated over the MOS transistor manufactured in FIGS. 3A to 3D, and opening portions reaching the source or drain electrode layers 163a, 163b, 163c, and 163d are formed. The insulating layers 165, 166, and 167 and the opening portions may be formed in the same way as the insulating layers 180, 181, and 182 and the opening portions 159a, 159b, 159c, and 159d. A processing treatment is performed on surfaces of mask layers for forming the opening portions, by which the surfaces become low wettability regions with respect to a liquid composition containing a conductive material. In the present embodiment mode, a plasma treatment is performed in a gas atmosphere containing fluorine.

A low wettability region with respect to a certain liquid is a liquid-repellent region, it repels liquid, and a droplet cannot attach to the low wettability region. A liquid composition containing a conductive material does not attach to a surface of a mask layer having low wettability with respect to the composition. Even when it attaches, it is not stable, and an opening portion having relatively high wettability is filled with the composition containing a conductive material. Thus, since the opening portion having a high wettability is filled with the composition containing a conductive material, a wiring layer can be formed with good stability and controllability and material loss can be prevented. Therefore, the composition containing a conductive material discharged by a droplet discharge apparatus 169 is repelled by low wettability regions 168a, 168b, 168c, 168d, and 168e of the surfaces of the mask layers without attachment, each opening portion is filled with the composition containing a conductive material to form conductive layers 171a, 171b, 171c, and 171d (FIG. 4A). The conductive layers 171a, 171b, 171c, and 171d are solidified by drying and baking to form wiring layers 172a, 172b, 172c, and 172d. Accordingly, a multi-layered wiring having the MOS transistors 170a and 170b is manufactured (FIG. 4B).

In the present invention, a liquid composition containing a conductive material is attached to a region where a wiring is formed and solidified to form a wiring layer. The liquid composition containing a conductive material still has fluidity after filling or attaching in a liquid state, and there is a case of changing a shape of the composition when solidified later. This change in shape is affected by a portion filled with the liquid composition containing a conductive material as a fluid, baking temperature or time for solidifying, or the like. Therefore, when an insulating layer having pores is used as an insulating layer functioning as an interlayer film, the pores are filled with conductive particles, and the conductive particles are coagulated. The conductive layer with which the insides of the pores are filled to be solidified works as a wedge or an anchor, which enhances attachment between the conductive layer and the insulating layer and improves adhesiveness. In the embodiment mode, a center portion of a surface of the conductive layer is changed to a dented shape due to drying of a solvent when the conductive layers 162a, 162b, 162c, and 162d are solidified to form the source or drain electrode layers 163a, 163b, 163c, and 163d. However, the shape can be varied depending on a manufacturing condition such as a shape or size of a particle of a conductive material, characteristics of a material such as a solvent, temperature or time for forming. On the other hand, a surface of a wiring layer is almost flat when the conductive layer 171a is solidified to form the wiring layer 172a. Depending on the condition, there is a case that the surface of the wiring layer has a projection shape.

In accordance with the invention, a wiring material can be formed only in an opening portion without a step of removing an unnecessary wiring material such as CMP, and a process of forming a multi-layered wiring can be simplified. Further, since removal of the wiring material is unnecessary, efficient use of the wiring material can be achieved and cost can be reduced. A solution in which a conductive material is dissolved or dispersed in a solvent is poured into an opening portion, and the solvent is dried and the conductive material is welded by a heat treatment. Accordingly, the conductive material is formed. Because a solution is used, it is easily embedded in a connecting hole, and a highly reliable wiring structure without a void or the like can be manufactured. By using such a wiring structure, a highly reliable semiconductor device can be manufactured with a high yield and at low cost.

Embodiment Mode 3

Figure 25A:
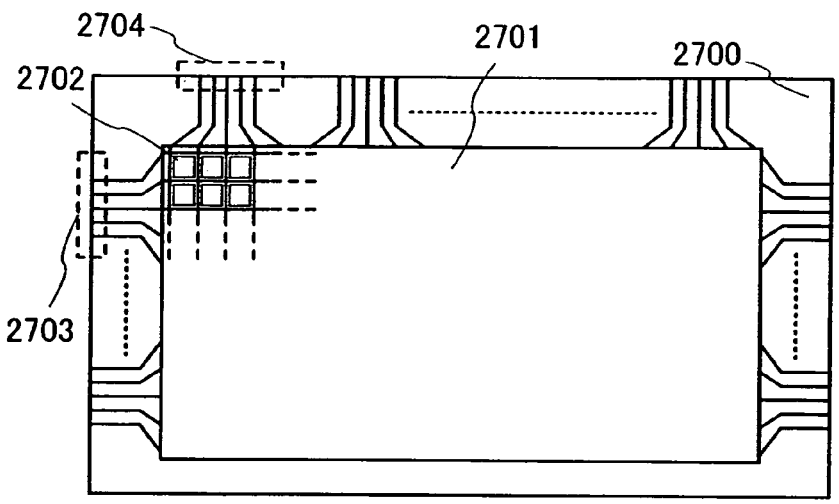
FIGS. 25A to 25C are top views showing display devices using the present invention.

FIG. 25A is a top view showing a structure of a display panel using the present invention. A pixel portion 2701 in which pixels 2702 are arranged in matrix, a scanning line input terminal 2703, and a signal line input terminal 2704 are formed over a substrate 2700 having an insulating surface.

The number of the pixels may be determined in accordance with various standards. In the case of XGA and an RGB full color display, the number of the pixels may be 1024×768×3 (RGB). Similarly, in the case of UXGA and an RGB full color display, the number of the pixels may be 1600×1200×3 (RGB), and in the case of a full-spec high vision and an RGB full color display, it may be 1920×1080×3 (RGB).

The pixels 2702 are formed in matrix at intersections of scanning lines extended from the scanning line input terminal 2703 and signal lines extended from the signal line input terminal 2704. Each pixel 2702 is provided with a switching element and a pixel electrode connected thereto. A typical example of the switching element is a TFT. The gate electrode of the TFT is connected to the scanning line, and the source or drain of the TFT is connected to the signal line, which enables each pixel to be independently controlled by a signal inputted from the outside.

Figure 22A:
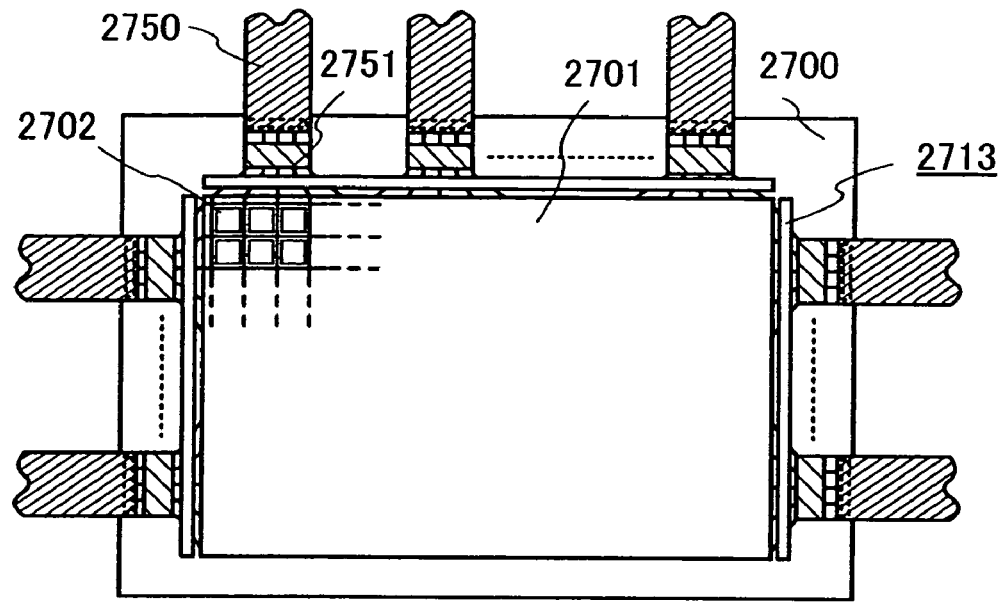
FIGS. 22A and 22B are top views showing a display device using the present invention.
Figure 22B:
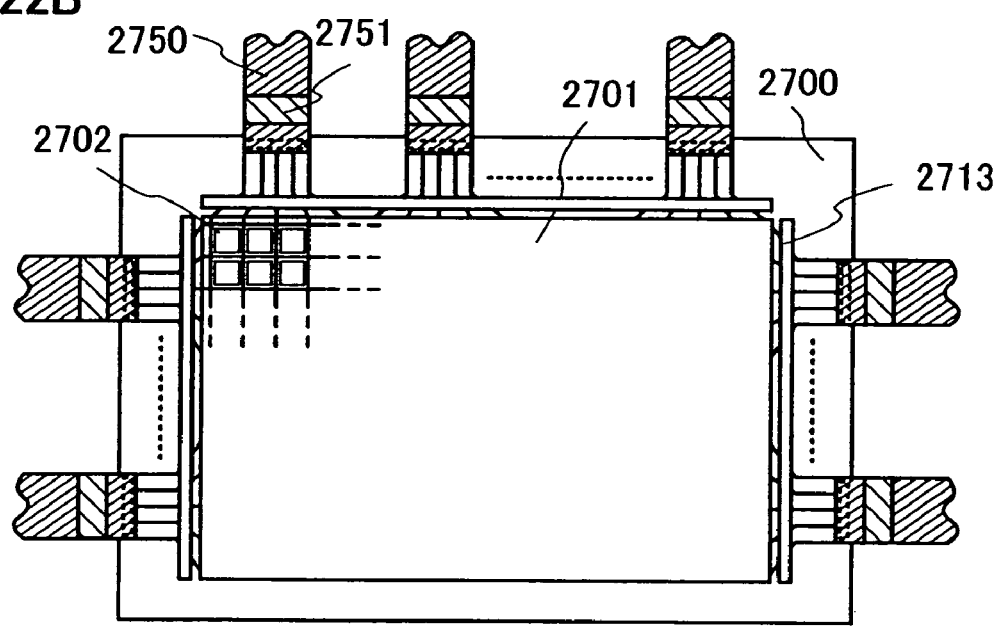

FIG. 25A shows a structure of a display panel in which a signal to be input to a scanning line and a signal line is controlled by an external driver circuit. Alternatively, a driver IC 2751 may be mounted on a substrate 2700 by COG (Chip on Glass) as shown in FIG. 22A. As another mounting mode, TAB (Tape Automated Bonding) may also be used as shown in FIG. 22B. The driver IC may be formed over a single crystal semiconductor substrate or may be formed of a TFT over a glass substrate. In FIGS. 22A and 22B, the driver IC 2751 is connected to an FPC (Flexible Printed Circuit) 2750.

Figure 25B:
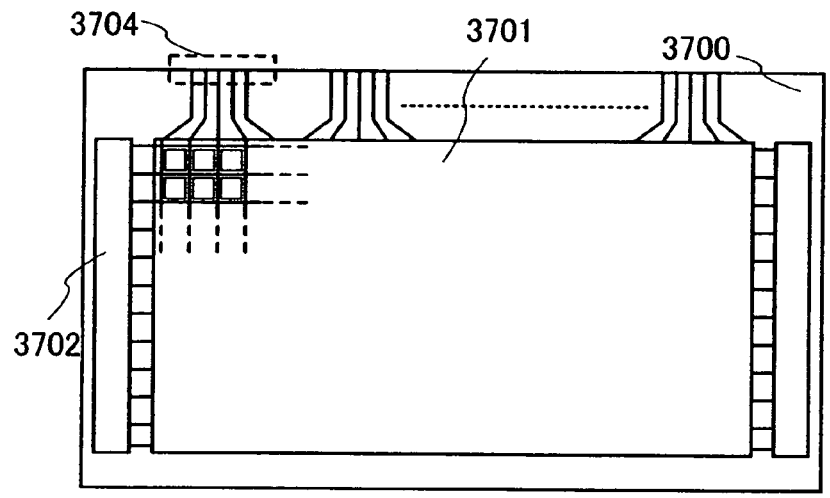
Figure 25C:
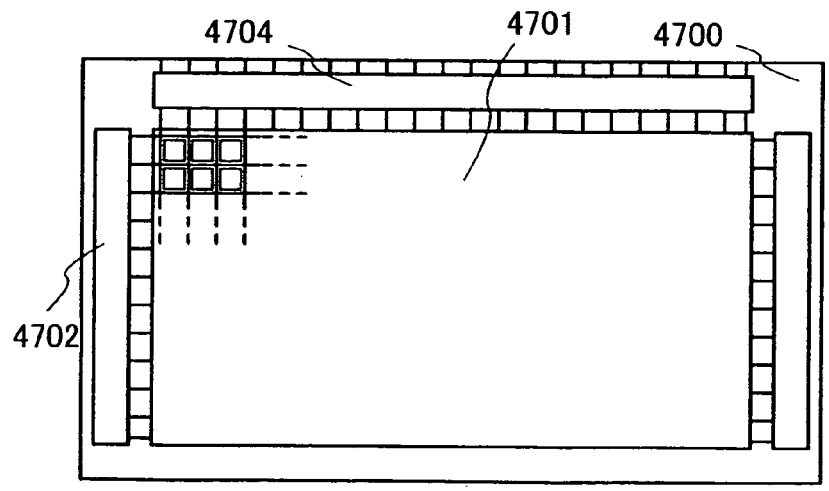

When a TFT provided in a pixel is formed of a polycrystalline or microcrystalline semiconductor, a scanning line driver circuit 3702 can be integrated with a substrate 3700 as shown in FIG. 25B. In FIG. 22B, reference numeral 2701 denotes a pixel portion, and a signal line driver circuit is controlled by an external driver circuit in the same manner as in FIG. 25A. As well as the TFT formed in the present invention, when the TFT provided in a pixel is formed by using a polycrystalline (microcrystalline) semiconductor, a single crystal semiconductor, or the like having high electron mobility, a scanning line driver circuit 4702 and a signal line driver circuit 4704 can be integrated with a glass substrate 4700 as shown in FIG. 25C. Note that reference numeral 4701 denotes a pixel portion in FIG. 25C.

Figure 5:
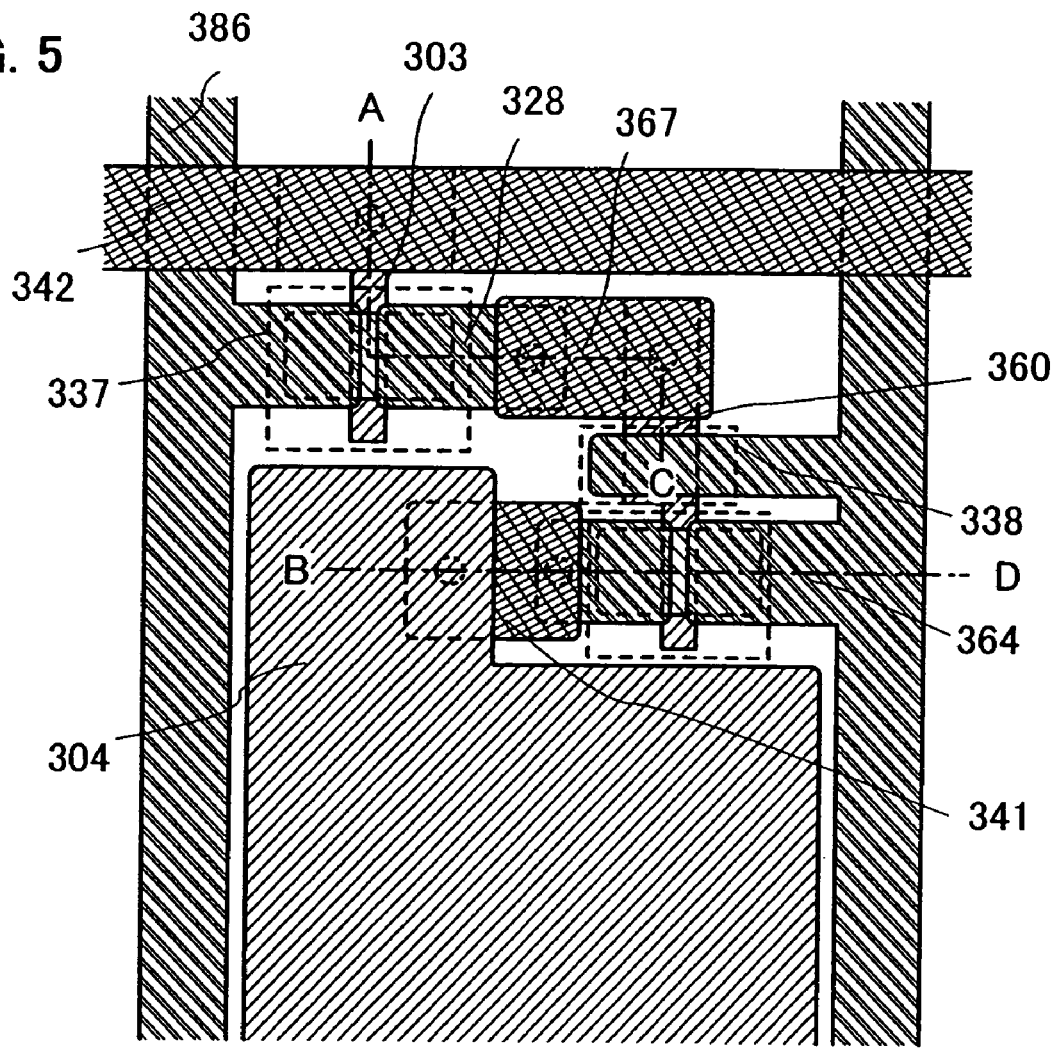
FIG. 5 shows a display device using the present invention.

FIG. 5 is a top view of a pixel region of a display device manufactured in the present embodiment mode. FIGS. 6A to 9B and FIG. 10B are sectional views in each step, taken along lines A-C and B-D in FIG. 5. Regions I-J in FIGS. 6A to 9B show sections taken along a line I-J in FIG. 10A, which is a peripheral driver circuit region of the display device.

A glass substrate made of barium borosilicate glass; alumino borosilicate glass, or the like; a quartz substrate; a metal substrate; or a plastic substrate which can withstand the process temperature of the manufacturing process is used as a substrate 300. A surface of the substrate 300 may be polished by CMP or the like to be planarized. In addition, an insulating layer may be formed over the substrate 300. The insulating layer is formed of a single layer or a lamination layer of an oxide material or a nitride material containing silicon by a known method such as CVD, sputtering, or spin coating. Although the insulating layer is not necessarily formed, it has an effect of blocking contaminants or the like from the substrate 300.

A conductive film is formed over the substrate 300 and processed into a desired shape using a mask made of a resist to form gate electrode layers 301, 302, 303, 360a, and 360b. The gate electrode layers 301, 302, 303, 360a, and 360b can be formed by CVD, sputtering, a droplet discharge method, or the like. The gate electrode layers 301, 302, 303, 360a, and 360b may be formed from an element selected from Ag, Au, Ni, Pt, Pd, Ir, Rh, Ta, W, Ti, Mo, Al, and Cu, an alloy material or a compound material containing the element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (WN) film and a molybdenum (Mo) film or a three-layer structure in which a tungsten film having a thickness of 50 nm, an alloy (Al—Si) film of aluminum and silicon having a thickness of 500 nm, and a titanium nitride film having a thickness of 30 nm are laminated in order may be used. Further, in the case of the three-layer structure, tungsten nitride may be used instead of the tungsten of the first conductive film, an alloy. (Al—Ti) film of aluminum and titanium may be used instead of the alloy (Al—Si) film of aluminum and silicon of the second conductive film, and a titanium film may be used instead of the titanium nitride film of the third conductive film.

In the case where the gate electrode layers 301, 302, 303, 360a, and 360b are required to be processed into certain shapes, they may be processed into a desired shape by dry etching or wet etching after forming a mask. The electrode layers can be etched to a tapered shape by ICP (Inductively Coupled Plasma) etching appropriately controlling the etching condition (the amount of electric power applied to a coiled electrode, the amount of electric power applied to an electrode of a substrate side, the temperature of the electrode of the substrate side, or the like). Note that a chlorine-based gas typified by $Cl_2$, $BCl_3$, $SiCl_4$, $CCl_4$ or the like; a fluorine-based gas typified by $CF_4$, $SF_6$, $NF_3$, or the like; or $O_2$ can be appropriately used for the etching gas.

A mask for processing into a desired shape can be formed by selectively discharging a composition. When the mask is selectively formed in such a way, it becomes possible to simplify the step of processing a shape of the mask. A resin material such as an epoxy resin, a phenol resin, a novolac resin, an acrylic resin, a melamine resin, or an urethane resin is used for the mask. In addition, the mask may be formed by a droplet discharge method using an organic material such as benzocyclobutene, parylene, fluorinated-arylene-ether, or permeable polyimide; a compound material made by the polymerization of a siloxane-based polymer or the like; a composition material containing a water-soluble homopolymer and a water-soluble copolymer; or the like. Alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. In using whichever material, the surface tension and the viscosity are appropriately controlled by arranging the concentration of a solvent or adding a surfactant or the like.

In the case of forming a mask layer for processing into a desired shape by a droplet discharge method in the embodiment mode, a treatment of forming a region having different wettability at the periphery of a formation region may be performed as a pretreatment. In the present invention, when a component such as a conductive layer or an insulating layer is formed by discharging a droplet with a droplet discharge method, a shape of the component can be controlled by forming a low-wettability region and a high-wettability region with respect to a forming material in a formation region of the component. By performing this treatment on the formation region, a difference of wettability is generated in the formation region, a droplet stays only in a high-wettability formation region, and the substance to be formed can be formed into a desired pattern with good controllability. In the case of using a liquid material, this step is applicable as a pretreatment of forming various components (an insulating layer, a conductive layer, a mask layer, a wiring layer, or the like).

A gate insulating layer is formed over the gate electrode layers 301, 302, 303, 360a, and 360b, and an amorphous semiconductor film 306 is formed over the gate insulating layer in order to form a semiconductor layer.

The gate insulating layer may be formed by using a material such as a silicon oxide material or a silicon nitride material and be a single layer or a lamination layer. Alternatively, the gate insulating layer may have a single layer of a silicon oxynitride film or a plurality of layers of silicon oxynitride and the material above. Preferably, a dense silicon nitride film is used. When using the conductive layers made from silver, copper or the like by a droplet discharge method, diffusion of an impurity is prevented and surfaces of the conductive layers are planarized by forming a silicon nitride film or an NiB film thereover as a barrier film. In order to form a dense insulating film with less gate leakage current at a low temperature, a reactive gas containing a rare gas element such as argon may be used to mix the rare gas element into the insulating film to be formed.

A semiconductor layer having one conductivity type may be formed as necessary. An NMOS structure of an n-channel TFT provided with an n-type semiconductor layer, a PMOS structure of a p-channel TFT provided with a p-type semiconductor layer, and a CMOS structure of an n-channel TFT and a p-channel TFT can be manufactured. An n-channel TFT or a p-channel TFT can be formed by making an impurity region into a semiconductor layer by adding an element which imparts conductivity by doping to impart conductivity. The conductivity may be imparted to a semiconductor layer by a plasma treatment using a $PH_3$ gas instead of forming the n-type semiconductor layer.

An amorphous semiconductor (hereinafter also referred to as an "AS") manufactured by a vapor phase growth method or sputtering using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a known method (sputtering, LPCVD, plasma CVD, or the like).

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of 0.5 nm to 20 nm can be observed in at least a part of the film. When silicon is contained as the main component, a Raman spectrum is shifted to a lower wavenumber than 520 $cm^{-1}$. A diffraction peak of (111) or (220) to be caused by a silicon crystal lattice is observed in X-ray diffraction. Hydrogen or halogen of at least 1 atomic % or more is contained to terminate a dangling bond. The SAS is formed by glow discharge decomposition (plasma CVD) of a silicide gas. $SiH_4$ is used as a typical silicide gas. Alternatively, $Si_2H_6$, $SiH_2Cl_2$, $SiHCl_3$; $SiC_4$, $SiF_4$, or the like can also be used as the silicide gas. Further, $F_2$ or $GeF_4$ may be mixed. This silicide gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can still be formed at a temperature from 100° C. to 200° C. It is desirable that an atmospheric constituent impurity such as oxygen, nitrogen, or carbon is $1\times10^{20}$ $cm^{-3}$ or less as an impurity element taken in the film forming step; specifically, the oxygen concentration is $5\times10^{19}$ $cm^{-3}$ or less, preferably $1\times10^{19}$ $cm^{-3}$ or less. A preferable SAS can be obtained by further promoting lattice distortion by adding a rare gas element such as helium, argon, krypton or neon to enhance stability. Additionally, as a semiconductor layer, a SAS layer formed using a hydrogen-based gas may be formed over a SAS layer formed using a fluorine-based gas.

An amorphous semiconductor is typified by hydrogenated amorphous silicon, and a crystalline semiconductor is typified by polysilicon. Polysilicon (polycrystalline silicon) includes a high-temperature polysilicon which contains polysilicon that is formed under a process temperature of 800° C. or more as the main component, a low-temperature polysilicon which contains polysilicon that is formed under a process temperature of 600° C. or less as the main component, and a polysilicon which is crystallized by adding an element which promotes crystallization or the like. Naturally, as described above, a semiamorphous semiconductor layer or a semiconductor which includes a crystalline phase in a portion of a semiconductor layer may be used.

In the case where a crystalline semiconductor layer is used as the semiconductor layer, a known method (a laser crystallization method, a thermal crystallization method, a thermal crystallization method using an element promoting crystallization such as nickel, or the like) may be employed as a method of manufacturing the crystalline semiconductor layer. A microcrystalline semiconductor, which is a SAS, can be crystallized by being irradiated with laser light to improve the crystallinity. In the case where an element promoting crystallization is not introduced, hydrogen is released until hydrogen concentration contained in an amorphous silicon film becomes $1\times10^{20}$ atoms/$cm^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, sputtering, CVD, a plasma treatment method (including plasma CVD), an adsorption method, or a method for applying a metal salt solution can be employed. Among them, the method using a solution is simple, easy, and advantageous in terms of easy concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

Heat treatment and laser light irradiation may be combined to crystallize the amorphous semiconductor layer. Alternatively, one of the heat treatment and the laser light irradiation may be performed plural times.

In addition, a crystalline semiconductor layer may be directly formed over the substrate by a linear plasma method. Alternatively, a crystalline semiconductor layer may be selectively formed over the substrate by using the linear plasma method.

A semiconductor layer can be formed by a printing method, a spray method, a spin coating method, a droplet discharge method, or the like using an organic semiconductor material. In this case, since the above etching step is not required, the number of steps can be reduced. A low molecular weight material, a high molecular weight material, or the like is used for the organic semiconductor, and in addition, a material such as an organic pigment or a conductive high molecular weight material can be used. A π-electron conjugated high molecular weight material having a skeleton constituted by conjugated double bonds is preferably used as the organic semiconductor material used in the present invention. Typically, a soluble high molecular weight material such as polythiophene, polyfluoren, poly(3-alkylthiophene), a polythiophene derivative, or pentacene can be used.

There is a material which can be treated after the deposition of a soluble precursor to form a semiconductor layer as the organic semiconductor material applicable to the present invention. Note that polythienylenevinylene, poly(2,5-thienylenevinylene), polyacetyrene, a polyacetyrene derivative, polyallylenevinylene, or the like can be used as such an organic semiconductor material formed by using a precursor.

In converting the precursor into an organic semiconductor, a reaction catalyst such as a hydrogen chloride gas is added in addition to a heat treatment. The following can be employed as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

In this embodiment mode, a gate insulating layer 305a made of silicon nitride and a gate insulating layer 305b made of silicon oxide are laminated as the gate insulating layer. An amorphous semiconductor film 306 is made of an amorphous silicon film. The gate insulating layers 305a and 305b and the amorphous semiconductor film 306 are continuously formed by plasma CVD only by switching the gas species. By forming such films continuously, manufacturing steps thereof can be simplified, and it can be prevented that contaminants in the atmosphere attaches to the surface or an interface of the films.

After removing an oxide film formed over the amorphous semiconductor film, an oxide film of 1 nm to 5 nm is formed by UV irradiation in an oxygen atmosphere, a thermal oxidation method, a treatment with ozone water or hydrogen peroxide containing a hydroxyl radical, or the like. In the embodiment mode, a solution containing Ni of 30 ppm is applied over the amorphous semiconductor film 306 by a spin coating method to form a metal film 307 (FIG. 6A). A solution containing the Ni elements of 10 ppm to 110 ppm (preferably, 10 ppm to 50 ppm) by weight is preferably applied by a spin coating method. As the element promoting crystallization, one or plural elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) is used to form the metal film 307. The metal film 307 is, depending on the formation conditions thereof, extremely thin, and may not necessarily be kept in the form of a film. In order to obtain the effect of promoting crystallization, it is acceptable if the metal film 307 is formed in contact with the amorphous semiconductor film 306. Then, the amorphous semiconductor film 306 is heated to form a crystalline semiconductor film 309. In this case, silicide is formed in a portion of the semiconductor film, which is in contact with the metal element for promoting crystallization of the semiconductor film, and crystallization progresses with the silicide as a crystal nucleus. Here, after the heat treatment for dehydrogenation, a heat treatment for crystallization (550° C. to 750° C. for 3 minutes to 24 hours) is performed. Alternatively, crystallization may be performed by RTA or GRTA. Here, by performing crystallization by a thermal treatment without using laser irradiation, variations in crystallinity can be decreased, while variations in TFTs to be formed later can be suppressed. In the embodiment mode, a heat treatment is performed at a temperature of 550° C. for 8 hours to form the crystalline semiconductor film 309.

The crystalline semiconductor film 309 obtained in this manner may be doped with a slight amount of impurity element (boron or phosphorus) in order to control the threshold voltage of the thin film transistor. The doping of the impurity element may be performed either before the step of crystallizing the amorphous semiconductor film or after reducing or removing the metal element in the crystalline semiconductor film 309 by the gettering step. In this embodiment mode, boron is doped by an ion doping method using excited plasma of diborane ($B_2H_6$) without being separated in mass. Note that an ion implantation method for mass separation may be performed. When the amorphous semiconductor film is doped with the impurity element, the impurity element can be activated by a later heat treatment for crystallization. In addition, defects or the like which occur in doping can be reduced.

A semiconductor film having an impurity element which imparts one conductivity type is formed over the crystalline semiconductor film. The impurity element may be an n-type impurity element, a p-type impurity element, or a rare gas element. For example, one or plural elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. The n-type semiconductor layer containing an impurity element which imparts n-type conductivity can also be formed to contain a rare gas element such as argon.

In the embodiment mode, an n-type semiconductor film 308 is formed over the crystalline semiconductor film 309 (FIG. 6B). In the embodiment mode, an amorphous silicon film containing phosphorus (P) as an impurity element imparting n-type conductivity is formed with a thickness of 100 nm by plasma CVD as the n-type semiconductor film 308. A heat treatment is performed using the n-type semiconductor film 308 as a gettering sink to getter the metal element in the crystalline semiconductor film 309 (FIG. 6C). In the embodiment mode, the thermal treatment is performed at a temperature of 550° C. for 4 hours. The metal element in the crystalline semiconductor film 309 moves in the direction of arrows as shown in FIG. 6C by the heat treatment, and then captured by the n-type semiconductor film 308. By this step, the element for promoting crystallization (nickel element in this embodiment mode) contained in the crystalline semiconductor film can be set to have a concentration which does not affect the characteristics of a device, namely the nickel concentration in the film can be set to be $1\times10^{18}/cm^3$ or less, or desirably $1\times10^{17}/cm^3$ or less. Therefore, the crystalline semiconductor film 309 becomes a crystalline semiconductor film 310 in which the metal element is reduced, and the n-type semiconductor film 308 becomes an n-type semiconductor film 311 containing the impurity element imparting n-type conductivity (P, in this embodiment mode) and the metal element (Ni, in this embodiment mode). In addition, the n-type semiconductor film 308, to which the metal element after gettering has moved, might also be crystallized by the heat treatment in some cases. Note that in this embodiment mode, the impurity element imparting n-type conductivity. (donor element) in the n-type semiconductor film 308 is activated along with the gettering step.

As the semiconductor film having one conductivity type, two-layered semiconductor films each having different impurity concentration, which are a semiconductor film containing an impurity element at low concentration and a semiconductor film containing the impurity element at high concentration, may be laminated in order over the crystalline semiconductor film. In this case, the semiconductor film containing the impurity element with a low concentration functions as an LDD region, and the semiconductor film containing the impurity element with a high concentration functions as a source or drain region.

The crystalline semiconductor film 310 and the n-type semiconductor film 311 are processed into desired shapes to form semiconductor layers 312, 313, 314, and 361 and n-type semiconductor layers 315, 316, 317, and 362 (FIG. 7A).

A photomask may be formed by coating the whole surface with a resist by a spin coating method or the like, or by selectively discharging a droplet by a droplet discharge method, followed by laser light exposure to obtain a mask with a fine pattern. Using the mask having the fine pattern, the semiconductor films can be processed finely and precisely into desired shapes.

In the case of forming the semiconductor films by selectively discharging compositions without exposing a mask to light, a resin material can be used, such as an epoxy resin, an acrylic resin, a phenol resin, a novolac resin, a melamine resin, and an urethane resin. Alternatively, the semiconductor films are formed by a droplet discharge method using an organic material such as benzocyclobutene, parylene, fluorinated-arylene-ether, or permeable polyimide, a compound material formed by polymerization of siloxane polymers or the like, a composition material containing water-soluble homopolymers and water-soluble copolymers, or the like. In either case, the surface tension and viscosity are appropriately controlled by controlling the concentration of a solvent or adding a surfactant or the like.

The etching process for processing into a desired shape may be performed either by plasma etching (dry etching) or wet etching; however, plasma etching is suitable for processing a large-sized substrate. As an etching gas, a fluorine-based gas such as $CF_4$, $NF_3$, $SF_6$, or $CHF_3$, a chlorine-based gas such as $Cl_2$, $BCl_3$, $SiC_4$, or $CCl_4$, or an $O_2$ gas is employed, to which an inert gas such as He or Ar may be appropriately added. Alternatively, electric discharge machining may be performed locally when the etching process is performed using atmospheric pressure discharge, in which case a mask layer is not required to be formed over the whole surface.

Next, a mask layer 318a covering the semiconductor layer 312 and the n-type semiconductor layer 315, a mask layer 318b covering channel formation regions of the semiconductor layer 313 and the n-type semiconductor layer 316, a mask layer 318c covering the semiconductor layer 314 and the n-type semiconductor layer 317, and a mask layer 318d covering the semiconductor layer 361 and the n-type semiconductor layer 362 are formed. An impurity element 319 imparting p-type conductivity is added to form a p-type impurity regions 320a and 320b in the n-type semiconductor layer 316 (FIG. 7B). In the present embodiment mode, the impurity element-imparting p-type conductivity (boron (B), in this embodiment mode) is added by an ion doping method. Thereafter, a heat treatment is performed at a temperature of 550° C. for 4 hours to activate the region doped with the impurity element.

In this embodiment mode, a CMOS structure is used in a driver circuit region so as to function as an inverter. In the case of using only a PMOS or NMOS structure, gate electrode layers of a part of TFTs are connected to a source or drain electrode layer thereof. By connecting the source or drain electrode layer 327b to the gate electrode layer 302, thin film transistors 335 and 336 which are formed later can jointly function as an inverter even when both of them are NMOS transistors or PMOS transistors. As set forth above, in this embodiment mode, the thin film transistors 335 and 336 constitute the CMOS structure; therefore, they can jointly function as art inverter without having the above structure.

After removing the mask layers 318a, 318b, 318c, and 318d, conductive layers 321, 322, and 363 are formed over the n-type semiconductor layers 315, 316, 317, and 362. In this embodiment mode, the conductive layers 321, 322, and 363 are selectively formed by a droplet discharge method, thereby material loss is reduced. As the conductive material, silver (Ag) is used, and a composition containing Ag is discharged from droplet discharge apparatuses 380a, 380b, and 380c, which is then baked at 300° C. to form the conductive layers 321, 322, and 363 (FIG. 7C). In addition, in the same step, a conductive layer 370 to be a source or drain electrode layer, which also forms a capacitor element, is formed over the gate insulating layer 305b over the gate electrode layer 360a.

As the conductive material for forming the conductive layers 321, 322, 363, and 370 to be source or drain electrode layers, a composition containing a metal particle such as Ag (silver), Au (gold), Cu (copper), W (tungsten), or Al (aluminum) as a main component can be used. Further, indium tin oxide (ITO), ITSO composed of indium tin oxide and silicon oxide, organic indium, organotin, zinc oxide, or titanium nitride which has a light-transmitting property may be combined.

The conductive layers 321, 322, 363, and 370 are processed into desired shapes to form source or drain electrode layers 327a, 327b, 327c, 328, 366a, 366b, and 366c. In the same step, a source or drain electrode layer 386 is also formed (FIG. 5). By using the source or drain electrode layers 327a, 327b, 327c, 328, 366a, and 366b as masks, the semiconductor layers 312, 313, 314, and 361 and the n-type semiconductor layers 315, 316, 317, and 362 are etched to form semiconductor layers 371, 372, 373, and 375, n-type semiconductor layers 324a, 324b, 326, 365a, and 365b, and p-type semiconductor layers 325a and 325b. The etching may be performed by dry etching or wet etching. In this embodiment mode, dry etching is used.

Through the aforementioned steps, the n-channel thin film transistor 335 and the p-channel thin film transistor 336 which constitute the CMOS, n-channel thin film transistors 337 and 364, and a capacitor element 338 can be formed. This embodiment mode employs a CMOS structure; however, the invention is not limited thereto, and a PMOS or NMOS structure may be employed as well.

An insulating film 330 functioning as a passivation film is formed. In this embodiment mode, the insulating film 330 is formed of laminated films of a silicon oxide film having a thickness of 150 nm and a silicon nitride film having a thickness of 200 nm, which are formed in this order from a side where the insulating film 330 is in contact with the semiconductor layer. The insulating film 330 may be formed of another film containing silicon. For example, instead of using the silicon oxide film, a silicon oxynitride film may be used and laminated with the silicon nitride film.

The insulating film 330 is formed to contain hydrogen, and a heat treatment is performed at a temperature of 300° C. to 500° C. in a nitrogen atmosphere in order to hydrogenate the semiconductor layers.

Insulating layers 339 and 381 are formed over the insulating film 330 (FIG. 8A). In this embodiment mode, the insulating layer 381 is formed of a silicon oxide film containing an alkyl group using a slit coater. In the embodiment mode, although not shown here, the insulating layer 339 is formed by laminating a silicon oxide film containing an alkyl group and a silicon nitride film in order from the substrate 300 side. The upper silicon nitride film functions as an etching stopper film when the insulating layer 381 is processed into a desired shape. This etching stopper film is not necessarily required when the laminated insulating layers 339 and 381 have a high etching selection ratio.

An opening portion 340b reaching the source or drain electrode layer 328 and an opening portion 340d reaching the source or drain electrode layer 366b in the insulating layers 381, 339, and 330; and an opening portion 340a reaching the gate electrode layer 303 and an opening portion 340c reaching the gate electrode layer 360a in the insulating layers 381, 339 and 330 and the gate insulating layers 305a and 305b are formed by two-time etching as in Embodiment Mode 2 (FIG. 8B). Mask layers 382a, 382b, 382c, 382d, 382e, and 382f are used in the second etching for the opening portions formed by selectively processing the insulating layer 381.

A processing treatment is performed so that surfaces of the mask layers 382a, 382b, 382c, 382d, 382e, and 382f become low wettability regions with respect to a liquid composition containing a conductive material to be formed in the opening portions. In this embodiment mode, a C—F bond is substituted for a C—H bond over the surfaces of the mask layers by performing a plasma treatment in a gas atmosphere containing fluorine. Accordingly, surface energy of the surfaces of the mask layers is reduced. In this embodiment mode, a plasma treatment is performed in a mixed gas atmosphere of $CF_4$ and $O_2$. Since the low wettability region becomes a liquid-repellent region depending on the liquid and repels the liquid, a droplet cannot attach to the low wettability region. The liquid composition containing a conductive material does not attach to the surfaces of the mask layers having low wettability with respect to the composition. Even when it attaches, it is not stable, and it moves to an opening portion having relatively high wettability. Thus, since the opening portion is filled with the composition containing a conductive material, a wiring layer can be formed with good stability and controllability and material loss can be prevented.

Therefore, composition containing a conductive material discharged from droplet discharge apparatuses 385a, 385b, and 385c is repelled by low wettability regions 383a, 383b, 383c, 383d, 383e, and 383f on surfaces of the mask layers without attachment, and the opening portions 340a, 340b, 340c, and 340d are filled with the composition containing a conductive material to form conductive layers 384a, 384b, and 384c. The conductive layers 384a, 384b, and 384c are dried and solidified by baking at a temperature of 300° C. to form a wiring layer 341 and gate wiring layers 342 and 367. In this embodiment mode, Ag is used for the wiring layer 341 or the gate wiring layers 342 and 367.

By the above steps, the gate wiring layer 367 which electrically connects the source or drain electrode layer 328 to the gate electrode layer 360a; the wiring layer 341 which electrically connects the source or drain electrode layer 366b to a first electrode layer 304; and the gate wiring layer 342 which electrically connects to the gate electrode layer 303 are formed (FIG. 9B).

Then, a first electrode layer 304 is formed by selectively discharging a composition containing a conductive material over the wiring layer 341. When light is emitted from a substrate 100 side, the first electrode layer 304 may be formed by forming a predetermined pattern using a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), or the like, and by baking the pattern.

Preferably, the first electrode layer 304 is formed of indium tin oxide (ITO), indium tin oxide containing silicon oxide (ITSO), zinc oxide (ZnO), or the like by sputtering. It is more preferable to use indium tin oxide containing silicon oxide formed by sputtering using a target of ITO containing silicon oxide of 2% to 10% by weight. In addition, a conductive material in which ZnO is doped with gallium (Ga), or indium zinc oxide (IZO) which is an oxide conductive material containing silicon oxide and in which indium oxide is mixed with zinc oxide (ZnO) of 2% to 20% by weight may be used. After the first electrode layer 304 is formed by sputtering, a mask layer may be formed by a droplet discharge method, and the desired pattern may be formed by etching. In this embodiment mode, the first electrode layer 304 is formed of a light-transmitting conductive material by a droplet discharge method. Specifically, it is formed using indium tin oxide or ITSO made of ITO and silicon oxide.

In this embodiment mode, the first electrode layer 304 can be formed over a flat formation region. Therefore, the first electrode layer 304 can be formed with high planarity and good coverage since a polishing treatment such as CMP can be carried out sufficiently. In addition, an insulating layer to be an interlayer insulating layer may be further formed over the wiring layer 341, and the first electrode layer 304 may be electrically connected to the source or drain electrode layer 366b through a wiring layer.

In the case of having a structure in which generated light is emitted to a side opposite to the substrate 100 side or when a top emission type EL display panel is manufactured, a composition which mainly contains metal particles of Ag (silver), Au (gold), Cu (copper), W (tungsten), Al (aluminum), or the like as a main component can be used. Alternatively, the first electrode layer 304 may be formed by forming a transparent conductive film or a light reflective conductive film by sputtering, forming a mask pattern by a droplet discharge method, and then combining with etching processing.

The first electrode layer 304 may be polished by CMP or by cleaning with a polyvinyl alcohol-based porous body so that a surface of the first electrode layer 304 is planarized. In addition, after polishing by CMP, ultraviolet irradiation, an oxygen plasma treatment, or the like may be performed on the surface of the first electrode layer 304.

By the above steps, a TFT substrate for a display panel, in which a bottom gate type TFT is connected to the first electrode layer over the substrate 300, is completed. The TFT in this embodiment mode is an inverted staggered type.

Subsequently, an insulating layer (also referred to as a partition wall or a bank) 343 is selectively formed. The insulating layer 343 is formed to have an opening portion over the first electrode layer 304. In this embodiment mode, the insulating layer 343 is formed over the entire surface, and etched and processed into a desired shape by using a mask layer of a resist or the like. When the insulating layer 343 is formed by a droplet discharge method or a printing method by which the insulating layer 343 can be formed directly and selectively, processing using etching is not necessarily required. The insulating layer 343 can also be formed to have a desired shape by a pretreatment of the present invention.

The insulating layer 343 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant high molecular weight material such as polyimide, aromatic polyamide, or polybenzimidazole;

inorganic siloxane which is formed from the siloxane-based material as a starting material and contains a Si—O—Si bond among a compound including silicon, oxygen and hydrogen; or an organic siloxane-based insulating material in which an organic group such as methyl or phenyl is substituted for hydrogen bonded with silicon. The insulating layer 343 may also be formed by using a photosensitive material or a non-photosensitive material such as acrylic or polyimide. The insulating layer 343 preferably has a shape in which a curvature radius changes continuously. Accordingly, the coverage of an electroluminescent layer 344 and a second electrode layer 345 which are formed over the insulating layer 343 is improved.

After forming the insulating layer 343 by discharging a composition by a droplet discharge method, a surface of the insulating layer 343 may be pressed with pressure to be planarized in order to improve its planarity. As a pressing method, an asperity may be smoothed by moving a roller-shaped object over the surface, or the surface may be perpendicularly pressed with a flat plate-shaped object. Alternatively, the asperity portion on the surface may be eliminated with an air knife after softening or melting the surface with a solvent or the like. CMP may be also used for polishing the surface. This step may be applied for planarizing a surface when an asperity are caused by a droplet discharge method. When the planarity is improved through the step, display unevenness or the like of the display panel can be prevented; therefore, a high-definition image can be displayed.

The electroluminescent layer 344 and the second electrode layer 345 are formed to be laminated over the first electrode layer 304. Although it is not shown, it is effective to provide a passivation film so as to cover the second electrode layer 345. The passivation film which is provided at the time of forming a display device may have a single layer structure or a multi-layered structure. As the passivation film, a single layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond like carbon (DLC), or a nitrogen-containing carbon film ($CN_x$), or a laminate in which the insulating films are combined can be used. For example, a laminate of a nitrogen-containing carbon film ($CN_x$) and silicon nitride (SiN) can be used. Alternatively, an organic material may be used, for example, a laminate of high molecular weight material such as a styrene polymer. Further, a material which has a skeleton formed by a bond of silicon (Si) and oxygen (O), and which includes at least hydrogen as a substituent, or at least one of fluorine, an alkyl group, and aromatic hydrocarbon as a substituent may be also used.

At this time, it is preferable to use a film having good coverage for the passivation film. A carbon film, especially a DLC film, is effective. The DLC film can be formed at a temperature ranging from room temperature to 100° C.; therefore, the DLC film can be easily formed over an electroluminescent layer having low heat resistance. The DLC film can be formed by plasma CVD (typically, RF plasma CVD, microwave CVD, electron cyclotron resonance (ECR) CVD, heat filament CVD, or the like), a combustion flame method, sputtering, an ion beam deposition method, a laser deposition method, or the like. A hydrogen gas and a hydrocarbon-based gas (for example, $CH_4$, $C_2H_2$, $C_6H_6$, or the like) are used as a reaction gas which is used for forming the passivation film. The reaction gas is ionized by glow discharge, and the ions are accelerated to collide with a cathode with negative self bias; accordingly, the passivation film is formed. A CN film may be formed by using a $C_2H_4$ gas and an $N_2$ gas as the reaction gas. The DLC film has a high blocking effect on oxygen and can suppress the oxidation of the electroluminescent layer. Accordingly, the electroluminescent layer can be prevented from oxidizing during the subsequent sealing step.

Then, a filling agent 346 is encapsulated using a sealing substrate 347. Instead of the filling agent 346, the space may be filled with an inert gas such as nitrogen. In addition, by providing a drying agent in the display device, deterioration of a light emitting element due to moisture can be prevented. The position of the drying agent may be either on the sealing substrate 347 side or on the substrate 300 side over which elements are formed. Alternatively, the drying agent may be provided in a depression portion formed in the substrate, which is also the region provided with a sealant 348. When the drying agent is provided in an area which does not contribute to displaying such as a driver circuit region of the sealing substrate 347 or a wiring region, the aperture ratio is not decreased even when the drying agent is opaque (not having a light transmitting property with respect to the visible light). Alternatively, the filling agent 346 may be formed to contain an absorbent material to have a function as a drying agent. Accordingly, a display device having a display function using the light emitting element is completed (FIG. 9B).

An FPC 354 is attached to a terminal electrode layer 352 for electrically connecting the inside of the display device to the outside thereof with an anisotropic conductive film 353 so as to be electrically connected to the terminal electrode layer 352.

Figure 10A:
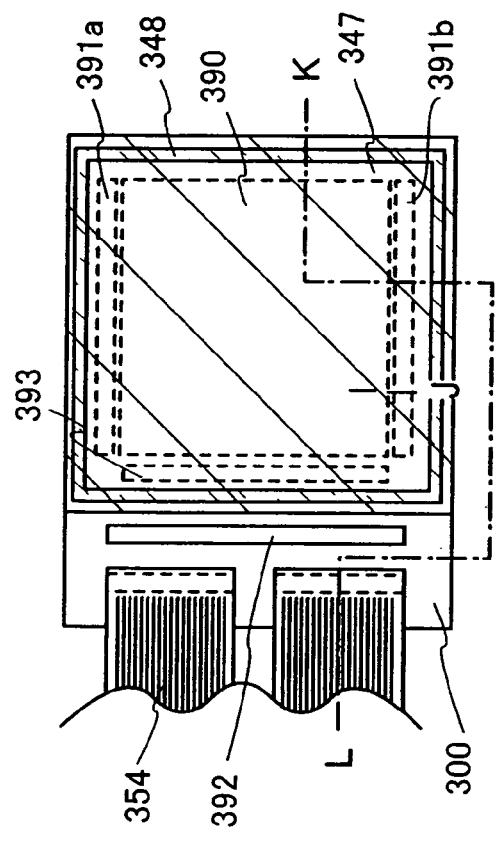
FIGS. 10A and 10B show an EL display panel using the present invention.

FIG. 10A is a top view of a display device. As shown in FIG. 10A, a pixel region 390, scanning line driver regions 391a and 391b, and a connecting region 393 are sealed between the substrate 300 and the sealing substrate 347 with the sealant 348 therebetween, and a signal line driver circuit 392 formed with a driver IC is formed over the substrate 300.

In this embodiment mode, the case where a light emitting element is sealed with a glass substrate is shown. Sealing is a treatment for protecting the light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capabilities, can be used. As for the cover material, glass, ceramics, plastics, or metal can be used. However, when light is emitted to the cover material side, the cover material needs to have light-transmitting properties. The cover material is attached to the substrate over which the above-mentioned light emitting element is formed with a sealant such as a thermosetting resin or an ultraviolet curable resin, and a sealed space is formed by curing the resin with a heat treatment or an ultraviolet irradiation treatment. It is also effective to provide an absorbent material typified by barium oxide in the sealed space. The absorbent material may be provided over the sealant or over a partition wall or a peripheral part so as not to block light emitted from the light emitting element. Further, it is also possible to fill the space between the cover material and the substrate over which the light emitting element is formed with a thermosetting resin or an ultraviolet curable resin. In this case, it is effective to add an absorbent material typified by barium oxide in the thermosetting resin or the ultraviolet curable resin.

In this embodiment mode, although a single gate structure of a switching TFT is shown, a multi-gate structure such as a double gate structure may also be employed. In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which is overlapped with a gate electrode layer, and a high concentration impurity region outside thereof.

Figure 10B:
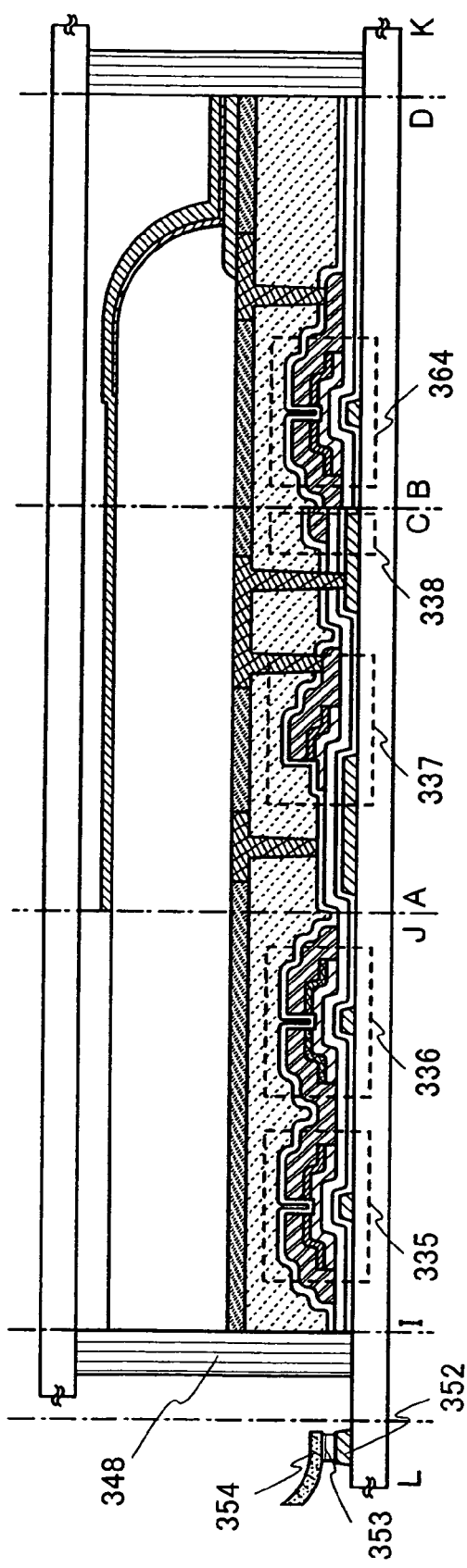

The display device of this embodiment mode shown in FIGS. 10A and 10B includes the gate electrode layers 301, 302, 303, 360a, and 360b, and the first electrode layer 304, each of which has a single-layer structure; however, the gate electrode layers may have two or more laminated layers as the above described.

Through the aforementioned steps, an inversely staggered thin film transistor having a crystalline semiconductor film can be formed. The thin film transistor in this embodiment mode is formed using a crystalline semiconductor film; therefore, it exhibits higher mobility as compared to a thin film transistor formed using an amorphous semiconductor film. The source and drain regions contain a metal element in addition to an impurity element imparting one conductivity type. Therefore, the source and drain regions having low resistivity can be formed. As a result, a display device capable of high-speed operation can be manufactured.

In addition, in comparison with a thin film transistor formed using an amorphous semiconductor film, variations of threshold voltage are hardly caused, which results in the decrease in variations of the TFT characteristics.

Further, the metal element which is mixed into the semiconductor film during the film deposition step is gettered by the gettering step; therefore, off current can be decreased. Accordingly, by using such a thin film transistor as a switching element of the display device, contrast can be enhanced.

In accordance with the present invention, a component of a display device can be formed into a desired pattern with good adhesiveness. Further, material loss and cost can be reduced. Hence, a light emitting display device with high performance and high reliability can be manufactured with a high yield.

Embodiment Mode 4

Figure 12:
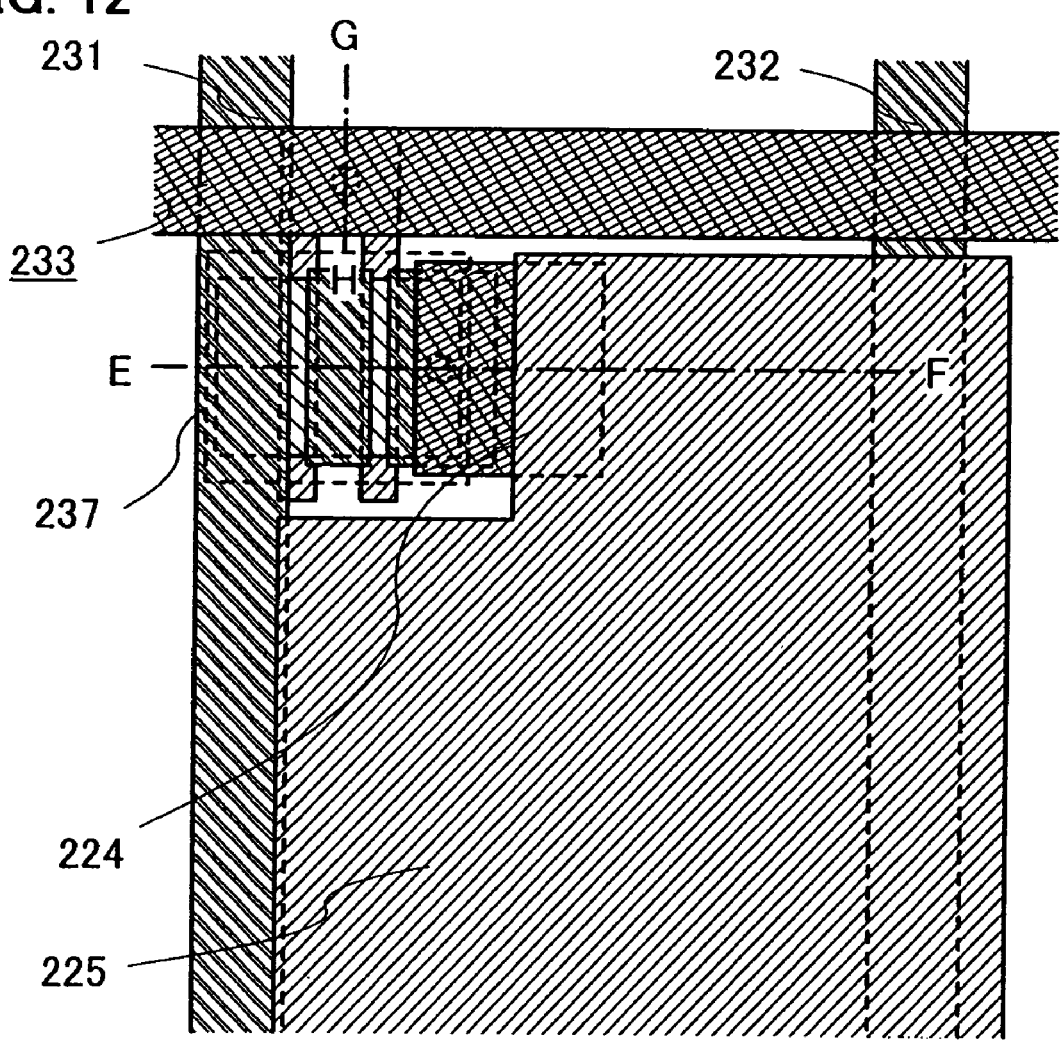
FIG. 12 shows a display device using the present invention.
Figure 13:
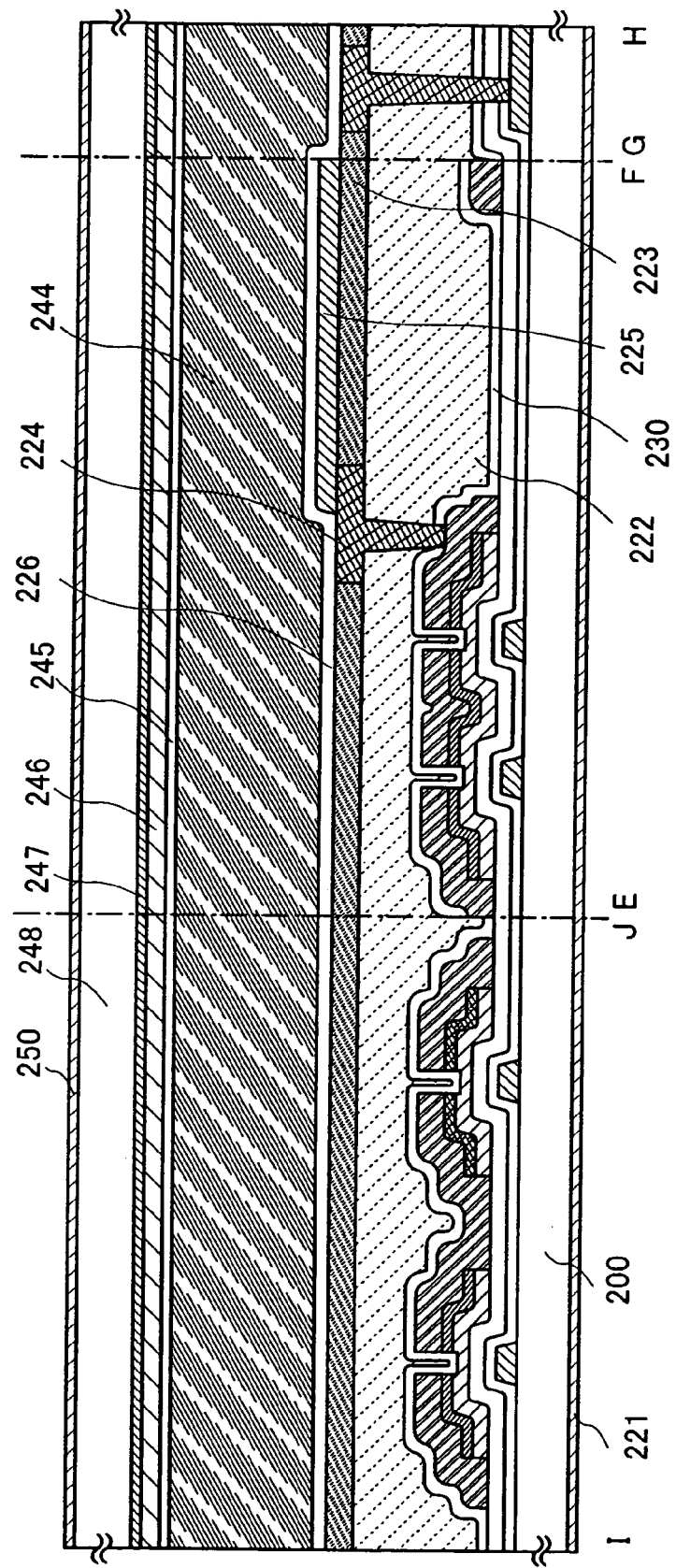
FIG. 13 shows a display device using the present invention.
Figure 14A:
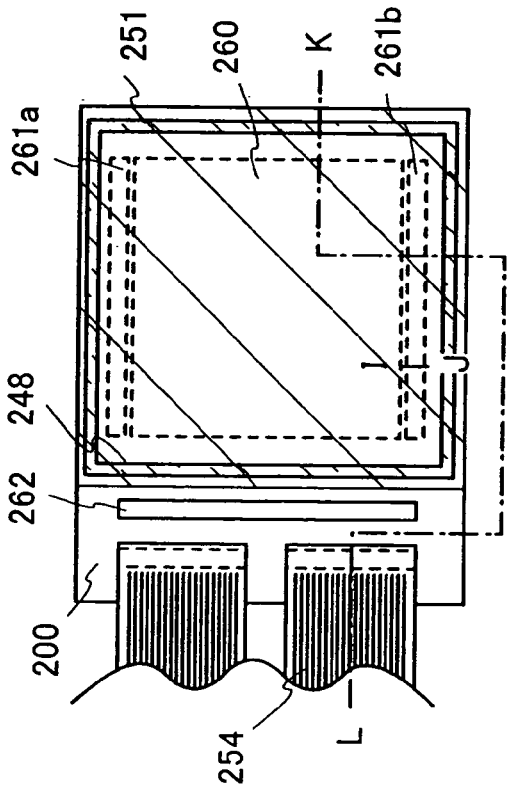
FIGS. 14A and 14B show a liquid crystal display panel using the present invention.
Figure 14B:
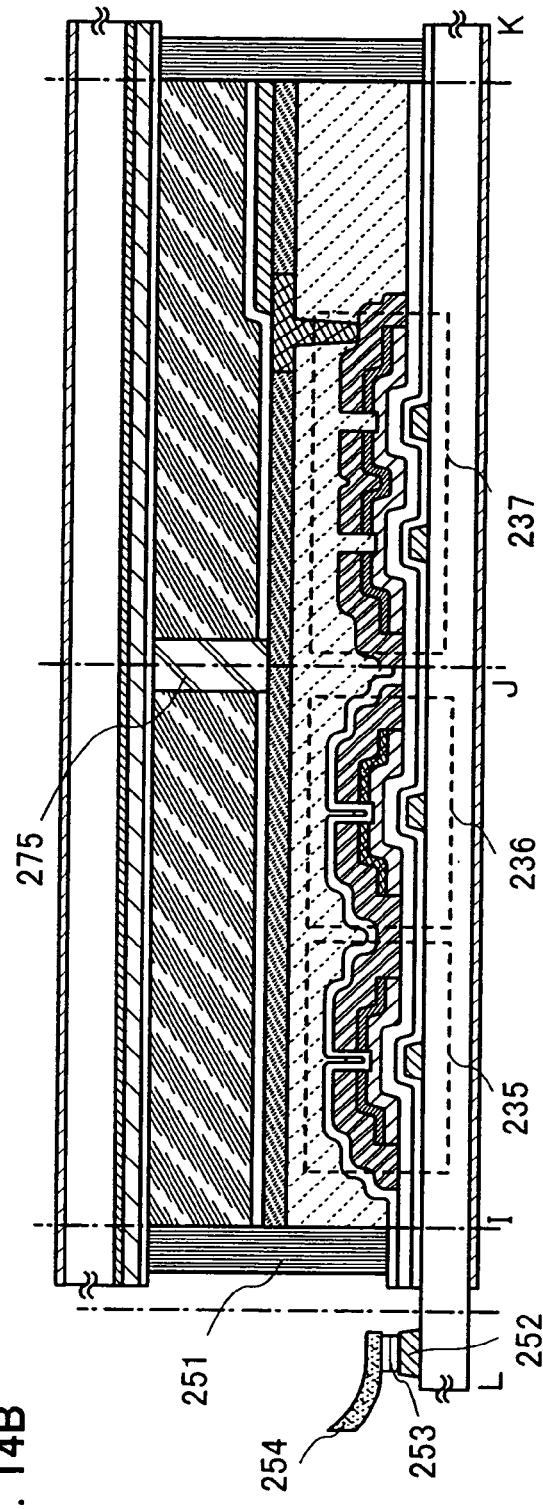

Embodiment Mode 4 of the present invention is described with reference to FIG. 12 to FIG. 14B. In more detail, a method of manufacturing a display device including the inversely staggered thin film transistor formed in Embodiment Mode 3 using the present invention is described. FIG. 12 shows a top view of a pixel portion of a display device. FIG. 13 shows a sectional view taken along lines E-F and G-H in FIG. 12 and line I-J in FIG. 14A. FIG. 14A is also a top view of a display device, and FIG. 14B shows a sectional view taken along a line O-P (including a line U-W) in FIG. 14A. In addition, an example of a liquid crystal display device using a liquid crystal material for a display element is described. Repetitive explanations of the same portion and the portion having the same function are omitted.

An n-channel thin film transistor 235 and a p-channel thin film transistor 236 which constitute the CMOS, and an n-channel thin film transistor 237 can be formed over a substrate 200 (FIG. 14B). This embodiment mode employs a CMOS structure; however, the invention is not limited thereto, and a PMOS or NMOS structure may be employed as well.

An insulating film 230 to serve as a passivation film is formed. In this embodiment mode, the insulating film 230 is formed of laminated films of a silicon oxide film having a thickness of 150 nm and a silicon nitride film having a thickness of 200 nm, which are formed in this order over the insulating film 230 in a contact with the semiconductor layer. The insulating film 230 may be formed of another film containing silicon. For example, instead of using the silicon oxide film, a silicon oxynitride film may be used and laminated with the silicon nitride film.

The insulating film 230 is formed to contain hydrogen, and a thermal treatment is performed at a temperature of 300° C. to 500° C. in a nitrogen atmosphere in order to hydrogenate the semiconductor layer.

Over the insulating film 230, insulating layers 222 and 223 are formed. In this embodiment mode, a silicon oxide film containing an alkyl group is formed using a slit coater as the insulating layer 223. In the embodiment mode, although not shown here, the insulating layer 222 is formed by laminating the silicon oxide film containing an alkyl group and a silicon nitride film in this order from a substrate 200 side. The upper silicon nitride film functions as an etching stopper film when the insulating layer 223 is processed into a desired shape. This etching stopper film is not necessarily required when the laminated insulating layers 222 and 223 have a high etching selection ratio. As described in Embodiment Mode 1, when an insulating layer having pores is used for the insulating layers 222 and 223, the inside of the pores are filled with a portion of a conductive layer formed to attach to the insulating layers. Accordingly, a wedge-like effect (anchor effect) is obtained with respect to the insulating layers, which improves adhesiveness.

An opening portion reaching a source or drain electrode layer is formed in the insulating layers 222, 223, and 230 by two-time etching as in Embodiment Mode 2. Mask layers used in the second etching for the opening portions formed by selectively processing the insulating layer 223 is formed by a substance having a fluorocarbon group. A mask layer having low surface energy can be formed by performing coating, light-exposure, and development of a resist solution doped with a surface modifier of a monomer or an oligomer having a fluorocarbon group. Since fluorocarbon has low surface energy and tends to exist on a surface, the fluorocarbon group tends to exist on a surface of the mask layer and shows lower surface energy when such a small amount as approximately 1% of fluorocarbon is added. Therefore, the surface of the mask layer becomes a low wettability region with respect to a liquid composition containing a conductive material.

Since the low wettability region becomes a liquid-repellent region depending on the liquid and repels the liquid, a droplet cannot attach to the low wettability region. The liquid composition containing a conductive material does not attach to the surface of the mask having low wettability with respect to the composition. Even when it attaches, it is not stable, and a relatively high-wettability opening portion is filled with the composition containing a conductive material. Thus, since the opening portion is filled with the composition containing a conductive material, a wiring layer can be formed with good stability and controllability and material loss can be prevented.

Therefore, the composition containing a conductive material discharged by a droplet discharge method is repelled by the low wettability region of the surface of the mask layer without attachment, and the opening portion is filled with the composition containing a conductive material. A conductive layer filling the opening portion is baked at a temperature of 300° C. to form a wiring layer 224. In the embodiment mode, Ag is used for the wiring layer.

FIG. 12 shows a top view of a pixel region of a liquid crystal display device manufactured in the present embodiment mode. A thin film transistor provided in the pixel region is multi-gate type. In the pixel region, there are a gate wiring layer 233, a pixel electrode layer 225, a thin film transistor 237, a source or drain electrode layer 231, the wiring layer 224, and a capacitor wiring layer 232.

Next, as shown in FIG. 13, an insulating layer 226 called an orientation film is formed by a printing method or a spin coating method to cover the pixel electrode layer 225. The insulating layer 226 can be selectively formed using a screen printing method or an offset printing method. Then, a rubbing treatment is performed. A sealant 251 is formed at the periphery of the region where a pixel is formed.

Subsequently, an opposite substrate 248 provided with an insulating layer 245 functioning as an orientation film, a colored layer 247 functioning as a color filter, a conductive layer 246 functioning as an opposite electrode, and a polarizing plate 250 is attached to the TFT substrate with a spacer 275 interposed therebetween. By providing a space with a liquid crystal layer 244, a liquid crystal display device can be manufactured (FIG. 13). A polarizing plate 221 is formed on an opposite side to the side of the substrate 200 having a TFT. A sealant may be mixed with a filler, and further, the opposite substrate 248 may be provided with a shielding film (black matrix) or the like. Note that a dispenser method (a dropping method) or a dip method (a pumping method) by which a liquid crystal is injected utilizing a capillary phenomenon after attaching the opposite substrate 248 can be used as a method of forming the liquid crystal layer 244.

Figure 23:
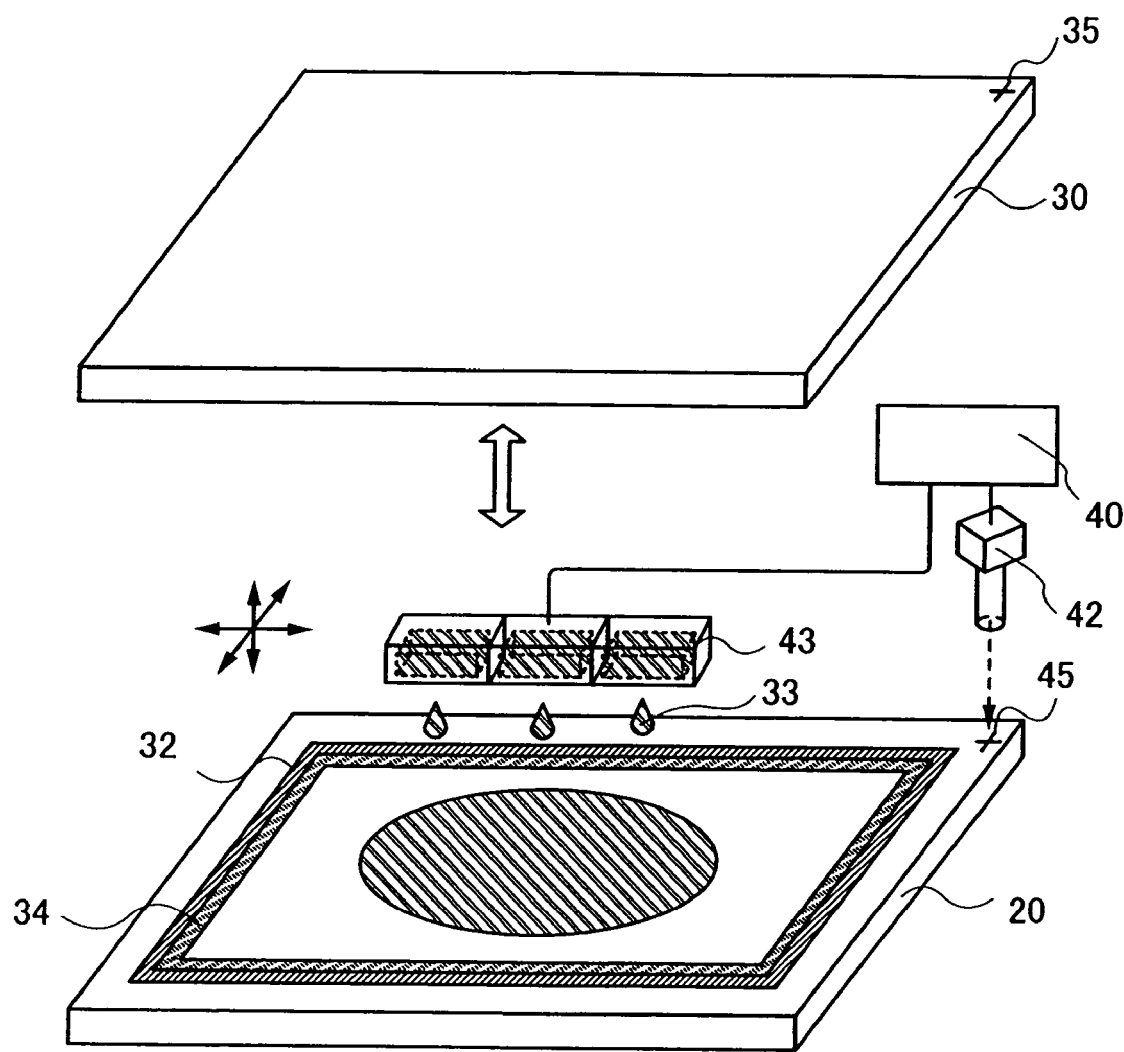
FIG. 23 shows a structure of a droplet discharge apparatus applicable to the present invention.

A liquid crystal drop injection method employing the dispenser method will be described with reference to FIG. 23. In FIG. 23, reference numeral 40 denotes a control device; 42, an imaging device; 43, a head; 33, a liquid crystal; 35 and 45, markers; 34, a barrier layer; 32, a sealant; 30, a TFT substrate; and 20, an opposite substrate. A closed loop is formed with the sealant 32, and the liquid crystal 33 is dropped once or plural times therein from the head 43. Since the head 43 has a plurality of nozzles, it can drop a large amount of liquid crystal material at one time, which improves throughput. When the liquid crystal material has high viscosity, the liquid crystal material is continuously discharged and attached to a liquid crystal formation region without a break. On the other hand, when the liquid crystal material has low viscosity, the liquid crystal material is intermittently discharged to drop a droplet. At this time, the barrier layer 34 is provided to prevent the sealant 32 and the liquid crystal 33 from reacting with each other. Subsequently, the substrates are attached in vacuum, and then, ultraviolet curing is performed to make the space filled with the liquid crystal. Alternatively a sealant may be formed on a TFT substrate side, and a liquid crystal may be dropped.

The spacer may be provided by dispersing particles of several μm; however, in this embodiment mode, the spacer is provided by forming a resin film over the entire surface of the substrate and processing it into a desired shape. After coating the substrate with such a spacer material using a spinner, the spacer material is formed into a predetermined pattern by light exposure and a developing treatment. Further, the pattern is cured by heating at a temperature of 150° C. to 200° C. with a clean oven. The spacer manufactured in this manner can have different shapes depending on the condition of the light exposure or the developing treatment. It is preferable that the spacer have a pillar shape with a flat top portion since the mechanical strength as a liquid crystal display device can be secured when the opposite substrate is attached to the substrate. The shape of the spacer is not specifically limited, and it may have a shape of a circular cone or a pyramid.

A connection portion is formed to connect the inside of the display device formed through the above steps and an external wiring substrate. The insulating layer in the connection portion is removed by an ashing treatment using an oxygen gas under atmospheric pressure or pressure close to the atmospheric pressure. This treatment is performed by using the oxygen gas and one or more gases of hydrogen, $CF_4$, $NF_3$, $H_2O$, and $CHF_3$. In this process, the ashing treatment is performed after sealing with the opposite substrate to prevent damage or destruction due to static electricity; however, the ashing treatment may be performed at any timing as long as there are few effects of static electricity. An FPC (flexible printed circuit) 254 is attached to a terminal electrode layer 252 for electrically connecting the inside of the liquid crystal display device to the outside thereof with an anisotropic conductive film 253 interposed therebetween so as to be electrically connected to the terminal electrode layer 252. The FPC 254 has a function of transmitting a signal or an electric potential from the external. Through the above-mentioned steps, a liquid crystal display device having a display function can be manufactured.

Through the aforementioned steps, an inversely staggered thin film transistor having a crystalline semiconductor film can be formed. The thin film transistor in this embodiment mode is formed using a crystalline semiconductor film; therefore, it has higher mobility as compared to a thin film transistor formed using an amorphous semiconductor film. The source and drain regions contain the metal element in addition to the impurity element imparting one conductivity type. Therefore, the source and drain regions having low resistivity can be formed. As a result, a liquid crystal display device capable of high-speed operation can be manufactured. Accordingly, a liquid crystal display device such as an OCB-mode liquid crystal display device can be manufactured, which is capable of exhibiting high-speed response and displaying images with a wide viewing angle. In addition, in comparison with a thin film transistor formed using an amorphous semiconductor film, variations in threshold are hardly caused, which results in the decrease in variations of the TFT characteristics. Further, the metal element which is mixed into the semiconductor film during the film deposition step is gettered by the gettering step; therefore, off current can be decreased. Accordingly, by using such a thin film transistor as a switching element of the liquid crystal display device, contrast can be enhanced.

FIG. 14A is a top view of a liquid crystal display device. As shown in FIG. 14A, a pixel region 260 and scanning line driver regions 261a and 261b are sealed between the substrate 200 and the opposite substrate 248 with the sealant 251, and a signal line driver circuit 262 formed with a driver IC is formed over the substrate 200. A driver circuit having thin film transistors 235 and 236 is provided in a driver region. The thin film transistor 235 is an n-channel thin film transistor, and the thin film transistor 236 is a p-channel thin film transistor, which constitute a CMOS structure.

In this embodiment mode, although a double gate structure of a switching TFT is shown, a single gate structure or multi-gate structure may also be employed. In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region or a region which is overlapped with a gate electrode layer, and a high concentration impurity region outside thereof.

As described above, the process can be simplified in this embodiment mode. Also, by forming various kinds of components (parts) directly over a substrate using a droplet discharge method, a display panel can be easily manufactured using a glass substrate of the fifth generation or later having a side of 1,000 mm or more.

In accordance with the present invention, a component of a display device can be formed into a desired pattern with good adhesiveness. Further, material loss and cost can be reduced. Hence, a liquid crystal display device With high performance and high reliability can be manufactured with a high yield.

Embodiment Mode 5

A thin film transistor can be formed using the present invention, and a display device can be formed using the thin film transistor. In addition; when a light emitting element is used and an n-channel transistor is used as a transistor which drives the light emitting element, light emitted from the light emitting element performs any one of bottom emission, top emission, and dual emission. Here, a lamination structure of the light emitting element corresponding to each emission type will be described with reference to FIGS. 16A to 16C.

Further, in this embodiment mode, channel protective thin film transistors 461, 471, and 481 using the present invention are employed. The thin film transistor 481 is provided over a light-transmitting substrate 480 and includes a gate electrode layer 493, a gate insulating film 497, a semiconductor layer 494, n-type semiconductor layers 495a and 495b, source or drain electrode layers 487a and 487b, and a channel protective layer 496. Insulating layers 498 and 499 are formed to cover the thin film transistor 481, and a wiring layer 488, which electrically connects the source or drain electrode layer 487b to a first electrode layer 484, is formed to be embedded in the insulating layers 498 and 499. In this embodiment mode, a crystalline semiconductor layer is used as the semiconductor layer, and an n-type semiconductor layer is used as a semiconductor layer having one conductivity type. Instead of forming the n-type semiconductor layer, the semiconductor layer may be provided with conductivity by a plasma treatment using a $PH_3$ gas. The semiconductor layer is not limited to this embodiment mode, and an amorphous semiconductor layer can be used as in Embodiment Mode 1. In the case of using a crystalline semiconductor layer of polysilicon or the like as in this embodiment mode, an impurity region having one conductivity type may be formed by introducing (adding) an impurity into the crystalline semiconductor layer without forming the semiconductor layer having one conductivity type. Further, an organic semiconductor of such as pentacene can be used. When an organic semiconductor is selectively formed by a droplet discharge method or the like, the step of processing into a desired shape can be simplified.

In the embodiment mode, an amorphous semiconductor layer is crystallized to form a crystalline semiconductor layer as the semiconductor layer 494. In the crystallizing step, the amorphous semiconductor layer is doped with an element (also referred to as a catalytic element or a metal element) which promotes crystallization, and a heat treatment (at a temperature of 550° C. to 750° C. for 3 minutes to 24 hours) is performed to crystallize the amorphous semiconductor layer. As the element promoting the crystallization, one or plural elements selected from iron (Fe), nickel (Ni), cobalt (Co), ruthenium (Ru), rhodium (Rh), palladium (Pd), osmium (Os), iridium (Ir), platinum (Pt); copper (Cu), and gold (Au) can be used. In this embodiment mode, nickel is used.

In order to remove the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, or a rare gas element. For example, one or plural elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, an n-type semiconductor layer containing phosphorus (P) which is an impurity element imparting n-type conductivity is formed as the semiconductor layer containing the impurity element which functions as a gettering sink. The n-type semiconductor layer is formed over the crystalline semiconductor layer containing the element which promotes crystallization, and a heat treatment (at a temperature of 550° C. to 750° C. for 3 minutes to 24 hours) is performed. The element-promoting crystallization in the crystalline semiconductor layer moves into the n-type semiconductor layer, and the element promoting crystallization in the crystalline semiconductor layer is removed or reduced to form the semiconductor layer 494. On the other hand, the n-type semiconductor layer becomes n-type semiconductor layers 495a and 495b containing the metal element which is the element promoting crystallization. The n-type semiconductor layers 495a and 495b function as gettering sinks of the semiconductor layer 494 and also function as source or drain regions directly.

In this embodiment mode, a crystallizing step and a gettering step for the semiconductor layer are performed by a plurality of heat treatments; however, the crystallizing step and gettering step can be performed by one heat treatment. In this case, a heat treatment may be performed after forming an amorphous semiconductor layer, doping with an element promoting crystallization, and forming a semiconductor layer functioning as a gettering sink.

In the embodiment mode, a gate insulating layer is formed by laminating a plurality of layers, and a gate insulating film 497 has a two-layered structure formed by laminating a silicon nitride oxide film and a silicon oxynitride film in this order from a gate electrode layer 493 side. The laminated insulating layers are preferably formed continuously at the same temperature in the same chamber by changing reaction gases while maintaining a vacuum state. When the layers are continuously laminated while maintaining the vacuum state, an interface between the laminated films can be prevented from being contaminated.

The channel protective layer 496 may be formed by a droplet discharge method using polyimide, polyvinyl alcohol, or the like. As a result, a photolithography step can be omitted. The channel protective layer may be formed from one or a plurality of an inorganic material (silicon oxide, silicon nitride, silicon oxynitride, silicon nitride oxide, or the like), a photosensitive or non-photosensitive organic material (an organic resin material) (polyimide, acrylic, polyamide, polyimide amide, a resist, benzocyclobutene, or the like), a Low k material which has a low dielectric constant, and the like; a laminate of such films; or the like. Additionally, a material which has a skeleton formed by a bond of silicon (Si) and oxygen (O), and which includes at least hydrogen as a substituent, or at least one of fluorine, an alkyl group, and aromatic hydrocarbon as a substituent, may be used. As a manufacturing method, a vapor phase growth method such as plasma CVD or thermal CVD, or sputtering can be used. A droplet discharge method or a printing method (a method of forming a pattern, such as screen printing or offset printing) can also be used. A coating film obtained by a coating method can also be used.

First, the case where light is emitted to a 480 side, in other words, the case of bottom emission, will be described with reference to FIG. 16A. In this case, the wiring layer 488, which is connected to the source or drain electrode layer 487*b* of the thin film transistor 481, is in contact with a first electrode layer 484 so as to be electrically connected. The first electrode layer 484, an electroluminescent layer 485, and a second electrode layer 486 are sequentially laminated. The substrate 480 which transmits light is required to have light-transmitting properties at least with respect to visible light. Next, the case where light is emitted to the side opposite to the substrate 460, in other words, the case of top emission, will be described with reference to FIG. 16B. The thin film transistor 461 can be formed in a similar manner to the above described thin film transistor.

A wiring layer 462 connecting to a source or drain electrode layer of the thin film transistor 461 is in contact with a first electrode layer 463 to electrically connect the source or drain electrode layer of the thin film transistor 461 and the first electrode layer 463. The first electrode layer 463, an electroluminescent layer 464, and a second electrode layer 465 are sequentially laminated. The wiring layer 462 is a reflective metal layer and reflects light, which is emitted from a light emitting element, upward as indicated by an arrow. The wiring layer 462 and the first electrode layer 463 are laminated, and therefore, when the first electrode layer 463 is formed using a light-transmitting material and transmits light therethrough, the light is reflected by the wiring layer 462 and is then emitted to the opposite direction of the substrate 460. Naturally, the first electrode layer 463 may be formed using a reflective metal layer. Since light generated in the light emitting element is emitted through the second electrode layer 465, the second electrode layer 465 is formed using a material having light transmitting properties with respect to visible light at least. When an insulating layer having pores is used for the insulating layers 498 and 499, the wiring layer is formed to fill the pores with a portion of the wiring layer. Accordingly, the wiring layer with good adhesiveness can be formed. Therefore, a display device having high reliability can be obtained. In the case of the top emission type display device as shown in FIG. 16B, since the light emitted from the light emitting element does not pass through the insulating layers 498 and 499, it is desirable that light extraction efficiency or the like does not need to be considered even when the insulating layer having pores is used as the insulating layers 498 and 499.

Lastly, the case where light is emitted through both a substrate 470 side and an opposite side, in other words, the case of dual emission, is described with reference to FIG. 16C. The thin film transistor 471 is also a channel protective thin film transistor. A wiring layer 475 electrically connecting to a semiconductor layer of the thin film transistor 471 is electrically connected to a first electrode layer 472. The first electrode layer 472, an electroluminescent layer 473, and a second electrode layer 474 are sequentially laminated. When the first electrode layer 472 and the second electrode layer 474 are formed using a material having light transmitting properties with respect to visible light or formed to have such thicknesses that can transmit light, the dual emission is realized. In this case, an insulating layer and the substrate 470 through which light passes are also necessarily formed to have light transmitting properties at least with respect to visible light.

Structures of light emitting elements that can be applied to the present embodiment mode are shown in FIGS. 18A to 18D. Each light emitting element has a structure in which an electroluminescent layer 860 is interposed between a first electrode layer 870 and a second electrode layer 850. It is necessary to select materials for the first and second electrode layers in consideration of a work function. Each of the first and second electrode layers can serve as either an anode or a cathode depending on a pixel structure. In this embodiment mode, it is preferable that the first electrode layer serve as a cathode and the second electrode layer serve as an anode, since a polarity of a driving TFT is an n-channel type. In addition, when the polarity of the driving TFT is a p-channel type, it is preferable that the first electrode layer serve as an anode and the second electrode layer serve as a cathode.

Figure 18A:
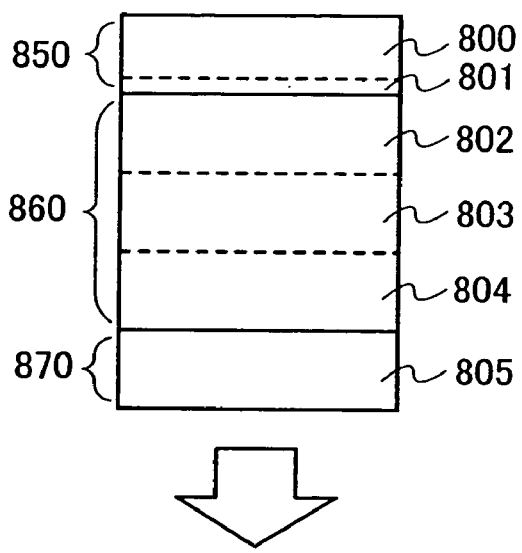
FIGS. 18A to 18D show structures of light emitting elements applicable to the present invention.
Figure 18B:
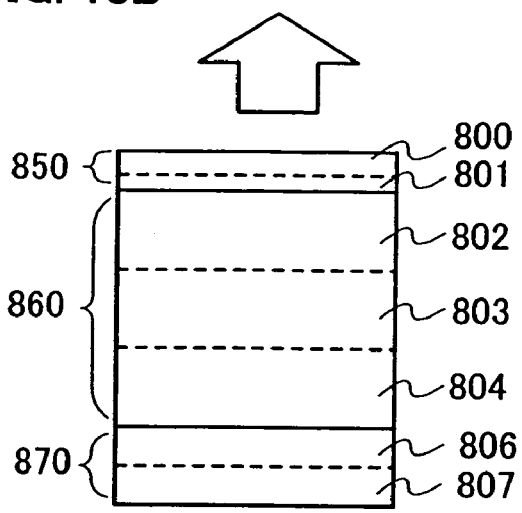

FIGS. 18A and 18B show the case where the first electrode layer 870 is an anode and the second electrode layer 850 is a cathode, and therefore, the electroluminescent layer 860 is preferably formed by sequentially laminating a first layer 804, a second layer 803, and a third layer 802 over the first electrode layer 870 which is an anode. The first layer 804 is an HIL (a hole injecting layer) and/or an HTL (a hole transporting layer), the second layer 803 is an EML (a light emitting layer), and the third layer 802 is an EIL (an electron injecting layer) and/or an ETL (an electron transporting layer). FIG. 18A shows a structure in which light is emitted through the first electrode layer 870, in which the first electrode layer 870 is formed using an electrode layer 805 that is made from a conductive oxide material having light transmitting properties, and in which the second electrode layer 850 is formed by sequentially laminating an electrode layer 801 containing alkali metal or alkaline earth metal such as LiF or MgAg and an electrode layer 800 made from a metal material such as aluminum over the electroluminescent layer 860. FIG. 18B shows a structure in which light is emitted through the second electrode layer 850, in which the first electrode layer 870 includes an electrode layer 807 made from metal such as aluminum or titanium or a metal material containing the metal and nitrogen at a concentration in stoichiometric proportion or less; and an electrode layer 806 made from a conductive oxide material that contains 1 atomic % to 15 atomic % silicon oxide. The second electrode layer 850 is formed by sequentially laminating the electrode layer 801 containing the alkali metal or the alkaline earth metal such as LiF or MgAg and the electrode layer 800 made from the metal material such as aluminum over the electroluminescent layer 860. The thicknesses of the electrode layers are set to be 100 nm or less so as to transmit light; therefore, light can be emitted through the second electrode layer 850.

Figure 18C:
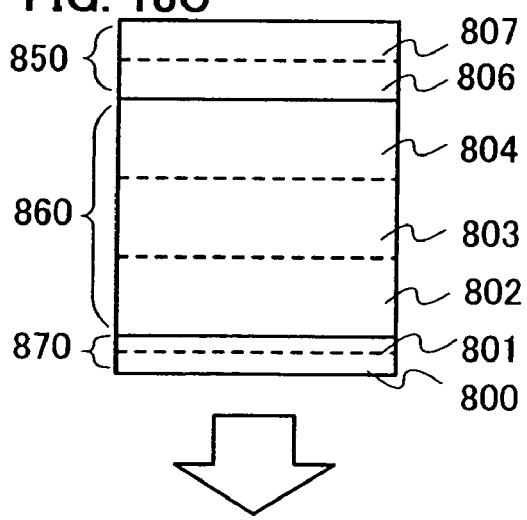
Figure 18D:
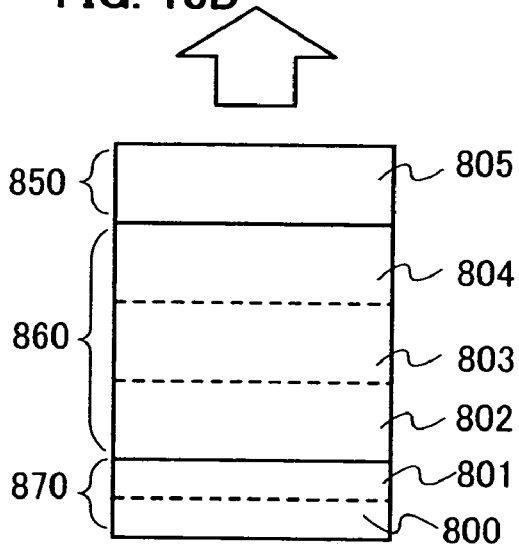

FIGS. 18C and 18D shows the case where the first electrode layer 870 is a cathode and the second electrode layer 850 is an anode. The electroluminescent layer 860 is preferably formed by laminating the third layer 802, the second layer 803, and the first layer 804 in this order over the first electrode layer 870 which is a cathode. The third layer 802 is an EIL (an electron injecting layer) and/ore an ETL (an electron transporting layer), the second layer 803 is an EML (a light emitting layer), the first layer 804 is an HIL (a hole injecting layer) and/or an HTL (a hole transporting layer). FIG. 18C shows a case where light is emitted through the first electrode layer 870, in which the first electrode layer 870 is formed by sequentially laminating the electrode layer 801 containing alkali metal or alkaline earth metal such as LiF or MgAg and the electrode layer 800 made from a metal material such as aluminum over the electroluminescent layer 860. The thicknesses of the electrode layers are set to be 100 nm or less to transmit light; accordingly, light can be emitted through the first electrode layer 870. The second electrode layer 850 is formed by sequentially laminating an electrode layer 806 made from a conductive oxide material containing 1 atomic % to 15 atomic % silicon oxide and an electrode layer 807 made from metal such as aluminum or titanium or a metal material containing the metal and nitrogen at a concentration in stoichiometric proportion or less over the electroluminescent layer 860. FIG. 18D shows a case where light is emitted through the second electrode layer 850, in which the first electrode layer 870 is formed by sequentially laminating the electrode layer 801 containing alkali metal or alkaline earth metal such as LiF or MgAg and the electrode layer 800 formed using a metal material such as aluminum over the electroluminescent layer 860. The thicknesses of the electrode layers are set to be thick so that light generated in the electroluminescent layer 860 can be reflected by the first electrode layer 870. The second electrode layer 850 is formed using an electrode layer 805 that is made from a conductive oxide material having light transmitting properties at least with respect to visible light. Further, the electroluminescent layer can be formed with a single layer structure or a mixed structure, in addition to the above lamination structure.

As the electroluminescent layer, materials exhibiting light emission of red (R), green (G), and blue (B) are selectively formed by an evaporation method using respective evaporation masks, or the like. The materials exhibiting light emission of red (R), green (G), and blue (B) (low molecular weight materials, high molecular weight materials, and the like) can be formed by a droplet discharge method as in the case of a color filter. The droplet discharge method is preferable since the materials exhibiting R, G, and B light can be separately applied without using a mask.

In the case of the top emission using ITO or ITSO having light transmitting properties for a second electrode layer, BzOS—Li in which benzoxazole derivative (BzOS) is doped with Li, or the like can be used. Also, for instance, as the EML, $Alq_3$ doped with a dopant corresponding to respective luminescent colors of R, G, and B (DCM etc. in the case of R, and DMQD etc. in the case of G) may be used.

Note that the materials of the electroluminescent layer are not limited to the above materials. For example, hole injecting properties can be enhanced by co-evaporation of oxide such as molybdenum oxide ($MoO_x$: x=2 to 3) with α-NPD or rubrene as substitute for CuPc or PEDOT. In addition, an organic material (including a low molecular weight material or a high molecular weight material) or a composite material of an organic material and an inorganic material can be used as a material for the electroluminescent layer. Materials for forming the light emitting element will be described in more detail below.

As substances having high electron transporting properties among charge injecting/transporting substances, for example, metal complexes having a quinoline skeleton or a benzoquinoline skeleton such as: tris(8-quinolinolato)aluminum ($Alq_3$); tris(4-methyl-8-quinolinolato)aluminum ($Almq_3$); bis(10-hydroxybenzo[h]quinolinato)beryllium ($BeBq_2$); and bis(2-methyl-8-quinolinolato)(4-phenylphenolato)aluminum (BAlq) can be given. As substances having high hole transporting properties, for example, aromatic amine based (i.e., one having a benzene ring-nitrogen bond) compounds such as: 4,4'-bis[N-(1-naphthyl)-N-phenylamino]biphenyl (α-NPD); 4,4'-bis[N-(3-methylphenyl)-N-phenylamino]biphenyl (TPD); 4,4',4"-tris(N,N-diphenylamino)triphenylamine (TDATA); and 4,4',4"-tris[N-(3-methylphenyl)-N-phenylamino]triphenylamine (MTDATA) can be given.

As substances having extremely high electron injecting properties among charge injecting/transporting substances, compounds of alkali metal or alkaline earth metal such as lithium fluoride (LiF), cesium fluoride (CsF), or calcium fluoride ($CaF_2$) can be given. In addition, a mixture of a substance having high electron transporting properties such as $Alq_3$ and alkaline earth metal such as magnesium (Mg) may be used.

As substances having high hole injecting properties among the charge injecting/transporting substances, for example, metal oxide such as molybdenum oxide ($MoO_x$), vanadium oxide ($VO_x$), ruthenium oxide ($RuO_x$), tungsten oxide ($WO_x$) or manganese oxide ($MnO_x$) can be given. Besides, phthalocyanine based compounds such as phthalocyanine ($H_2Pc$) and copper phthalocyanine (CuPc) can be given.

Light emitting layers having different light emission wavelength bands may be each formed in each pixel so as to perform color display. Typically, light emitting layers corresponding to respective luminescent colors of R (red), G (green), and B (blue) are formed. In this case, when a filter that transmits light of a certain light emission wavelength band is provided on a light emission side of the pixels, color purity can be improved and specular reflection (reflection) of a pixel portion can be prevented. By providing the filter, a circular polarizing plate or the like, which has been conventionally thought to be required, can be eliminated, thereby reducing loss of light emitted from the light emitting layers. In addition, change in color tone, which is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-[2-(1,1,7,7-tetramethyljulolidine-9-yl) ethenyl]-4H-pyran (DCJT); 2-tert-butyl-4-dicyanomethylene-6-[2-(1,1,7,7-tetramethyljulolidine-9-yl) ethenyl]-4H-pyran (DCJTB); periflanthene; 2,5-dicyano-1,4-bis[2-(10-methoxy-1,1,7,7-tetramethyljulolidine-9-yl) ethenyl]benzene, N,N'-dimethylquinacridone (DMQd); coumarin 6; coumarin 545T; tris(8-quinolinolato)aluminum ($Alq_3$); 9,9'-bianthryl; 9,10-diphenylanthracene (DPA); 9,10-bis(2-naphthyl)anthracene (DNA); and the like. Also, another substance may be used.

On the other hand, as compared with the low molecular weight organic light emitting materials, the high molecular weight organic light emitting materials have higher physical strength, which means an element is more durable. In addition, since the high molecular weight organic light emitting materials can be formed by coating, an element can be manufactured relatively easily. A structure of a light emitting element formed using the high molecular weight organic light emitting materials is basically similar to that using the low molecular weight organic light emitting materials, and is formed by sequentially laminating a cathode, an organic light emitting layer, and an anode from a cathode side. However, when a light emitting layer is made of the high molecular weight organic light emitting materials, it is difficult to form a lamination structure like the case of using the low molecular weight organic light emitting materials. In many cases, such the light emitting element made from the high molecular weight organic light emitting materials has a two-layer structure. Specifically, it is a lamination structure formed by sequentially laminating a cathode, a light emitting layer, a hole transporting layer, and an anode in this order from the cathode side.

Since the luminescent color is determined by a material of a light emitting layer, a light emitting element that emits a predetermined color of light can be formed by selecting the material. As the high molecular weight electroluminescent materials that can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) (PPV): poly(2,5-dialkoxy-1,4-phenylenevinylene) (RO-PPV); poly(2-(2'-ethyl-hexoxy)-5-methoxy-1,4-phenylenevinylene) (MEH-PPV); poly(2-(dialkoxyphenyl)-1,4-phenylenevinylene) (ROPh-PPV); or the like can be given. As the polyparaphenylene based material, a derivative of polyparaphenylene (PPP): poly(2,5-dialkoxy-1,4-phenylene) (RO-PPP); poly(2,5-dihexoxy-1,4-phenylene); or the like can be given. As the polythiophene based material, a derivative of polythiophene (PT): poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly[3-(4-octylphenyl)-thiophene] (POPT); poly[3-(4-octylphenyl)-2,2bithiophene) (PTOPT); or the like can be given. As the polyfluorene based material, a derivative of polyfluorene (PF): poly(9,9-dialkylfluorene) (PDAF); poly(9,9-dioctylfluorene) (PDOF); or the like can be given.

When a high molecular weight organic light emitting material having hole transporting properties is interposed between an anode and a high molecular weight organic light emitting material having light emitting properties, hole injecting properties from the anode can be improved. Typically, a solution, in which a high molecular weight organic light emitting material having the hole transporting properties is dissolved in water with an acceptor material, is applied by a spin coating method or the like. Since the high molecular weight organic light emitting material having hole transporting properties is insoluble in an organic solvent, it can be laminated together with the above-mentioned organic light emitting material having light emitting properties. As the high molecular weight organic light emitting material having the hole transporting properties, a mixture of PEDOT and camphor sulfonic acid (CSA) as an acceptor material; a mixture of polyaniline (PANI) and polystyrenesulfonic acid (PSS) as an acceptor material; or the like can be given.

A light emitting layer can emit monochromatic light or white light. In the case of using a white light emitting material, color display can be achieved by providing a filter (a colored layer) that transmits light of a certain wavelength on a light emitting side of a pixel.

In order to form a light emitting layer that emits white light, for example, $Alq_3$, $Alq_3$ partially doped with Nile red, which is a red light emitting pigment, $Alq_3$, p-EtTAZ, and TPD (aromatic diamine) are sequentially laminated by an evaporation method. Also, when an EL is formed by a coating method using spin coating, the EL is preferably baked by vacuum heating after coating. For example, an aqueous solution of poly(ethylene dioxythiophene)/poly(styrenesulfonic acid) (PEDOT/PSS), which functions as a hole injecting layer, may be applied over an entire surface of a substrate and baked. Afterwards, a solution of polyvinyl carbazole (PVK) doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6), which serves as a light emitting layer, may then be applied over the entire surface and baked.

The light emitting layer can be formed to have a single layer. In this case, 1,3,4-oxadiazole derivative (PBD) having electron transporting properties may be dispersed in polyvinyl carbazole (PVK) having hole transporting properties. In addition, white light emission can be obtained by dispersing 30 wt % PBD as an electron. transporting agent and dispersing a suitable amount of four kinds of pigments (TPB, coumarin 6, DCM1, and Nile red). As well as the above-mentioned light emitting elements that can emit white light, a light emitting element capable of emitting red light, green light, or blue light can be manufactured by properly selecting materials for the light emitting layer.

When a high molecular weight organic light emitting material having hole transporting properties is interposed between an anode and a high molecular weight organic light emitting material having light emitting properties, hole injecting properties from the anode can be improved. Typically, a solution, in which a high molecular weight organic light emitting material having the hole transporting properties is dissolved in water with an acceptor material, is applied by a spin coating method or the like. Since the high molecular weight organic light emitting material having hole transporting properties is insoluble in an organic solvent, it can be laminated together with the above mentioned organic light emitting material having light emitting properties. As the high molecular weight organic light emitting material having the hole transporting properties, a mixture of PEDOT and camphor sulfonic acid (CSA) as an acceptor material; a mixture of polyaniline (PANI) and polystyrenesulfonic acid (PSS) as an acceptor material; or the like can be given.

Further, a triplet excited light emitting material including a metal complex or the like may be used for a light emitting layer as well as a singlet excited light emitting material. For example, a pixel emitting red light, whose luminance is reduce by half in a relatively short time, is formed by using the triplet excited light emitting material, and the pixels emitting green and blue light are formed of the singlet excited light emitting material. Since the triplet excited light emitting material has an excellent light emitting efficiency, it has a feature of requiring lower power to obtain the same level of luminance as compared with the singlet excited light emitting material. That is, when the pixel for emitting red light is formed by the triplet excited light emitting material, only a small amount of current flowing through the light emitting element is required, thereby improving reliability. To reduce power consumption, the pixel emitting red and green light may be formed of the triplet excited light emitting material, while the pixel emitting blue light may be formed of the singlet excited light emitting material. In the case where light emitting element that emits green light, having high visibility, is also formed of the triplet excited light emitting material, power consumption can be further reduced.

As an example of the triplet excited light emitting material, there is one that uses a metal complex as a dopant. In particular, a metal complex with platinum, which is a third transition element, as its central metal; a metal complex with iridium as its central metal; and the like are known. The triplet excited light emitting material is not limited to these compounds, and it is possible to use a compound having the above mentioned structure and including an element that belongs to group 8 to 10 of the periodic table as its central metal.

Above mentioned substances for forming the light emitting layer are examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer, or a hole blocking layer. In addition, a mixed layer or a mixed junction of these layers may be formed. The layer structure of the light emitting layer can be varied, and the structural change of the light emitting layer may be allowable without departing from the purpose of the invention; for example, an electrode layer is provided or a light emitting material is dispersed so as to function as the light emitting layer, instead of providing a certain electron injecting region or light emitting region.

When a forward bias voltage is applied to a light emitting element formed of the above-mentioned material, the light emitting element can emit light. Each pixel of a display device formed using the light emitting element can be driven by either a simple matrix method or an active matrix method. In either case, each pixel emits light by being applied with a forward bias voltage at a certain timing, whereas each pixel does not emit light in a certain period. In this non-light emitting period, a reverse bias voltage is applied to the light emitting element so that the reliability of the light emitting element can be improved. The light emitting element has a deterioration mode of reducing light intensity under a certain driving condition or apparently reducing luminance due to expansion of a non-light emitting region within the pixel. When the light emitting element is driven by applying alternating current of a forward bias voltage and a reverse bias voltage, deterioration of the light emitting element can be hindered, thereby increasing the reliability of the light emitting device. Furthermore, either the digital driving or the analog driving is applicable.

Figure 16A:
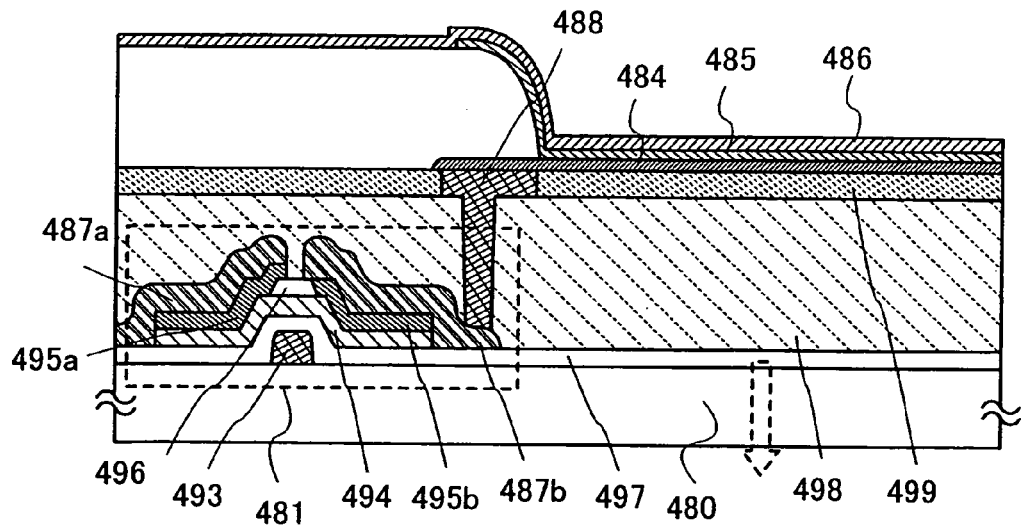
FIGS. 16A to 16C show a method of manufacturing a display device using the present invention.
Figure 16B:
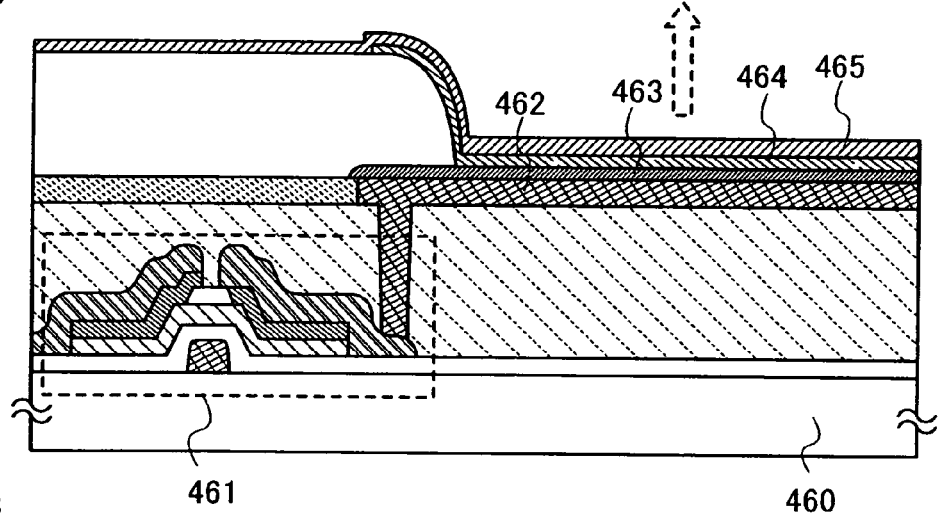
Figure 16C:
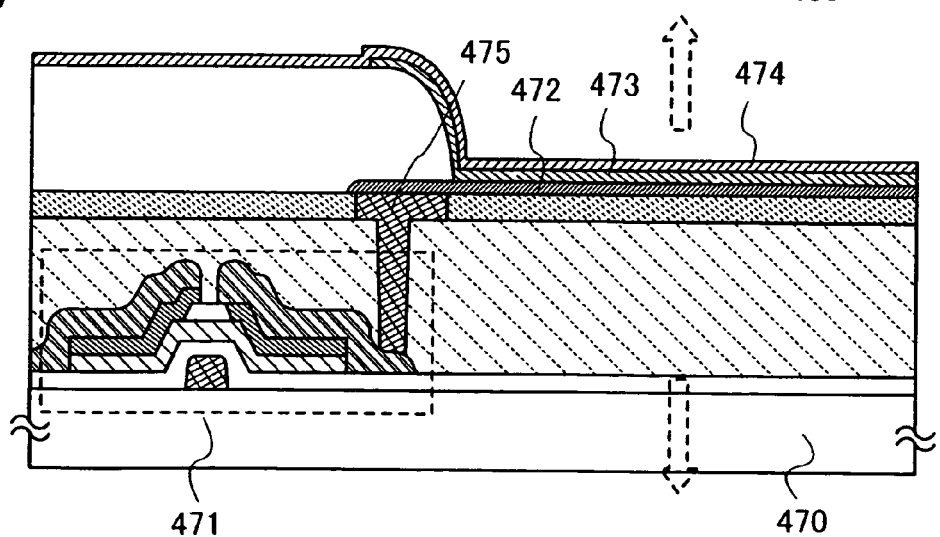

Although not shown in FIGS. 16A to 16C, a color filter (colored layer) may be formed over a sealing substrate facing to a substrate including elements. The color filter (colored layer) can be selectively formed by a droplet discharge method. Since broad peaks of the emission spectra of R, G, and B can be adjusted sharply by the color filter (colored layer), a high-definition image can be displayed by using this color filter (colored layer).

Although the case of forming the material exhibiting light emission of respective R, G, and B is described above, full color display can also be achieved by forming a material exhibiting monochromatic light in combination with a color filter or a color conversion layer. For example, the color filter (colored layer) or the color conversion layer may be formed over the sealing substrate and attached to the substrate. As above described, the material exhibiting monochromatic light, the color filter (colored layer), or the color conversion layer can be formed by a droplet discharge method.

Naturally, monochromatic light emitting display may be performed. For instance, an area color display device using the monochromatic light may be formed. A passive matrix display portion is suitable for the area color display device, and characters and symbols can be mainly displayed thereon.

In the above-mentioned structures, the cathode can be formed of a material having a low work function. For example, the cathode is desirably formed of Ca, Al, $CaF_2$, MgAg, AlLi, or the like. The electroluminescent layer may have any one of a single-layer structure, a lamination structure, and a mixed structure having no interface between layers. Further, the electroluminescent layer may be formed of any materials of a singlet material; a triplet material; a material with a combination of the singlet and triplet materials; a charge injecting/transporting substance containing an organic compound or an inorganic compound; or a light emitting material. The cathode may include one or plural kinds of layers selected from a low molecular weight organic compound, an intermediate molecular weight organic compound (which indicates an organic compound that does not have sublimation properties, and has 20 or less molecules or a molecular chain length of 10 μm or less), and a high molecular weight organic compound depending on the number of its molecules, and may be combined with an inorganic compound having electron injecting/transporting properties or hole injecting/transporting properties. The first electrode layers 484 and 472 and the second electrode layers 465 and 474 are formed of a transparent conductive film, which transmits light. For example, a transparent conductive film, in which indium oxide is mixed with zinc oxide (ZnO) of 2% to 20%, is used besides ITO and ITSO. It is preferable that a plasma treatment be carried out in an oxygen atmosphere or a heat treatment be performed in a vacuum atmosphere before forming the first electrode layers 484, 463, and 472. A partition wall (also referred to as a bank) is formed of a material including silicon, an organic material, or a compound material. Also, a porous film may be used. It is preferable that the partition wall is formed of a photosensitive or nonphotosensitive material such as acrylic or polyimide, since a curvature radius for each side surface thereof is continuously varied; and accordingly, a thin film formed over each partition wall is not disconnected. The present embodiment mode can be freely combined with Embodiment Mode 1 or Embodiment Mode 3.

Embodiment Mode 6

Next, a mode of mounting a driver circuit for driving on a display panel manufactured in accordance with Embodiment Modes 3 to 5 will be described.

First, a display device employing a COG method is described with reference to FIG. 22A. A pixel portion 2701 for displaying information of characters, images or the like is provided over a substrate 2700. A substrate provided with a plurality of driver circuits is divided into rectangles, and a driver circuit 2751 (hereinafter also referred to as a driver IC) after devision is mounted on the substrate 2700. FIG. 22A shows a mode of mounting a plurality of driver ICs 2751 and FPCs 2750 on the end of the driver ICs 2751. In addition, the divided size may be made almost the same as the length of a side of the pixel portion on a signal line side, and a tape may be mounted on the end of the single driver IC.

A TAB method may be adopted. In that case, a plurality of tapes may be attached and driver ICs may be mounted on the tapes as shown in FIG. 22B. Similarly to the case of a COG method, a single driver IC may be mounted on a single tape. In this case, a metal piece or the like for fixing the driver IC may be attached together in terms of intensity.

A plurality of the driver ICs to be mounted on a display panel is preferably formed over a rectangular substrate having a side of 300 mm to 1000 mm or more in terms of improving productivity.

In other words, a plurality of circuit patterns each including a driver circuit portion and an input-output terminal as a unit is formed over the substrate, and may be lastly divided to be used. In consideration of a side length of the pixel portion or the pixel pitch, the driver IC may be formed to be a rectangle having a long side (length) of 15 mm to 80 mm and a short side of 1 mm to 6 mm. Alternatively, the driver IC may be formed to have the long side length of a side length of the pixel portion, or the long side length of adding a side length of the pixel portion to a side length of each driver circuit.

An advantage of the external dimension of the driver IC over an IC chip is the length of the long side. When the driver IC having a long side of 15 mm to 80 mm is used, the number of the driver ICs necessary for mounting in accordance with the pixel portion is less than that in the case of using an IC chip. Therefore, a yield in manufacturing can be improved. When a driver IC is formed over a glass substrate, productivity is not decreased, since there is no limitation due to a shape of a substrate used as a mother body. This is a great advantage compared with the case of taking the IC chip out of a circular silicon wafer.

When a scanning line driver circuit 3702 is integrated with a substrate as shown in FIG. 25B, a driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for an UXGA class. The signal lines formed in such a number are divided into several blocks on an end of the pixel portion 3701, and lead lines are formed. The signal lines are gathered corresponding to the pitches of output terminals of the driver ICs. Note that reference numeral 3704 in FIG. 25B denotes a signal line input terminal.

The driver IC is preferably made of a crystalline semiconductor formed over the substrate. The crystalline semiconductor is preferably formed by being irradiated with continuous wave laser light. Therefore, a continuous wave solid-state laser or a gas laser is used for an oscillator for generating the laser light. There are few crystal defects when a continuous wave laser is used, and as a result, a transistor can be manufactured by using a polycrystalline semiconductor layer having a large grain size. In addition, high-speed driving is possible since mobility or response speed is favorable, and it is possible to further improve an operating frequency of an element than that of the conventional element. Therefore, high reliability can be obtained since there are few characteristics variations. The channel-length direction of the transistor and a scanning direction of laser light may be directed in the same direction to further improve the operating frequency. This is because the highest mobility can be obtained when a channel length direction of a transistor and a scanning direction of laser light with respect to a substrate are almost parallel (preferably, −30° to 30°) in a step of laser crystallization by a continuous wave laser. Note that the channel length direction coincides with the flowing direction of a current, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to extensively narrow the laser light, and a shape of the laser light (beam spot) preferably has the same width as that of a short side of the driver ICs, approximately 1 mm to 3 mm. In addition, in order to secure an enough and effective energy density for an object to be irradiated, an irradiated region with the laser light preferably has a linear shape. The term "linear" used herein refers to not a line in a strict sense but a rectangle or an oblong with a large aspect ratio. For example, the linear shape refers to a rectangle or an oblong with an aspect ratio of 2 or more (preferably 10 to 10000). Thus, it is possible to provide a method of manufacturing a display device in which productivity is improved by making a width of the laser light shape (beam spot) to the same length as a short side of the driver ICs.

As shown in. FIGS. 22A and 22B, driver ICs may be mounted as both the scanning line driver circuit and the signal line driver circuit. In this case, it is preferable to use different specifications of the driver ICs between a scanning line side and a signal line side.

In the pixel portion, the signal line and the scanning line intersect to form a matrix, and a transistor is arranged in accordance with each intersection. One feature of the present invention is that a TFT having an amorphous semiconductor or a semiamorphous semiconductor as a channel portion is used as the transistor arranged in the pixel portion. The amorphous semiconductor is formed by a method such as plasma CVD or sputtering. The semiamorphous semiconductor can be formed at a temperature of 300° C. or less by plasma CVD. A film thickness necessary to form the transistor is formed in a short time even in the case of a non-alkaline glass substrate having an external size of, for example, 550 mm×650 mm. The feature of such a manufacturing technique is effective in manufacturing a large-sized display device. In addition, a semiamorphous TFT can obtain field effect mobility of 2 $cm^2$/V·sec to 10 $cm^2$/V·sec by forming a channel formation region using a SAS. When the present invention is applied, a fine wiring having a short channel width can be stably formed without a fault such as a short circuit since a pattern having a desired shape can be formed with good controllability. Accordingly, a TFT having electric characteristics required to operate pixels sufficiently can be formed. Therefore, this TFT can be used as a switching element of the pixels or as an element included in the scanning line driver circuit. Thus, a display panel in which system-on-panel is realized can be manufactured.

The scanning line driver circuit is also integrated with the substrate by using a TFT having a semiconductor layer formed of a SAS. In the case of using a TFT having a semiconductor layer formed of an AS, the driver ICs may be mounted on both the scanning line driver circuit and the signal line driver circuit.

In that case, it is preferable to use different specifications of the driver ICs between the scanning line side and the signal line side. For example, a transistor included in the scanning line driver IC is required to withstand a voltage of approximately 30 V; however, a drive frequency is 100 kHz or less, and high-speed operation is not comparatively required. Therefore, it is preferable to set a channel-length (L) of the transistor included in the scanning line driver sufficiently long. On the other hand, a transistor of the signal line driver IC is required to withstand a voltage of only approximately 12 V; however, a drive frequency is around 65 MHz at 3 V, and high-speed operation is required. Therefore, it is preferable to set a channel-length or the like of the transistor included in a driver with a micron rule. By using the present invention, a fine pattern can be formed with good controllability. Therefore, the present invention can handle such a micron rule sufficiently.

A method of mounting the driver IC is not particularly limited, and a known method such as a COG method, a wire bonding method, or a TAB method can be employed.

The thicknesses of the driver IC and the opposite substrate are set to have the same thickness, which contributes to thinning of a display device as a whole. When both substrates are formed of the same material, thermal stress is not generated and characteristics of a circuit formed of a TFT are not damaged even when temperature change is generated in the display device. Furthermore, the number of the driver ICs to be mounted on one pixel portion can be reduced by mounting longer driver ICs than IC chips on a driver circuit as described in this embodiment mode.

As the above described, a driver circuit can be incorporated in a display panel.

Embodiment Mode 7

An example of a protective circuit included in a display device of the present invention will be described.

Figure 24A:
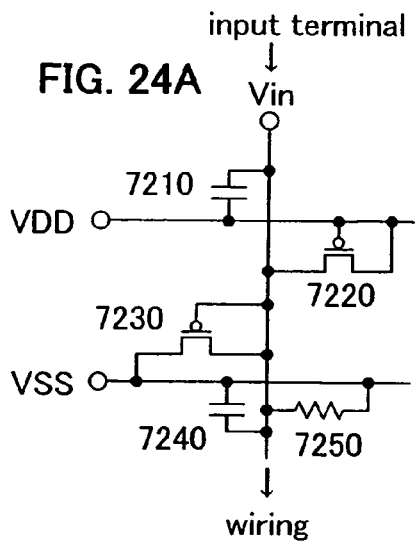
FIGS. 24A to 24E are diagrams showing protective circuits using the present invention.

As shown in FIGS. 22A and 22B, a protective circuit 2713 can be formed between an external circuit and an internal circuit. The protective circuit is constructed with one or plural elements selected from a TFT, a diode, a resistor element, a capacitor element, and the like. Described below are several structures of the protective circuit and the operation thereof. First, the structure of an equivalent circuit of a protective circuit which is disposed between an external circuit and an internal circuit and which corresponds to one input terminal is described with reference to FIGS. 24A to 24E. The protective circuit shown in FIG. 24A includes p-channel thin film transistors 7220 and 7230, capacitor elements 7210 and 7240, and a resistor element 7250. The resistor element 7250 has two terminals; one of which is supplied with an input voltage Vin (hereinafter referred to as Vin), and the other of which is supplied with a low-potential voltage VSS (hereinafter referred to as VSS).

Figure 24B:
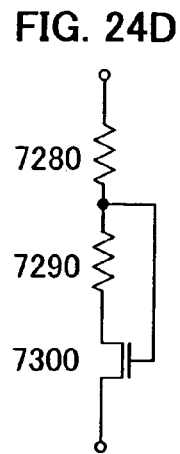
Figure 24C:
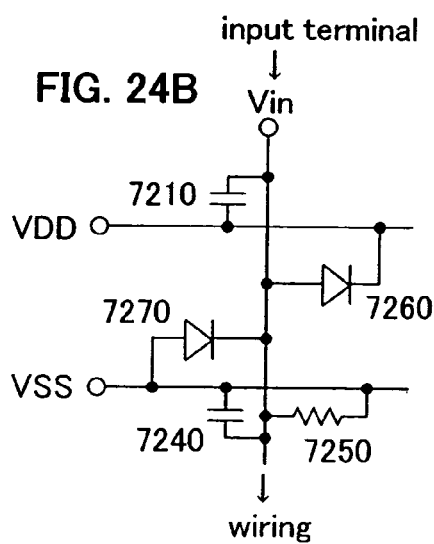
Figure 24D:
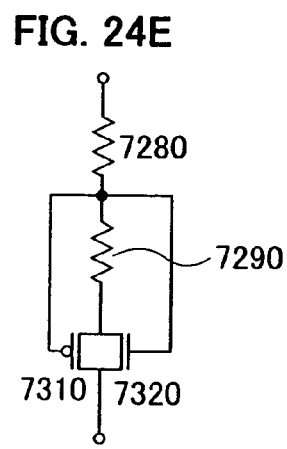
Figure 24E:
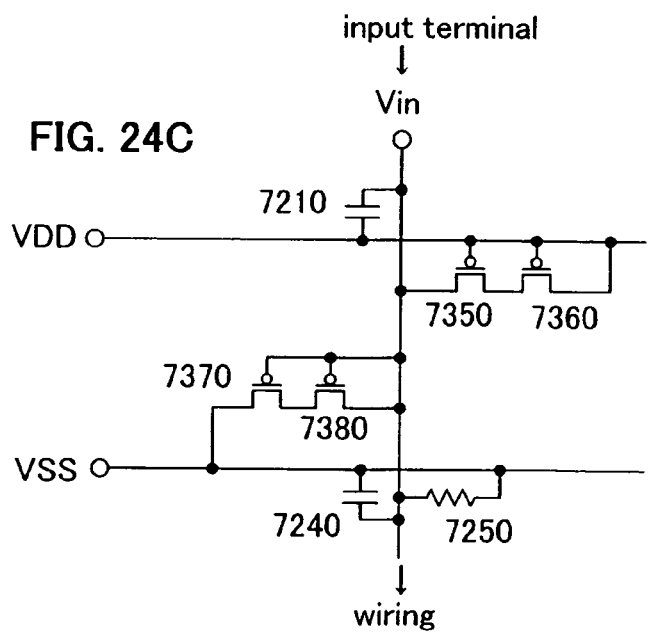

FIG. 24B is an equivalent circuit diagram showing a protective circuit in which rectifying diodes 7260 and 7270 are substituted for the p-channel thin film transistors 7220 and 7230. FIG. 24C is an equivalent circuit diagram showing a protective circuit in which TFTs 7350, 7360, 7370, and 7380 are substituted for the p-channel thin film transistors 7220 and 7230. In addition, as a protective circuit having a different structure from the above structure, FIG. 24D shows a protective circuit which includes resistors 7280 and 7290 and an n-channel thin film transistor 7300. A protective circuit shown in FIG. 24E includes resistors 7280 and 7290, a p-channel thin film transistor 7310, and an n-channel thin film transistor 7320. By providing the protective circuit, a sudden surge in potential can be prevented, thereby element breakdown or damage can be prevented, which improves reliability. Note that an element having the aforementioned protective circuit is preferably formed using an amorphous semiconductor that can withstand high voltage. This embodiment mode can be freely combined with the aforementioned embodiment mode.

This embodiment mode can be combined with any one of Embodiment Modes 1 to 6.

Embodiment Mode 8

A structure of a pixel of a display panel shown in this embodiment mode is described with reference to equivalent circuit diagrams shown in FIGS. 17A to 17F. In the embodiment mode, an example in which a light emitting element (EL element) is used as a display element of the pixel is described.

Figure 17A:
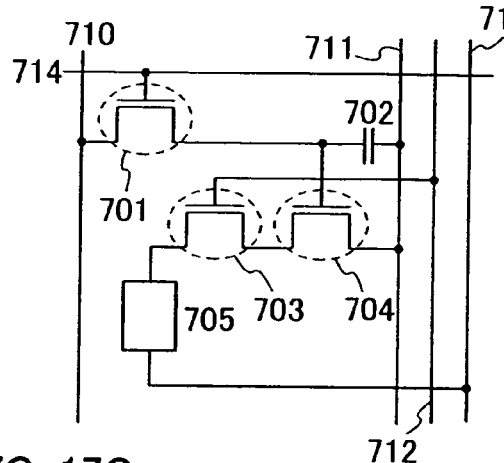
FIGS. 17A to 17F are circuit diagrams showing pixel structures applicable to an EL display panel using the present invention.

In a pixel shown in FIG. 17A, a signal line 710 and power supply lines 711, 712, and 713 are arranged in columns, and a scanning line 714 is arranged in a row. The pixel also includes a TFT 701 that is a switching TFT, a TFT 703 that is a driving TFT, a TFT 704 that is a current control TFT, a capacitor element 702, and a light emitting element 705.

Figure 17B:
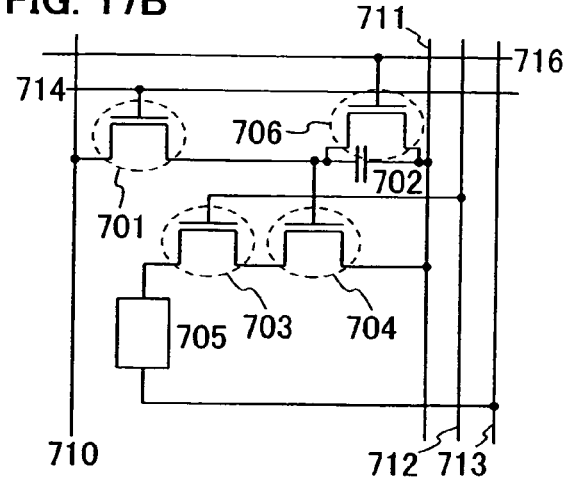
Figure 17C:
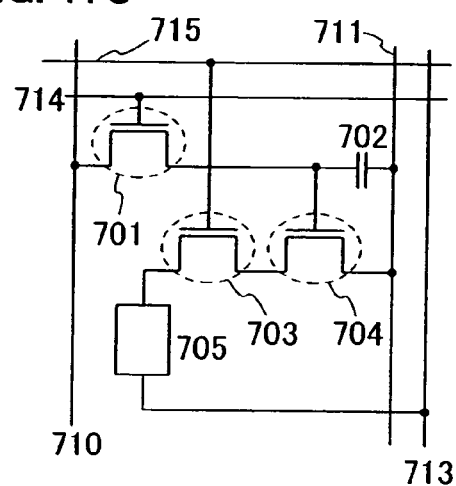
Figure 17D:
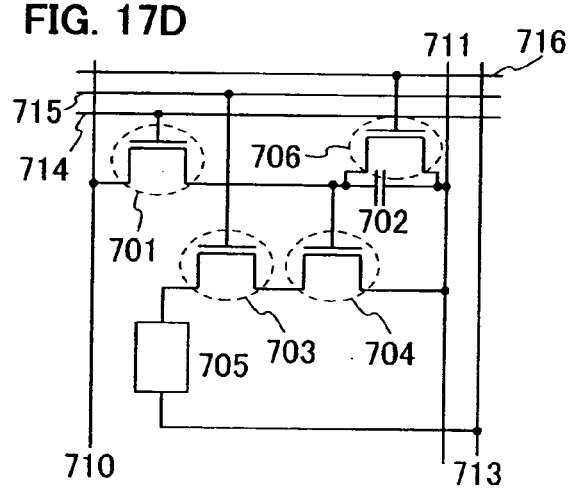

A pixel shown in FIG. 17C has the same structure as that shown in FIG. 17A, except that a gate electrode of the driving TFT 703 is connected to the power supply line 715 arranged in a row. Both pixels in FIGS. 17A and 17C show the same equivalent circuit diagrams. However, each power supply line is formed of conductive layers having different layers in between the cases where the power supply line 712 is arranged in a column (FIG. 17A) and where the power supply line 715 is arranged in a row (FIG. 17C). The two pixels are separately shown in FIGS. 17A and 17C in order to show that layers, from which a wiring connected to the gate electrode of the TFT 703 is formed, are different between FIGS. 17A and 17C.

In both FIGS. 17A and 17C, the TFTs 703 and 704 are connected in series in the pixel, and a ratio of the channel length $L_3$/the channel width $W_3$ of the TFT 703 to the channel length $L_4$/the channel width $W_4$ of the TFT 704 is set as $L_3/W_3:L_4/W_4=5$ to $6000:1$. For example, when $L_3$, $W_3$, $L_4$, and $W_4$ are respectively 500 μm, 3 μm, 3 μm, and 100 μm, the ratio 6000:1 can be obtained. When the present invention is used, a fine wiring having a short channel width can be stably formed without a fault such as a short circuit since a pattern can be processed into a desired fine shape. Hence, a TFT having electric characteristics required for sufficiently operating such pixels shown in FIGS. 17A and 17C can be formed. As a result, a highly reliable display panel superior in display capability can be manufactured.

The TFT 703 is operated in a saturation region and controls the amount of current flowing into the light emitting element 705, whereas the TFT 704 is operated in a linear region and controls a current supplied to the light emitting element 705. The TFTs 703 and 704 preferably have the same conductivity in view of the manufacturing step. For the TFT 703, a depletion type TFT may be used instead of an enhancement type TFT. In the present invention having the above structure, slight variations in $V_{GS}$ of the TFT 704 does not affect the amount of current flowing into the light emitting element 705, since the TFT 704 is operated in a linear region. That is, the amount of current flowing into the light emitting element 705 is determined by the TFT 703 operated in the saturation region. Accordingly, it is possible to provide a display device in which image quality is enhanced by reducing variations in luminance of the light emitting element due to the variation of the TFT properties.

The TFT 701 of pixels shown in FIGS. 17A to 17D controls a video signal input to the pixel. When the TFT 701 is turned on and a video signal is input to the pixel, the video signal is held at the capacitor element 702. Although the pixel includes the capacitor element 702 in FIGS. 17A and 17C, the present invention is not limited thereto. When gate capacitor or the like can serve as capacitor holding a video signal, the capacitor element 702 is not necessarily provided.

The light emitting element 705 has a structure in which an electroluminescent layer is interposed between a pair of electrodes. A pixel electrode and an opposite electrode (an anode and a cathode) have a potential difference therebetween so that a forward bias voltage is applied. The electroluminescent layer is formed of wide range of materials such as an organic material, and an inorganic material. The luminescence in the electroluminescent layer includes luminescence that is generated when a singlet excited state returns to a ground state (fluorescence) and luminescence that is generated when a triplet exited state returns to a ground state (phosphorescence).

A pixel shown in FIG. 17B has the same structure as that shown in FIG. 17A, except that a TFT 706 and a scanning line 716 are added. Similarly, a pixel shown in FIG. 17D has the same structure as the one shown in FIG. 17C, except that a TFT 706 and a scanning line 716 are added.

The TFT 706 is controlled to be on or off by the added scanning line 716. When the TFT 706 is turned on, charges held at the capacitor element 702 are discharged, thereby turning the TFT 704 off. That is, supply of a current to the light emitting element 705 can be forcibly stopped by providing the TFT 706. Therefore, a lighting period can start simultaneously with or shortly after start of a writing period without waiting until signals are written into all the pixels by adopting the structures shown in FIGS. 17B and 17D, thus, a duty ratio can be improved.

Figure 17E:
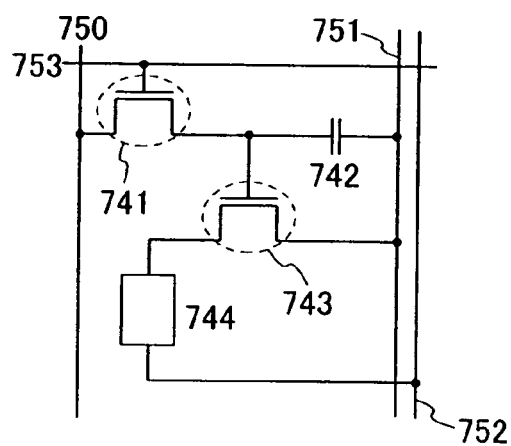
Figure 17F:
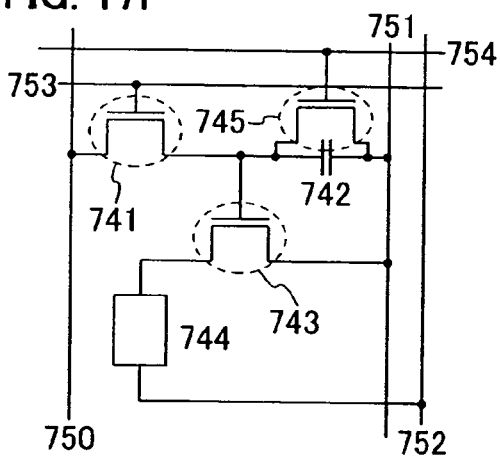

In a pixel shown in FIG. 17E, a signal line 750 and power supply lines 751 and 752 are arranged in columns, and a scanning line 753 is arranged in a row. The pixel further includes a TFT 741 that is a switching TFT, a TFT 743 that is a driving TFT, a capacitor element 742, and a light emitting element 744. A pixel shown in FIG. 17F has the same structure as the one shown in FIG. 17E, except that a TFT 745 and a scanning line 754 are added. The structure of FIG. 17F also enables a duty ratio to be improved by providing the TFT 745.

As described above, in accordance with the present invention, a pattern of a wiring or the like can be precisely and stably formed without a fault of forming. Therefore, a TFT can be provided with high electric characteristics and reliability, and the present invention can be satisfactorily used for an applied technique for improving display capability of a pixel in accordance with the intended use.

The present embodiment mode can be combined with any one of Embodiment Modes 1, 3, and 5 to 7.

Embodiment Mode 9

Figure 11:
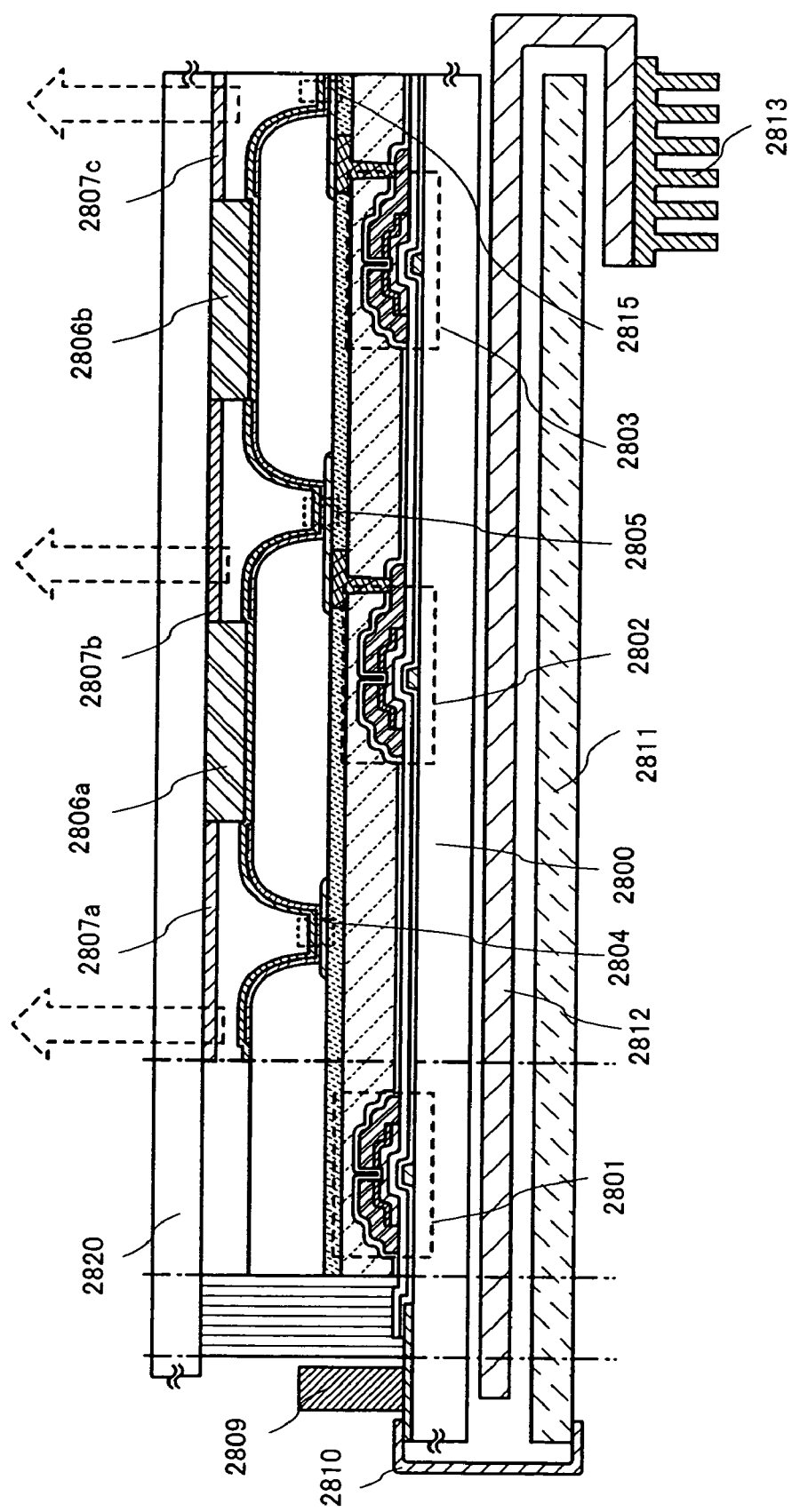
FIG. 11 is a sectional view showing a structural example of an EL display module using the present invention.

Embodiment Mode 9 is described with reference to FIG. 11. FIG. 11 shows an example of forming an EL display module using a TFT substrate 2800 manufactured in accordance with the present invention. In FIG. 11, a pixel portion including pixels is formed over the TFT substrate 2800.

In FIG. 11, a TFT which has the same structure as that formed in a pixel, or a protective circuit portion 2801 operated in the same manner as a diode by connecting a gate to either a source or a drain of the TFT is provided between a driver circuit and the pixel which is the outside of the pixel portion. A driver IC formed of a single crystalline semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b formed by a droplet discharge method therebetween. The spacer is preferably provided to keep a space between two substrates constantly even when a substrate is thin or an area of the pixel portion is enlarged. A space between the TFT substrate 2800 and the sealing substrate 2820 over light emitting elements 2804 and 2805 connected to TFTs 2802 and 2803 respectively may be filled with a light-transmitting resin material with respect to visible light and solidified, or may be filled with anhydrous nitrogen or an inert gas.

FIG. 11 shows a case in which the light emitting elements 2804, 2805, and 2815 have a structure of a top emission type and has a structure in which light is emitted in the direction of the arrow shown in the drawing. Multicolor display can be carried out by having different luminescent colors of red, green, or blue in each pixel. At this time, color purity of the luminescence emitted outside can be improved by forming colored layers 2807a, 2807b, and 2807c corresponding to each color on a sealing substrate 2820 side. Moreover, the colored layers 2807a, 2807b, and 2807c may be combined with each other by using the pixel as a white light emitting element.

The driver circuit 2809 is in contact with an external circuit substrate 2811 through a wiring substrate 2810 which is provided over one end of the TFT substrate 2800. In addition, a heat pipe 2813 and a heat sink 2812 may be provided to be in contact with or close to the TFT substrate 2800 to have a structure increasing a heat dissipation effect.

FIG. 11 shows the top emission type EL module; however, it may be a bottom emission structure by changing the structure of the light emitting element or the disposition of the external circuit substrate. Naturally, a dual emission structure in which light is emitted from both sides of the top and bottom surfaces may be used. In the case of the top emission structure, the insulating layer which is to be a partition wall may be colored to be used as a black matrix. This partition wall can be formed by a droplet discharge method and it may be formed by mixing a black resin of a pigment material, carbon black, or the like into a resin material such as polyimide. A lamination thereof may also be used.

In addition, reflected light of light entering from outside may be shielded by using a retardation film or a polarizing plate in the EL display module. In the case of a top emission type display device, an insulating layer to be a partition wall may be colored to be used as a black matrix. The partition wall can be formed by a droplet discharge method or the like. Carbon black or the like may be mixed into a black resin of a pigment material or a resin material such as polyimide, and a lamination thereof may also be used. By a droplet discharge method, different materials may be discharged on the same region plural times to form the partition wall. A quarter wave plate and a half wave plate may be used as the retardation films and may be designed to be able to control light. As the structure, the light emitting element, the sealing substrate (sealant), the retardation film (quarter wave plate), the retardation film (half wave plate), the polarizing plate are sequentially laminated over a TFT element substrate, in which light emitted from the light emitting element is transmitted therethrough and emitted outside from a polarizing plate side. The retardation films or polarizing plate may be provided on a side where light is emitted outside or may be provided on the both sides in the case of a dual emission type display device in which light is emitted from the both surfaces. In addition, an anti-reflective film may be provided on the outer side of the polarizing plate. Accordingly, a higher definition and more accurate image can be displayed.

In the TFT substrate 2800, a sealing structure may be formed by attaching a resin film to the side where the pixel portion is formed with the use of a sealant or an adhesive resin. In this embodiment mode, glass sealing using a glass substrate is described; however, various sealing methods such as resin sealing using a resin, plastic sealing using plastic, and film sealing using a film can be used. A gas barrier film which prevents moisture from penetrating into the resin film is preferably provided on the surface of the resin film. By applying a film sealing structure, a further thinner and lighter EL display module can be realized.

The present embodiment mode can be combined with any one of Embodiment Modes 1, 3, and 5 to 8.

Embodiment Mode 10

Embodiment Mode 10 will be described with reference to FIG. 15A and 15B. FIG. 15A and 15B show examples of forming liquid crystal display modules by using TFT substrates 2600 manufactured in accordance with the present invention.

FIG. 15A shows an example of a liquid crystal display module, in which a TFT substrate 2600 and an opposite substrate 2601 are firmly attached to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided in relation to respective pixels. The outsides of the TFT substrate 2600 and the opposite substrate 2601 are provided with polarizing plates 2606 and 2607, respectively. Also, a lens film 2613 is provided to the outside of the polarizing plate 2607. A light source includes a cold-cathode tube 2610 and a reflecting plate 2611. A circuit substrate 2612 is connected to the TFT substrate 2600 by a driver circuit 2608 and a flexible wiring substrate 2609. External circuits such as a control circuit and a power supply circuit are incorporated in the circuit substrate 2612. The liquid crystal display module can employ a TN (twisted nematic) mode, an IPS (in-plane-switching) mode, an MVA (multi-domain vertical alignment) mode, an ASM (axially symmetric aligned micro-cell) mode, an OCB mode, or the like.

Especially, performance of a display device manufactured in accordance with the present invention can be improved by using the OCB mode that can respond at high speed. FIG. 15B shows an example in which the OCB mode is applied to the liquid crystal display module of FIG. 15A, so that this liquid crystal display module becomes an FS-LCD (field sequential-LCD). The FS-LCD performs red, green, and blue light emissions in one frame period, respectively. An image is produced by using time division so that color display can be performed. Also, emission of respective colors is performed using a light emitting diode, a cold-cathode tube, or the like, hence, a color filter is not required. Therefore, since the arrangement of color filters of red, green, and blue is not required, nine times as many pixels can be provided in the same area as the case of using the color filters. On the other hand, light emission of three colors is performed in one frame period, thereby a high speed response of liquid crystal is required. When an FS system or an OCB mode is applied to the display device of the present invention, a high-definition display device or a high-definition liquid crystal television device having higher performance can be completed.

A liquid crystal layer of the OCB mode includes, what is called, a π cell structure. In the π cell structure, liquid crystal molecules are oriented such that pretilt angles of the molecules are symmetrical with respect to the center plane between the active matrix substrate and the opposite substrate. The orientation in the π cell structure is a splay orientation when a voltage is not applied to the substrates, and shifts into a bend orientation when the voltage is applied. Further application of the voltage brings the liquid crystal molecules in the bend orientation to an orientation perpendicular to the substrates, which allows light to pass therethrough. Note that approximately ten times as high response speed than a conventional TN mode can be achieved by using the OCB mode.

Further, as a mode corresponding to the FS system, an HV-FLC, an SS-FLC, or the like using a ferroelectric liquid crystal (FLC), that can be operated at high speed, can also be used. A nematic liquid crystal that has relatively low viscosity is used for the OCB mode. A smectic liquid crystal is used for the HV-FLC or the SS-FLC. As a liquid crystal material, an FLC, a nematic liquid crystal, a smectic liquid crystal, or the like can be used.

An optical response speed of the liquid crystal display module is increased by narrowing a cell gap of the liquid crystal display module. Alternatively, the optical response speed can be increased by lowering the viscosity of the liquid crystal material. The above method of increasing the response speed is more effective in the case where a pixel of a pixel region of a TN mode liquid crystal display module or a dot pitch is 30 μm or less.

The liquid crystal display module of FIG. 15B is of a light-transmitting type, in which a red light source 2910*a*, a green light source 2910*b*, and a blue light source 2910*c* are provided as light sources. A controlling portion 2912 is provided in the liquid crystal display module to control switch-on or switch-off of the red light source 2910*a*, the green light source 2910*b*, and the blue light source 2910*c*. The light emission of respective colors is controlled by the controlling portion 2912, and light enters the liquid crystal to produce an image using the time division, thereby performing color display.

As the above described, a high-definition and highly reliable liquid crystal display module can be manufactured by using the present invention.

The present embodiment mode can be combined with any one of Embodiment Modes 1, 4, 6, and 7.

Embodiment Mode 11

Figure 21:
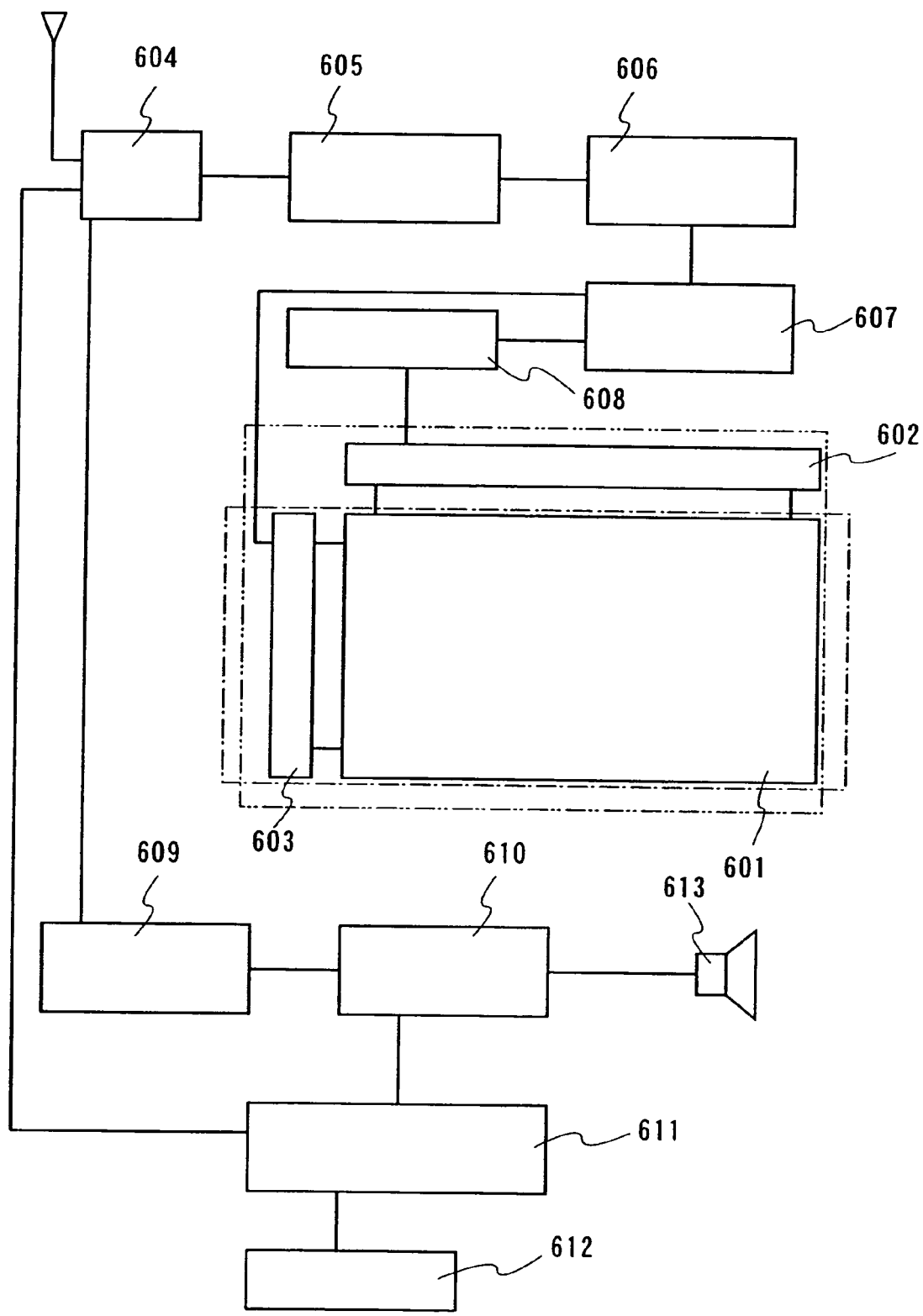
FIG. 21 is a block diagram showing a main structure of an electronic device using the present invention.

A television device can be completed by using a display device manufactured in accordance with the invention. FIG. 21 is a block diagram showing a main structure of the television device. As the structure shown in FIG. 25A, there are a case in which only a pixel portion 601 is formed and a scanning line driver circuit 603 and a signal line driver circuit 602 are mounted by the TAB method like FIG. 22B; a case in which only a pixel portion 601 is formed over a substrate and the scanning line driver circuit 603 and the signal line driver circuit 602 are mounted by the COG method like FIG. 22A; a case in which a TFT is formed as shown in FIG. 25B, the pixel portion 601 and the scanning line driver circuit 603 are also integrated with the substrate, and the signal line driver circuit 602 is independently mounted as a driver IC; and a case in which the pixel portion 601, the signal line driver circuit 602, and the scanning line driver circuit 603 are integrally formed over a substrate as shown in FIG. 25C; and the like. Any structure of the display panels may be used.

In addition, as another external circuit, a display device may include a video signal amplifier circuit 605 which amplifies a video signal among signals received by a tuner 604, a video signal processing circuit 606 which converts the signals output from the video signal amplifier circuit 605 into chrominance signals corresponding to respective colors of red, green, and blue, a control circuit 607 which converts the video signal into an input specification of a driver IC, or the like in an input side of the video signal. The control circuit 607 outputs signals to both a scanning line side and a signal line side. In the case of digital driving, a signal dividing circuit 608 may be provided on the signal line side and an input digital signal may be divided into m pieces to be supplied.

An audio signal among signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 or the audio signal processing circuit 610.

Figure 20A:
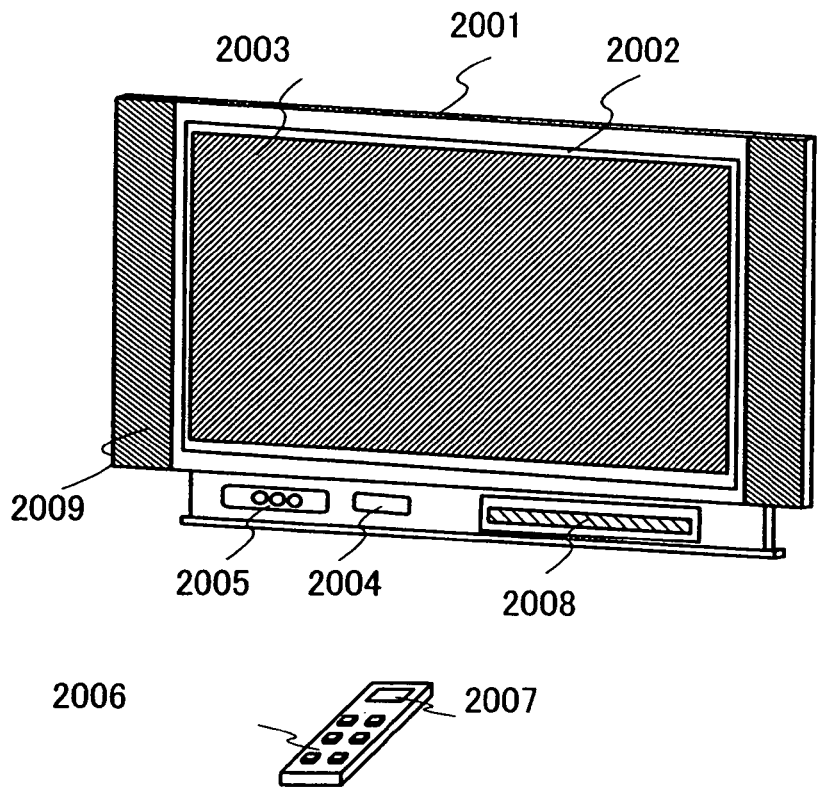
FIGS. 20A and 20B show electronic devices using the present invention.
Figure 20B:
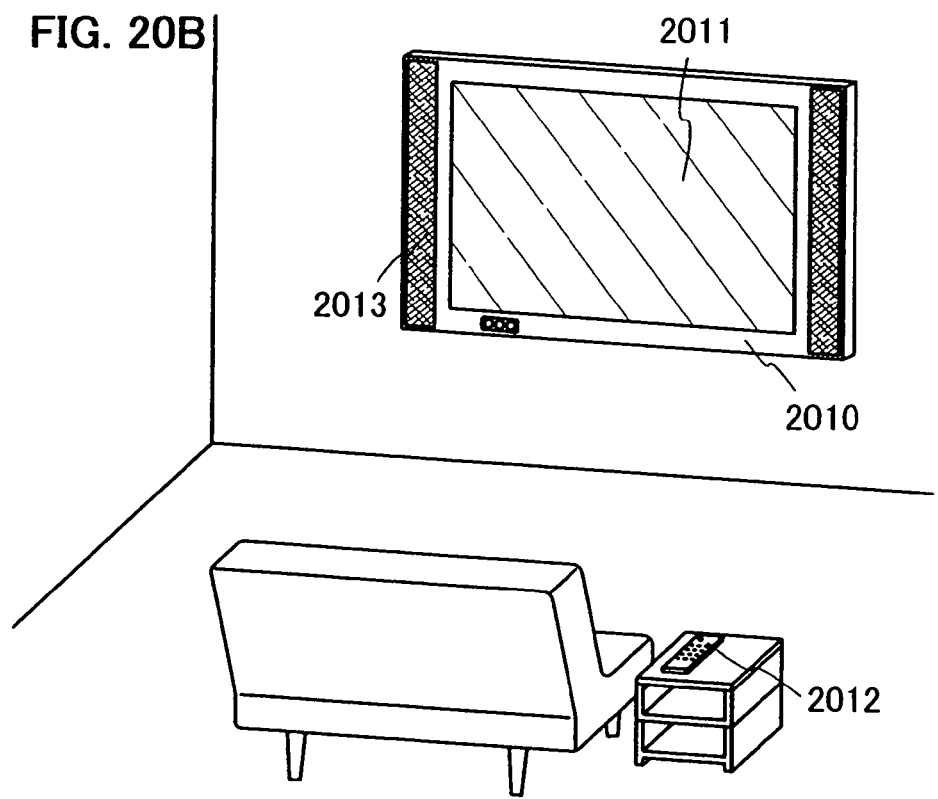

A television device can be completed by incorporating such a liquid crystal display module or an EL display module into a chassis as shown in FIGS. 20A and 20B. When the EL display module as shown in FIG. 11 is used, an EL television device can be obtained. When using a liquid crystal display module as shown in FIG. 15A or FIG. 15B, a liquid crystal television device can be obtained. A main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. By connecting to a communication network by wired or wireless connections via a modem 2004, one-way (from a sender to a receiver) or two-way (between a sender and a receiver or between receivers) information communication can be carried out. The television device can be operated by using a switch built in the chassis 2001 or a remote control unit 2006. Also, a display portion 2007 for displaying output information may also be provided in the remote control unit 2006.

Further, the television device may include a sub screen 2008 formed using a second display panel to display channels, volume, or the like, in addition to the main screen 2003. In this structure, the main screen 2003 may be formed by using an EL display panel having wide viewing angle, and the sub screen 2008 may be formed by using a liquid crystal display panel capable of displaying images with lower power consumption. In order to reduce the power consumption preferentially, the main screen 2003 may be formed by using a liquid crystal display panel, and the sub screen may be formed by using an EL display panel, which can be switched on and off. In accordance with the present invention, a highly reliable display device can be formed even when a large-sized substrate is used and a large number of TFTs or electronic parts are used.

FIG. 20B shows a television device having a large display portion, for example, with a size of 20 inches to 80 inches. The television device includes a chassis 2010, a display portion 2011, a remote control unit 2012 that is an operation portion, a speaker portion 2013, and the like. The present invention is applied to manufacturing of the display portion 2011. Since the television device in FIG. 20B is a wall-hanging type, it does not require a large installation space.

Naturally, the invention is not limited to the television device, and can be applied to various use applications; e.g., a large-sized display medium such as an information display board in a train station, an airport, or the like, or an advertisement display board on the street, as well as a monitor of a personal computer.

Embodiment Mode 12

Following the invention, various kinds of display devices can be manufactured. In other words, various kinds of electronic devices can be manufactured by incorporating such display devices of the invention in display portions of the electronic devices.

As examples of the electronic devices, a video camera; a digital camera; a projector; a head-mounted display (a goggle type display); a car navigation system; a mobile stereo; a personal computer; a game machine; a portable information terminal (such as a mobile computer, a cellular phone, or an electronic book); an image reproducing device provided with a recording medium (concretely, a device which can reproduce the recording medium such as a digital versatile disc (DVD) and includes a display portion capable of displaying images thereof); and the like can be given. Specific examples thereof are shown in FIGS. 19A to 19D.

Figure 19A:
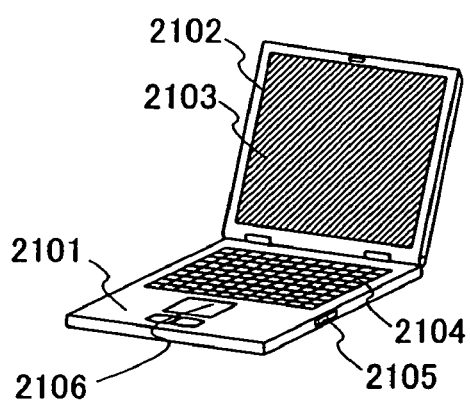
FIGS. 19A to 19D show electronic devices using the present invention.

FIG. 19A shows a personal computer, which includes a main body 2101, a chassis 2102, a display portion 2103, a keyboard 2104, an external connection port 2105, a pointing mouse 2106, or the like. The display portion 2103 can be manufactured using the invention. In accordance with the invention, a highly reliable personal computer in which a high-quality image can be displayed on the display portion 2103 can be manufactured even if the personal computer is miniaturized and a wiring or the like is formed precisely.

Figure 19B:
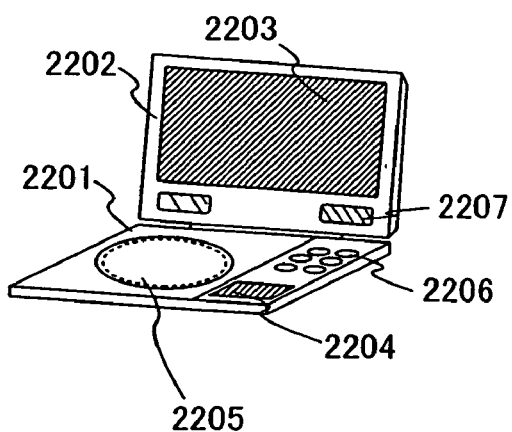

FIG. 19B shows an image reproducing device (specifically, a DVD reproducing device) including a recording medium, which includes a main body 2201, a chassis 2202, a display portion A 2203, a display portion B 2204, a recording medium (a DVD or the like) reading portion 2205, an operation key 2206, a speaker portion 2207, or the like. The display portion A 2203 mainly displays image information, while the display portion B 2204 mainly displays character information. These display portion A 2203 and display portion B 2204 can be manufactured using the invention. In accordance with the invention, a highly reliable image reproducing device in which a high-quality image can be displayed on the display portions can be manufactured even if the image reproducing device is miniaturized and a wiring or the like is formed precisely.

Figure 19C:
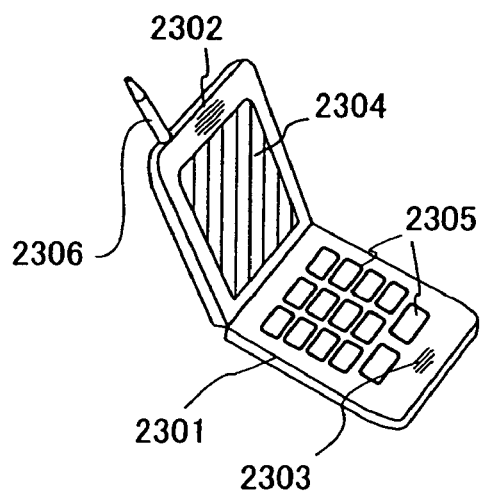

FIG. 19C shows a cellular phone, which includes a main body 2301, an audio output portion 2302, an audio input portion 2303, a display portion 2304, operation switches 2305, an antenna 2306, or the like. By applying the display device manufactured using the present invention to the display portion 2304, a highly reliable cellular phone in which a high-quality image can be displayed on the display portion 2304 can be manufactured even if the cellular phone is miniaturized and a wiring or the like is formed precisely.

Figure 19D:
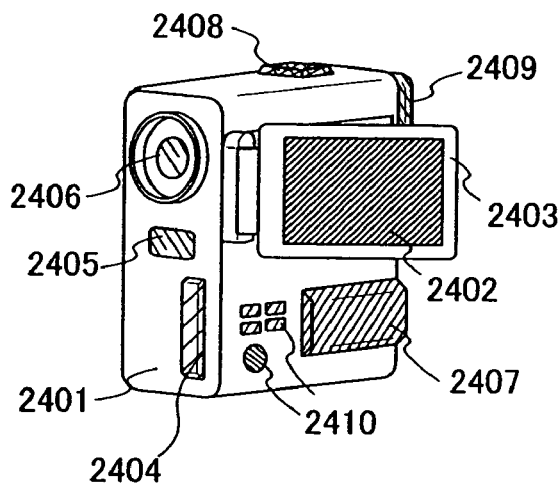

FIG. 19D shows a video camera, which includes a main body 2401, a display portion 2402, a chassis 2403, an external connection port 2404, a remote control receiver 2405, an image receiving portion 2406, a battery 2407, an audio input portion 2408, an eye piece portion 2409, operation keys 2410, or the like. The display portion 2402 can be manufactured using the invention. By applying the display device manufactured using the invention to the display portion 2402, a highly reliable video camera in which a high-quality image can be displayed on the display portion 2402 can be manufactured even if the video camera is miniaturized and a wiring or the like is formed precisely. The present embodiment mode can be freely combined with the above described embodiment mode.

Embodiment Mode 13

In accordance with the present invention, a semiconductor device functioning as a processor chip (also referred to as a wireless chip, a wireless processor, a wireless memory, and a wireless tag) can be formed. The usage of the semiconductor device of the present invention is wide-ranging. For example, the semiconductor device of the present invention can be used by providing to paper money, coins, securities, certificates, bearer bonds, packing containers, documents, recording media, personal belongings, vehicles, foods, clothing, health articles, commodities, medicines, electronic devices, or the like.

Figure 26A:
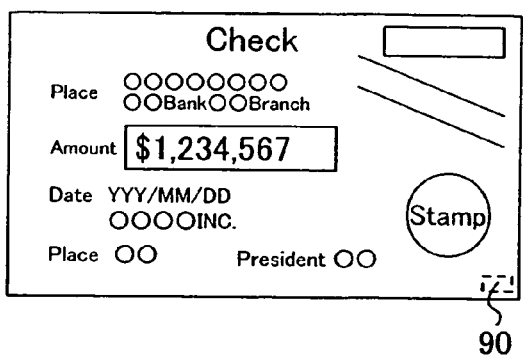
FIGS. 26A to 26G show semiconductor devices using the present invention.
Figure 26B:
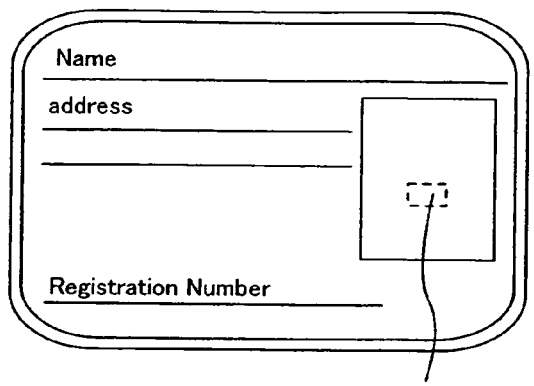
Figure 26C:
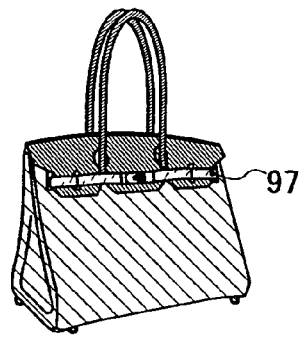
Figure 26D:
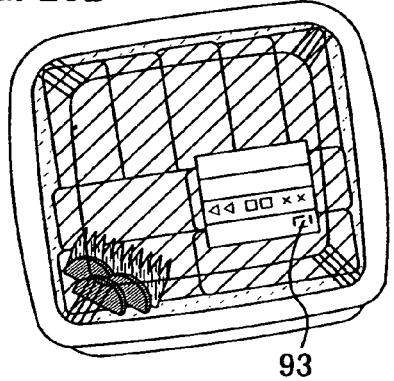
Figure 26E:
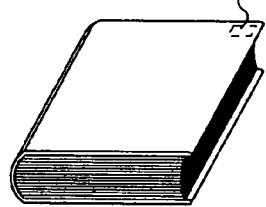
Figure 26F:
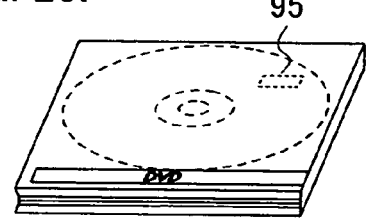
Figure 26G:
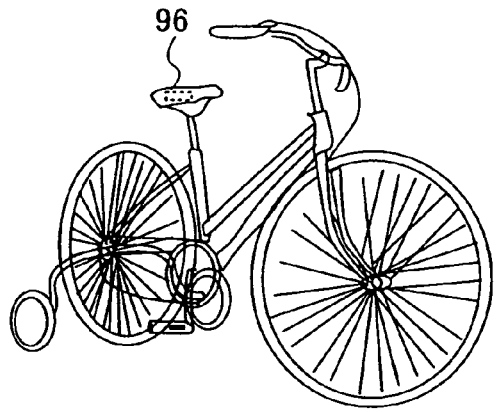

The paper money or the coins are money distributed in the market and include currency such as cash vouchers available in a certain area or memorial coins. The securities refer to checks, certificates, promissory notes, or the like, and a processor chip 90 can be provided therein (FIG. 26A). The certificates refer to a driver's license, a certificate of residence, or the like, and a processor chip 91 can be provided therein (FIG. 26B). The personal belongings refer to bags, glasses, or the like, and a processor chip 97 can be provided therein (FIG. 26C). The bearer bonds refer to stamps, rice coupons, various merchandise coupons, or the like. The packing containers refer to wrapping paper for lunch boxes, plastic bottles, or the like, and a processor chip 93 can be provided therein (FIG. 26D). The documents refer to books or the like, and a processor chip 94 can be provided therein (FIG. 26E). The recording media refer to DVD software, a video tape, or the like, and a processor chip 95 can be provided therein (FIG. 26F). The vehicles refer to wheeled vehicles such as bicycles, ships, or the like, and a processor chip 96 can be provided therein (FIG. 26G). The foods refer to food articles, drinks, or the like. The garments refer to clothes, footwear, or the like. The health articles refer to medical appliances, health appliances, and the like. The commodities refer to furniture, lighting equipment, or the like. The medicines refer to medical products, pesticides, or the like. The electronic devices refer to a liquid crystal display device, an EL display device, a television device (TV sets or a flat-screen TV sets), a cellular phone, or the like.

Forgery can be prevented by providing a processor chip to each of the paper money, coins, securities, certificates, bearer bonds, and the like. The efficiency of an inspection system or a system used in a rental shop can be promoted by providing a processor chip to each of the packing containers, documents, recording media, personal belongings, foods, commodities, electronic devices, and the like. By providing a processor chip to each of the vehicles, health articles, medicines, and the like, counterfeits or theft can be prevented; further, medicines can be prevented from being taken mistakenly. The processor chip is provided to the foregoing articles by attaching to their surfaces or embedding thereinto. For example, in the case of a book, the processor chip may be embedded in a piece of paper; or in the case of a package made from an organic resin, the processor chip may be embedded in the organic resin.

The system can have high functionality by applying the processor chip formed in accordance with the present invention to management system or a distribution system of articles. For example, information that is recorded in a processor chip provided in a tag is read by a reader/writer provided on the side of a conveyor belt, then information about a distribution process or a delivery destination is read out, and inspection of merchandise or distribution of goods can be easily carried out.

Figure 27:
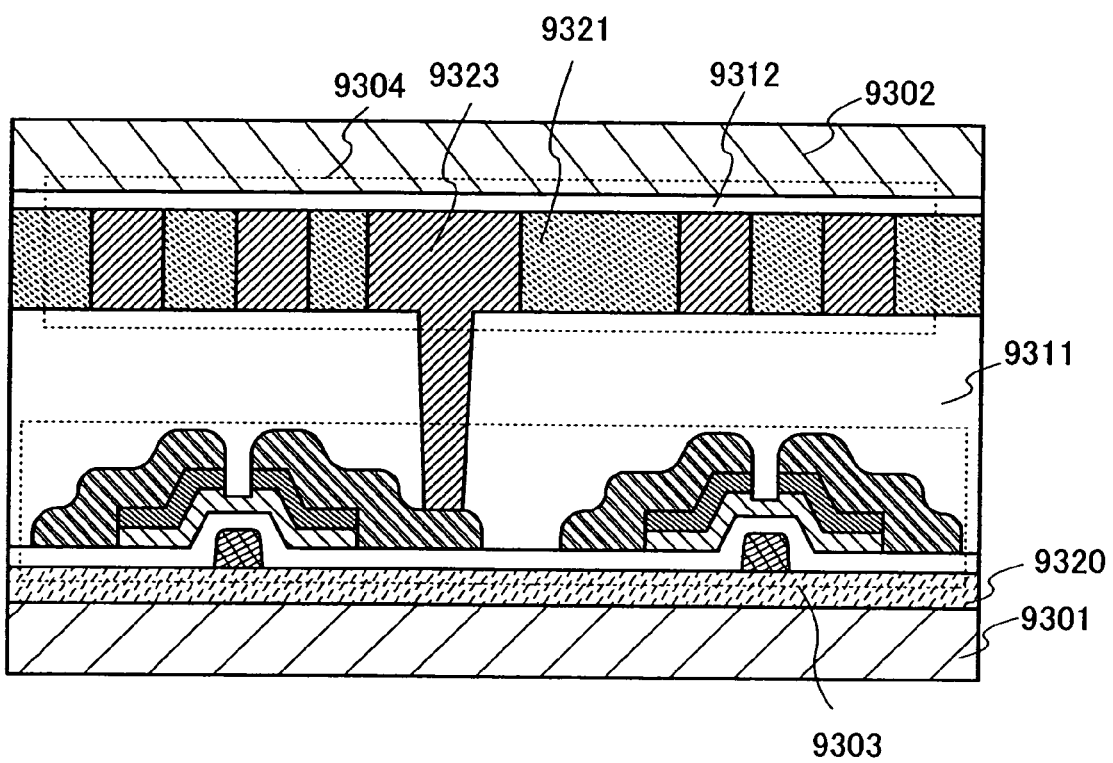
FIG. 27 shows a semiconductor device using the present invention.
Figure 28A:
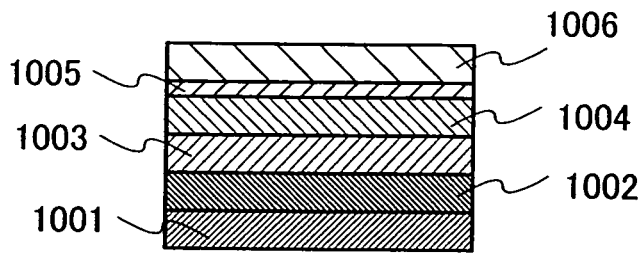
FIGS. 28A to 28E show a conventional example.
Figure 28B:
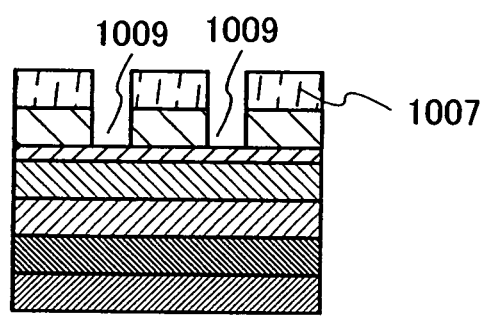
Figure 28C:
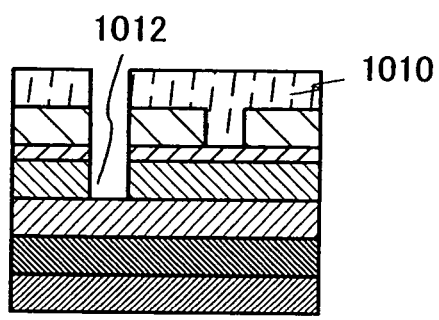
Figure 28D:
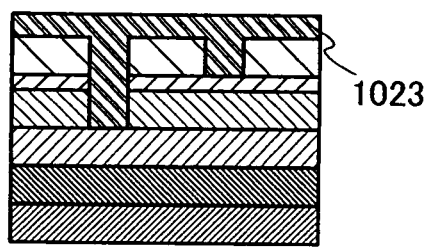
Figure 28E:
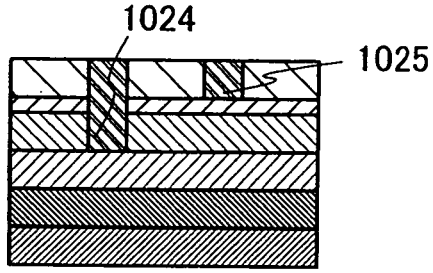

FIG. 27 shows a structure of a processor chip capable of being formed in accordance with the present invention. The processor chip is formed of a thin film integrated circuit 9303 and an antenna 9304 connected to the thin film integrated circuit 9303. The thin film integrated circuit 9303 and the antenna 9304 are interposed between cover materials 9301 and 9302. The thin film integrated circuit 9303 may be attached to the cover material 9301 using an adhesive. In FIG. 27, one side of the thin film integrated circuit 9303 is attached to the cover material 9301 with an adhesive 9320 interposed therebetween.

The thin film integrated circuit 9303 is formed in the same manner as the TFT described in any one of the above Embodiment Modes, then, it is peeled in a known peeling step, and is provided on a cover material. In the present embodiment mode, a wiring layer forming the antenna 9304 is formed so that it is embedded in insulating layers 9311 and 9321. An opening portion is formed in the insulating layers 9311 and 9321, and a mask layer, wettability of whose surface is controlled, is formed over the insulating layer 9321. By a plasma treatment in a gas atmosphere containing fluorine, the mask layer is processed to have low wettability with respect to a composition containing a conductive material which forms a wiring layer 9323. The liquid composition containing a conductive material does not attach to a surface of the mask layer having low wettability with respect to the composition. Even when it attaches, it is not stable, and an opening portion having relatively high wettability is filled with the composition containing a conductive material. Thus, since the opening portion is filled with the composition containing a conductive material, a wiring layer can be formed with good stability and controllability and material loss can be prevented. In addition, since an insulating layer having pores is used for the insulating layers 9311 and 9321, the wiring layer 9323 is formed so that the pore is filled with a portion of the wiring layer 9323. Therefore, the wiring layer 9323 is formed to have good adhesiveness to the insulating layers 9311 and 9321 and an electrode layer which is included in the thin film integrated circuit 9303. The semiconductor element used in the thin film integrated circuit 9303 is not limited to the foregoing semiconductor element. For example, a memory element, a diode, a photoelectric conversion element, a resistor element, a coil, a capacitor element, an inductors or the like can be used as well as a TFT.

As shown in FIG. 27, the insulating layer 9311 is formed over a TFT of the thin film integrated circuit 9303, and the antenna 9304 connecting to the TFT is formed with the insulating layer 9311 interposed therebetween. Further, a barrier film 9312 made of a silicon nitride film or the like is formed over the insulating layer 9311 and the antenna 9304.

The antenna 9304 is formed by discharging a droplet including a conductor of gold, silver, copper, or the like by a droplet discharge method, drying, and baking. By forming the antenna by a droplet discharge method, the number of steps can be reduced and cost can also be reduced due to the decrease in the steps.

For the cover materials 9301 and 9302, it is preferable to use a sealing film (made of polypropylene, polyester, vinyl, polyvinyl fluoride, vinyl chloride, or the like), paper made of a fibrous material, a laminated film of a base material film (polyester, polyamide, an inorganic vapor deposition film, a variety of paper, or the like) and an adhesive synthetic resin film (an acrylic-based synthetic resin, an epoxy-based synthetic resin, or the like), or the like. The sealing film is the one on which a sealing treatment is performed with an object by thermocompression bonding. In the case of performing a sealing treatment, an adhesion layer provided on a top surface of the sealing film or a layer provided in an outmost layer (not the adhesion layer) is melted by a heat treatment and attached to the object by applying pressure.

By using a pollution-free material which can be incinerated such as paper, a fiber, carbon graphite, or the like for the cover material, the used processor chip can be burned out or cut out. The processor chip using the foregoing material is pollution-free since it does not generate a poisonous gas when the processor chip is burned.

In FIG. 27, the processor chip is provided over the cover material 9301 with the adhesive 9320; however, the processor chip may be attached to an article instead of to the cover material 9301.

What is claimed is:

1. A method of manufacturing a semiconductor device, comprising:
   forming a conductive layer over a substrate;
   forming a first insulating layer over the conductive layer;
   forming a second insulating layer over the first insulating layer;
   forming a first mask layer having a first opening portion over the second insulating layer;
   forming a second opening portion reaching the conductive layer in the first insulating layer and the second insulating layer by etching the first insulating layer and the second insulating layer by use of the first mask layer;
   removing the first mask layer;
   forming a second mask layer over the second insulating layer after removing the first mask layer, the second mask layer having a third opening portion having a larger area than the second opening portion and having a surface with lower wettability than the second insulating layer with respect to a liquid composition containing a conductive material;
   forming a fourth opening portion in the second insulating layer, the fourth opening portion having a larger area than the second opening portion and overlapping with the second opening portion by etching the second insulating layer by use of the second mask layer;

discharging the liquid composition containing the conductive material in the second and fourth opening portions by use of the second mask layer; and removing the second mask layer after discharging the liquid composition containing the conductive material in the second and fourth opening portions.

2. A method of manufacturing a semiconductor device according to claim 1, wherein the second mask layer comprises a substance containing a fluorocarbon group.

3. A method of manufacturing a semiconductor device according to claim 1, further comprising forming a wiring layer by drying the liquid composition containing the conductive material.

4. A method of manufacturing a semiconductor device according to claim 3,
wherein the drying the liquid composition is heat treatments, which is performed at a temperature 100° C. to 800° C.

5. A method of manufacturing a semiconductor device according to claim 1, wherein wettability of the surface of the second mask layer with respect to the liquid composition containing a conductive material is lowered by performing a plasma treatment on the surface of the second mask layer.

6. A method of manufacturing a semiconductor device according to claim 5, wherein the plasma treatment is performed in a gas atmosphere including fluorine.

7. A method of manufacturing a semiconductor device, comprising:
forming a conductive layer over a substrate;
forming a first insulating layer over the conductive layer;
forming a second insulating layer having a pore over the first insulating layer;
forming a first mask layer having a first opening portion over the second insulating layer;
forming a second opening portion reaching the conductive layer in the first insulating layer and the second insulating layer by etching the first insulating layer and the second insulating layer by use of the first mask layer;
removing the first mask layer;
forming a second mask layer over the second insulating layer after removing the first mask layer, the second mask layer having a third opening portion having a larger area than the second opening portion and having a surface with lower wettability than the second insulating layer with respect to a liquid composition containing a conductive material;
forming a fourth opening portion in the second insulating layer, the fourth opening portion having a larger area than the second opening portion and overlapping with the second opening portion by etching the second insulating layer by use of the second mask layer;
discharging the liquid composition containing the conductive material in the second and fourth opening portions and the pore in the second insulating layer by use of the second mask layer; and
removing the second mask layer after discharging the liquid composition containing the conductive material in the second and fourth opening portions and the pore in the second insulating layer.

8. A method of manufacturing a semiconductor device according to claim 7, wherein the second mask layer comprises a substance containing a fluorocarbon group.

9. A method of manufacturing a semiconductor device according to claim 7, further comprising forming a wiring layer by drying the liquid composition containing the conductive material.

10. A method of manufacturing a semiconductor device according to claim 9,
wherein the drying the liquid composition is heat treatments, which is performed at a temperature 100° C. to 800° C.

11. A method of manufacturing a semiconductor device according to claim 7, wherein wettability of the surface of the second mask layer with respect to the liquid composition containing a conductive material is lowered by performing a plasma treatment on the surface of the second mask layer.

12. A method of manufacturing a semiconductor device according to claim 11, wherein the plasma treatment is performed in a gas atmosphere including fluorine.

13. A method of manufacturing a semiconductor device, comprising:
forming a conductive layer over a substrate;
forming a first insulating layer over the first conductive layer;
forming a second insulating layer over the first insulating layer;
forming a third insulating layer over the second insulating layer;
forming a first mask layer having a first opening portion over the third insulating layer;
forming a second opening portion reaching the conductive layer in the first, second and third insulating layers by etching the first, second, and third insulating layers by use of the first mask layer;
forming a second mask layer over the third insulating layer after removing the first mask layer, the second mask layer having a third opening portion having a larger area than the second opening portion and having a surface with lower wettability than the third insulating layer with respect to a liquid composition containing a conductive material;
forming a fourth opening portion in the third insulating layer, the fourth opening portion having a larger area than the second opening portion and overlapping with the second opening portion by etching the third insulating layer to expose a part of an upper surface of the second insulating layer by use of the second mask layer;
discharging the liquid composition containing the conductive material in the second and fourth opening portions by use of the second mask layer; and
removing the second mask layer after discharging the liquid composition containing the conductive material in the second and fourth opening portions.

14. A method of manufacturing a semiconductor device according to claim 13, wherein the second mask layer comprises a substance containing a fluorocarbon group.

15. A method of manufacturing a semiconductor device according to claim 13, further comprising forming a wiring layer by drying the liquid composition containing the conductive material.

16. A method of manufacturing a semiconductor device according to claim 15,
wherein the drying the liquid composition is heat treatments, which is performed at a temperature 100° C. to 800° C.

17. A method of manufacturing a semiconductor device according to claim 13, wherein wettability of the surface of the second mask layer with respect to the liquid composition containing a conductive material is lowered by performing a plasma treatment on the surface of the second mask layer.

18. A method of manufacturing a semiconductor device according to claim 17, wherein the plasma treatment is performed in a gas atmosphere including fluorine.

19. A method of manufacturing a semiconductor device, comprising:
- forming a conductive layer over a substrate;
- forming a first insulating layer over the conductive layer;
- forming a second insulating layer over the first insulating layer;
- forming a third insulating layer having a pore over the second insulating layer;
- forming a first mask layer having a first opening portion over the third insulating layer;
- forming a second opening portion reaching the conductive layer in the first, second and third insulating layers by etching the first, second, and third insulating layers by use of the first mask layer;
- forming a second mask layer over the third insulating layer after removing the first mask layer, the second mask layer having a third opening portion having a larger area than the second opening portion and having a surface with lower wettability than the third insulating layer with respect to a liquid composition containing a conductive material;
- forming a fourth opening portion in the third insulating layer, the fourth opening portion having a larger area than the second opening portion and overlapping with the second opening portion by etching the third insulating layer to expose a part of an upper surface of the second insulating layer by use of the second mask layer;
- discharging the liquid composition containing the conductive material in the second and fourth opening portions and the pore in the third insulating layer by use of the second mask layer; and
- removing the second mask layer after discharging the liquid composition containing the conductive material in the second and fourth opening portions and the pore in the third insulating layer.

20. A method of manufacturing a semiconductor device according to claim 19, wherein the second mask layer comprises a substance containing a fluorocarbon group.

21. A method of manufacturing a semiconductor device according to claim 19, further comprising forming a wiring layer by drying the liquid composition containing the conductive material.

22. A method of manufacturing a semiconductor device according to claim 21,
wherein the drying the liquid composition is heat treatments, which is performed at a temperature 100° C. to 800° C.

23. A method of manufacturing a semiconductor device according to claim 19, wherein wettability of the surface of the second mask layer with respect to the liquid composition containing a conductive material is lowered by performing a plasma treatment on the surface of the second mask layer.

24. A method of manufacturing a semiconductor device according to claim 23, wherein the plasma treatment is performed in a gas atmosphere including fluorine.

25. A method for manufacturing a semiconductor device comprising:
- forming a conductive layer over a substrate;
- forming an insulating layer over the conductive layer;
- forming a mask layer having a first opening portion and a surface with lower wettability than the insulating layer with respect to a liquid composition containing a conductive material;
- forming a second opening portion reaching the conductive layer in the insulating layer by use of the mask layer;
- discharging the liquid composition containing the conductive material in the second opening portion by use of the mask layer; and
- removing the mask layer after discharging the liquid composition containing the conductive material in the second opening portion.

26. A method of manufacturing a semiconductor device according to claim 25, wherein the mask layer comprises a substance containing a fluorocarbon group.

27. A method of manufacturing a semiconductor device according to claim 25, further comprising forming a wiring layer by drying the liquid composition containing the conductive material.

28. A method of manufacturing a semiconductor device according to claim 27,
wherein the drying the liquid composition is heat treatments, which is performed at a temperature 100° C. to 800° C.

29. A method of manufacturing a semiconductor device according to claim 25, wherein wettability of the surface of the mask layer with respect to the liquid composition containing a conductive material is lowered by performing a plasma treatment on the surface of the mask layer.

30. A method of manufacturing a semiconductor device according to claim 29, wherein the plasma treatment is performed in a gas atmosphere including fluorine.

31. A method of manufacturing a semiconductor device, comprising:
- forming a conductive layer over a substrate;
- forming a first insulating layer over the conductive layer;
- forming a second insulating layer over the first insulating layer;
- forming a first mask layer having a first opening portion over the second insulating layer;
- forming a second opening portion reaching the conductive layer in the first insulating layer and the second insulating layer by etching the first insulating layer and the second insulating layer by use of the first mask layer;
- removing the first mask layer;
- forming a second mask layer over the second insulating layer after removing the first mask layer, the second mask layer having a third opening portion having a larger area than the second opening portion and having a surface with lower wettability than the second insulating layer with respect to a liquid composition containing a conductive material;
- forming a fourth opening portion in the second insulating layer, the fourth opening portion having a larger area than the second opening portion and overlapping with the second opening portion by etching the second insulating layer by use of the second mask layer; and
- discharging the liquid composition containing the conductive material in the second and fourth opening portions by use of the second mask layer,
wherein the second mask layer comprises a substance containing a fluorocarbon group.

32. A method of manufacturing a semiconductor device according to claim 31, further comprising forming a wiring layer by drying the liquid composition containing the conductive material.

33. A method of manufacturing a semiconductor device according to claim 32,
wherein the drying the liquid composition is heat treatments, which is performed at a temperature 100° C. to 800° C.

34. A method of manufacturing a semiconductor device, comprising:

forming a conductive layer over a substrate;

forming a first insulating layer over the first conductive layer;

forming a second insulating layer over the first insulating layer;

forming a third insulating layer over the second insulating layer;

forming a first mask layer having a first opening portion over the third insulating layer;

forming a second opening portion reaching the conductive layer in the first, second and third insulating layers by etching the first, second, and third insulating layers by use of the first mask layer;

forming a second mask layer over the third insulating layer after removing the first mask layer, the second mask layer having a third opening portion having a larger area than the second opening portion and having a surface with lower wettability than the third insulating layer with respect to a liquid composition containing a conductive material;

forming a fourth opening portion in the third insulating layer, the fourth opening portion having a larger area than the second opening portion and overlapping with the second opening portion by etching the third insulating layer to expose a part of an upper surface of the second insulating layer by use of the second mask layer; and discharging the liquid composition containing the conductive material in the second and fourth opening portions by use of the second mask layer, wherein the second mask layer comprises a substance containing a fluorocarbon group.

35. A method of manufacturing a semiconductor device according to claim 34, further comprising forming a wiring layer by drying the liquid composition containing the conductive material.

36. A method of manufacturing a semiconductor device according to claim 35,
wherein the drying the liquid composition is heat treatments, which is performed at a temperature 100° C. to 800° C.

37. A method for manufacturing a semiconductor device comprising:
forming a conductive layer over a substrate;
forming an insulating layer over the conductive layer;
forming a mask layer having a first opening portion and a surface with lower wettability than the insulating layer with respect to a liquid composition containing a conductive material;
forming a second opening portion reaching the conductive layer in the insulating layer by use of the mask layer; and
discharging the liquid composition containing the conductive material in the second opening portion by use of the mask layer,
wherein the mask layer comprises a substance containing a fluorocarbon group.

38. A method of manufacturing a semiconductor device according to claim 37, further comprising forming a wiring layer by drying the liquid composition containing the conductive material.

39. A method of manufacturing a semiconductor device according to claim 38,
wherein the drying the liquid composition is heat treatments, which is performed at a temperature 100° C. to 800° C.

* * * * *